US008283967B2

(12) United States Patent
Chaji et al.

(10) Patent No.: US 8,283,967 B2
(45) Date of Patent: Oct. 9, 2012

(54) STABLE CURRENT SOURCE FOR SYSTEM INTEGRATION TO DISPLAY SUBSTRATE

(75) Inventors: Gholamreza Chaji, Waterloo (CA); Jackson Chi Sun Lai, Kitchener (CA)

(73) Assignee: Ignis Innovation Inc., Waterloo, Ontario (CA)

( * ) Notice: Subject to any disclaimer, the term of this patent is extended or adjusted under 35 U.S.C. 154(b) by 102 days.

(21) Appl. No.: 12/944,488

(22) Filed: Nov. 11, 2010

(65) Prior Publication Data

US 2011/0109350 A1 May 12, 2011

(30) Foreign Application Priority Data

Nov. 12, 2009 (CA) ..................................... 2684818
Dec. 7, 2009 (CA) ..................................... 2687477
Feb. 17, 2010 (CA) ..................................... 2694086

(51) Int. Cl.
*H03K 17/16* (2006.01)
(52) U.S. Cl. ....................................... 327/390; 327/543
(58) Field of Classification Search .................. 327/390, 327/530, 534, 535, 536, 537, 538, 543
See application file for complete search history.

(56) References Cited

U.S. PATENT DOCUMENTS 7,466,166 B2 * 12/2008 Date et al. ..................... 327/108
7,495,501 B2 * 2/2009 Iwabuchi et al. ............. 327/536
7,612,745 B2 11/2009 Yumoto et al.
8,159,007 B2 * 4/2012 Barna et al. ................... 257/268

FOREIGN PATENT DOCUMENTS

WO 2009/127065 A1 10/2009

OTHER PUBLICATIONS

Written Opinion corresponding to International Patent Application No. PCT/IB2010/002898, Canadian Intellectual Property Office, dated Mar. 30, 2011, 8 pages.
International Search Report corresponding to International Patent Application No. PCT/IB2010/002898, Canadian Intellectual Property Office, dated Jul. 28, 2009, 5 pages.

(Continued)

*Primary Examiner* — Jeffrey Zweizig
(74) *Attorney, Agent, or Firm* — Nixon Peabody LLP

(57) ABSTRACT

A technique to implement a stable and high impedance current sink or source onto a display substrate using a single device. The high output current source or sink circuit includes an input that receives a fixed reference current and provides the reference current to a node in the current source or sink circuit during a calibration operation of the current source or sink circuit. The circuit further includes a first transistor and a second transistor series-connected to the node such that the reference current adjusts the voltage at the node to allow the reference current to pass through the series-connected transistors during the calibration operation. The circuit includes one or more storage devices connected to the node, and an output transistor connected to the node to source or sink an output current from current stored in the one or more storage devices to a drive an active matrix display with a bias current corresponding to the output current.

20 Claims, 22 Drawing Sheets

OTHER PUBLICATIONS

Ono et al., "Shared Pixel Compensation Circuit for AM-OLED Displays", Proceedings of the 9th Asian Symposium on Information Display (ASID), pp. 462-465, New Delhi, Dated Oct. 8-12, 2006; 4 pages.
Ahnood et al.: "Effect of threshold voltage instability on field effect mobility in thin film transistors deduced from constant current measurements"; dated Aug. 2009.
Alexander et al.: "Pixel circuits and drive schemes for glass and elastic AMOLED displays"; dated Jul. 2005 (9 pages).
Alexander et al.: "Unique Electrical Measurement Technology for Compensation, Inspection, and Process Diagnostics of AMOLED HDTV"; dated May 2010 (4 pages).
Arokia Nathan et al., "Amorphous Silicon Thin Film Transistor Circuit Integration for Organic LED Displays on Glass and Plastic", IEEE Journal of Solid-State Circuits, vol. 39, No. 9, Sep. 2004, pp. 1477-1486.
Ashtiani et al.: "AMOLED Pixel Circuit With Electronic Compensation of Luminance Degradation"; dated Mar. 2007 (4 pages).
Chaji et al.: "A Current-Mode Comparator for Digital Calibration of Amorphous Silicon AMOLED Displays"; dated Jul. 2008 (5 pages).
Chaji et al.: "A fast settling current driver based on the CCII for AMOLED displays"; dated Dec. 2009 (6 pages).
Chaji et al.: "A Low-Cost Stable Amorphous Silicon AMOLED Display with Full V~T- and V~O~L~E~D Shift Compensation"; dated May 2007 (4 pages).
Chaji et al.: "A low-power driving scheme for a-Si:H active-matrix organic light-emitting diode displays"; dated Jun. 2005 (4 pages).
Chaji et al.: "A low-power high-performance digital circuit for deep submicron technologies"; dated Jun. 2005 (4 pages).
Chaji et al.: "A novel a-Si:H AMOLED pixel circuit based on short-term stress stability of a-Si:H TFTs"; dated Oct. 2005 (3 pages).
Chaji et al.: "A Novel Driving Scheme and Pixel Circuit for AMOLED Displays"; dated Jun. 2006 (4 pages).
Chaji et al.: "A novel driving scheme for high-resolution large-area a-Si:H AMOLED displays"; dated Aug. 2005 (4 pages).
Chaji et al.: "A Stable Voltage-Programmed Pixel Circuit for a-Si:H AMOLED Displays"; dated Dec. 2006 (12 pages).
Chaji et al.: "A Sub-μ A fast-settling current-programmed pixel circuit for AMOLED displays"; dated Sep. 2007.
Chaji et al.: "An Enhanced and Simplified Optical Feedback Pixel Circuit for AMOLED Displays"; dated Oct. 2006.
Chaji et al.: "Compensation technique for DC and transient instability of thin film transistor circuits for large-area devices"; dated Aug. 2008.
Chaji et al.: "Driving scheme for stable operation of 2-TFT a-Si AMOLED pixel"; dated Apr. 2005 (2 pages).
Chaji et al.: "Dynamic-effect compensating technique for stable a-Si:H AMOLED displays"; dated Aug. 2005 (4 pages).
Chaji et al.: "Electrical Compensation of OLED Luminance Degradation"; dated Dec. 2007 (3 pages).
Chaji et al.: "eUTDSP: a design study of a new VLIW-based DSP architecture"; dated May 2003 (4 pages).
Chaji et al.: "Fast and Offset-Leakage Insensitive Current-Mode Line Driver for Active Matrix Displays and Sensors"; dated Feb. 2009 (8 pages).
Chaji et al.: "High Speed Low Power Adder Design With a New Logic Style: Pseudo Dynamic Logic (SDL)"; dated Oct. 2001 (4 pages).
Chaji et al.: "High-precision, fast current source for large-area current-programmed a-Si flat panels"; dated Sep. 2006 (4 pages).
Chaji et al.: "Low-Cost AMOLED Television with IGNIS Compensating Technology"; dated May 2008 (4 pages).
Chaji et al.: "Low-Cost Stable a-Si:H AMOLED Display for Portable Applications"; dated Jun. 2006 (4 pages).
Chaji et al.: "Low-Power Low-Cost Voltage-Programmed a-Si:H AMOLED Display"; dated Jun. 2008 (5 pages).
Chaji et al.: "Merged phototransistor pixel with enhanced near infrared response and flicker noise reduction for biomolecular imaging"; dated Nov. 2008 (3 pages).
Chaji et al.: "Parallel Addressing Scheme for Voltage-Programmed Active-Matrix OLED Displays"; dated May 2007 (6 pages).
Chaji et al.: "Pseudo dynamic logic (SDL): a high-speed and low-power dynamic logic family"; dated 2002 (4 pages).
Chaji et al.: "Stable a-Si:H circuits based on short-term stress stability of amorphous silicon thin film transistors"; dated May 2006 (4 pages).
Chaji et al.: "Stable Pixel Circuit for Small-Area High-Resolution a-Si:H AMOLED Displays"; dated Oct. 2008 (6 pages).
Chaji et al.: "Stable RGBW AMOLED display with OLED degradation compensation using electrical feedback"; dated Feb. 2010 (2 pages).
Chaji et al.: "Thin-Film Transistor Integration for Biomedical Imaging and AMOLED Displays"; dated 2008 (177 pages).
Jafarabadiashtiani et al.: "A New Driving Method for a-Si AMOLED Displays Based on Voltage Feedback"; dated 2005 (4 pages).
Joon-Chul Goh et al., "A New a-Si:H Thin-Film Transistor Pixel Circuit for Active-Matrix Organic Light-Emitting Diodes", IEEE Electron Device Letters, vol. 24, No. 9, Sep. 2003, pp. 583-585.
Lee et al.: "Ambipolar Thin-Film Transistors Fabricated by PECVD Nanocrystalline Silicon"; dated 2006 (6 pages).
Ma E Y et al.: "Organic light emitting diode/thin film transistor integration for foldable Displays" dated Sep. 15, 1997(4 pages).
Matsueda y et al.: "35.1: 2.5-in. AMOLED with Integrated 6-bit Gamma Compensated Digital Data Driver"; dated May 2004.
Nathan A. et al., "Thin Film imaging technology on glass and plastic" ICM 2000, proceedings of the 12 international conference on microelectronics, dated Oct. 31, 2001 (4 pages).
Nathan et al.: "Backplane Requirements for Active Matrix Organic Light Emitting Diode Displays"; dated 2006 (16 pages).
Nathan et al.: "Call for papers second international workshop on compact thin-film transistor (TFT) modeling for circuit simulation"; dated Sep. 2009 (1 page).
Nathan et al.: "Driving schemes for a-Si and LTPS AMOLED displays"; dated Dec. 2005 (11 pages).
Nathan et al.: "Invited Paper: a -Si for AMOLED—Meeting the Performance and Cost Demands of Display Applications (Cell Phone to HDTV)"; dated 2006 (4 pages).
Philipp: "Charge transfer sensing" Sensor Review, vol. 19, No. 2, Dec. 31, 1999, 10 pages.
Rafati et al.: "Comparison of a 17 b multiplier in Dual-rail domino and in Dual-rail D L (D L) logic styles"; dated 2002 (4 pages).
Safavaian et al.: "Three-TFT image sensor for real-time digital X-ray imaging"; dated Feb. 2, 2006 (2 pages).
Safavian et al.: "3-TFT active pixel sensor with correlated double sampling readout circuit for real-time medical x-ray imaging"; dated Jun. 2006 (4 pages).
Safavian et al.: "A novel current scaling active pixel sensor with correlated double sampling readout circuit for real time medical x-ray imaging"; dated May 2007 (7 pages).
Safavian et al.: "A novel hybrid active-passive pixel with correlated double sampling CMOS readout circuit for medical x-ray imaging"; dated May 2008 (4 pages).
Safavian et al.: "Self-compensated a-Si:H detector with current-mode readout circuit for digital X-ray fluoroscopy"; dated Aug. 2005 (4 pages).
Safavian et al.: "TFT active image sensor with current-mode readout circuit for digital x-ray fluoroscopy [5969D-82]"; dated Sep. 2005 (9 pages).
Stewart M. et al., "polysilicon TFT technology for active matrix oled displays" IEEE transactions on electron devices, vol. 48, No. 5, dated May 2001 (7 pages).
Vygranenko et al.: "Stability of indium-oxide thin-film transistors by reactive ion beam assisted deposition"; dated 2009.
Wang et al.: "Indium oxides by reactive ion beam assisted evaporation: From material study to device application"; dated Mar. 2009 (6 pages).
Yi He et al., "Current-Source a-Si:H Thin Film Transistor Circuit for Active-Matrix Organic Light-Emitting Displays", IEEE Electron Device Letters, vol. 21, No. 12, Dec. 2000, pp. 590-592.

* cited by examiner

STABLE CURRENT SOURCE FOR SYSTEM INTEGRATION TO DISPLAY SUBSTRATE

CROSS-REFERENCE TO RELATED APPLICATIONS

This application claims the benefit of Canadian Patent Application Serial No. 2,684,818, filed Nov. 12, 2009, entitled "Sharing Switch TFTS in Pixel Circuits," Canadian Patent Application Serial No. 2,687,477, filed Dec. 7, 2009, entitled "Stable Current Source for System Integration to Display Substrate," and Canadian Patent Application Serial No. 2,694,086, filed Feb. 17, 2010, entitled "Stable Fast Programming Scheme for Displays," each of which is incorporated by reference in its entirety.

COPYRIGHT

A portion of the disclosure of this patent document contains material which is subject to copyright protection. The copyright owner has no objection to the facsimile reproduction by anyone of the patent disclosure, as it appears in the Patent and Trademark Office patent files or records, but otherwise reserves all copyright rights whatsoever.

FIELD OF THE PRESENT DISCLOSURE

The present disclosure generally relates to circuits and methods of driving, calibrating, or programming a display, particularly light emitting displays.

BACKGROUND

The disclosed technique improves display resolution by reducing the number of transistors in each pixel. The switch transistor is shared between several pixel circuits in several adjacent sub-pixels. A need exists for an improved display resolution and manufacturing yield while at the same time enabling normal sequential scan programming of the display.

Most backplane technologies offer only one type of thin-film transistor (TFT), either p-type or n-type. Thus, the device-type limitation needs to be overcome to enable integration of more useful circuitry onto the display substrate, which can result in better performance and lower cost. The main circuit blocks for driving amorphous organic light-emitting device (AMOLED) circuits include current sources (or sinks) and voltage-to-current converters.

For example, p-type devices have been used in conventional current mirror and current sources because the source terminal of at least one TFT is fixed (e.g., connected to VDD). The current output passes through the drain of the TFT, and so any change in the output line will affect the drain voltage only. As a result, the output current will remain constant despite a change in the line voltage, which undesirably leads to high output resistance current sources. On the other hand, if a p-type TFT is used for a current sink, the source of the TFT will be connected to the output line. Thus, any change in the output voltage due to a variation in the output load will affect the gate-source voltage directly. Consequently, the output current will not be constant for different loads. To overcome this problem, a circuit design technique is needed to control the effect of source voltage variability on the output current.

A need also exists for improving the spatial and/or temporal uniformity of a display, such as an OLED display.

BRIEF SUMMARY

EMBODIMENT 1A. A circuit for a display panel having an active area having a plurality of light emitting devices arranged on a substrate, and a peripheral area of the display panel separate from the active area, the circuit comprising: a shared switch transistor connected between a voltage data line and a shared line that is connected to a reference voltage through a reference voltage transistor; a first pixel including a first light emitting device configured to be current driven by a first drive circuit connected to the shared line through a first storage device; a second pixel including a second light emitting device configured to be current driven by a second drive circuit connected to the shared line through a second storage device; and a reference current line configured to apply a bias current to the first and second drive circuits.

EMBODIMENT 2A. The circuit of EMBODIMENT 1A, a display driver circuit in the peripheral area and coupled to the first and second drive circuits via respective first and second select lines, to the switch transistor, to the reference voltage transistor, to the voltage data line, and to the reference current line, the display driver circuit being configured to switch the reference voltage transistor from a first state to a second state via a reference voltage control line such that the reference voltage transistor is disconnected from the reference voltage and to switch the shared switch transistor from the second state to the first state via a group select line during a programming cycle of a frame to allow voltage programming of the first pixel and the second pixel, and wherein the bias current is applied during the programming cycle.

EMBODIMENT 3A. The circuit of EMBODIMENT 2A, wherein the display driver circuit is further configured to toggle the first select line during the programming cycle to program the first pixel with a first programming voltage specified by the voltage data line and stored in the first storage capacitor during the programming cycle and to toggle the second select line during the programming cycle to program the second pixel with a second programming voltage specified by the voltage data line and stored in the second storage capacitor during the programming cycle.

EMBODIMENT 4A. The circuit of EMBODIMENT 3A. wherein the display driver circuit is further configured to, following the programming cycle, switch the reference voltage transistor from the second state to the first state via a reference voltage control line and to switch the shared switch transistor via a group select line from the first state to the second state, the display driver circuit including a supply voltage control circuit configured to adjust the supply voltage to turn on the first and second light emitting devices during a driving cycle of the frame that follows the programming cycle, thereby causing the first and second light emitting devices to emit light at a luminance based on the first and second programming voltages, respectively.

EMBODIMENT 5A. The circuit of EMBODIMENT 2A, wherein the display driver circuit is further coupled to a supply voltage to the first pixel and the second pixel, the display driver circuit being configured to adjust the supply voltage to ensure that the first light emitting device and the second light emitting device remain in a non-emitting state during the programming cycle.

EMBODIMENT 6A. The circuit of EMBODIMENT 1A, wherein the display driver circuit includes a gate driver coupled to the first and second drive circuits via respective first and second select lines in a peripheral area of the display panel.

EMBODIMENT 7A. The circuit of EMBODIMENT 1A, wherein the first drive circuit includes a first drive transistor connected to a supply voltage and to the first light emitting device, a gate of the first drive transistor being connected to the first storage device, and a pair of switch transistors each coupled to the first select line for transferring the bias current from the reference current line to the first storage device during a programming cycle, wherein the first storage device is a capacitor.

EMBODIMENT 8A. The circuit of EMBODIMENT 7A. wherein one of the pair of switch transistors is connected between the reference current line and the first light emitting device and the other of the pair of switch transistors is connected between the first light emitting device and the first storage capacitor.

EMBODIMENT 9A. The circuit of EMBODIMENT 8A, wherein the pair of switch transistors and the drive transistor are p-type MOS transistors.

EMBODIMENT 10A. The circuit of EMBODIMENT 7A. wherein the second drive circuit includes a second drive transistor connected to the supply voltage and to the second light emitting device, a gate of the second drive transistor being connected to the second storage device, and a pair of switch transistors each coupled to the second select line for transferring the bias current from the reference current line to the second storage device during a programming cycle, wherein the second storage device is a capacitor.

EMBODIMENT 11A. The circuit of EMBODIMENT 10A, wherein one of the pair of switch transistors is connected between the reference current line and the second light emitting device and the other of the pair of switch transistors is connected between the second light emitting device and the second storage device.

EMBODIMENT 12A. The circuit of EMBODIMENT 11A, wherein the pair of switch transistors and the drive transistor are p-type MOS transistors.

EMBODIMENT 13A. The circuit of EMBODIMENT 12A, wherein a source of the first drive transistor is connected to the supply voltage, a drain of the first drive transistor is connected to the first light emitting device, a source of one of the pair of switch transistors is connected to a drain of the other of the pair of switch transistors, a drain of the one of the pair of switch transistors is connected to the reference current line, a source of the other of the pair of switch transistors is connected to the first storage capacitor, a drain of the shared transistor is connected to the first storage capacitor and to the second capacitor, a source of the shared switch transistor is connected to the voltage data line, a source of the reference voltage transistor is connected to the reference voltage, and the first light emitting device is connected between a drain of the gating transistor and a ground potential.

EMBODIMENT 14A. The circuit of EMBODIMENT 1A, wherein the peripheral area and the pixel area are on the same substrate.

EMBODIMENT 15A. The circuit of EMBODIMENT 1A, wherein the first drive circuit includes a first drive transistor connected to a supply voltage and a gating transistor connected to the first light emitting device, a gate of the first drive transistor being connected to the first storage device, and a pair of switch transistors each coupled to the select line for transferring the bias current from the reference current line to the first storage device during a programming cycle, wherein the gating transistor is connected to a reference voltage control line that is also connected to the reference voltage transistor.

EMBODIMENT 16A. The circuit of EMBODIMENT 15A, wherein the reference voltage control line switches both the reference voltage transistor and the gating transistor between a first state to a second state simultaneously, and wherein the reference voltage control line is configured by the display driver circuit to disconnect the reference voltage transistor from the reference voltage and the first light emitting device from the first drive transistor during the programming cycle.

EMBODIMENT 17A. The circuit of EMBODIMENT 16A. wherein a source of the first drive transistor is connected to the supply voltage, a drain of the first drive transistor is connected to the first light emitting device, a source of one of the pair of switch transistors is connected to a drain of the other of the pair of switch transistors and to a source of the gating transistor, a drain of the one of the pair of switch transistors is connected to the reference current line, a source of the other of the pair of switch transistors is connected to the first storage capacitor, a drain of the shared transistor is connected to the first storage capacitor and to the second transistor, a source of the shared switch transistor is connected to the voltage data line, a source of the reference voltage transistor is connected to the reference voltage, and the first light emitting device is connected between the drain of the first drive transistor and a ground potential.

EMBODIMENT 18A. The circuit of EMBODIMENT 1A, wherein the circuit is a current-biased, voltage-programmed circuit.

EMBODIMENT 19A. A method of programming a group of pixels in an active matrix area of a light-emitting display panel, the method comprising: during a programming cycle, activating a group select line to cause a shared switch transistor to turn on; while the group select line is activated, activating a first select line for a first row of pixels in the active matrix area and providing a first programming voltage on a voltage data line to program a pixel in the first row by storing the programming voltage in a first storage device; while the group select line is activated, activating a second select line for a second row of pixels in the active matrix area and providing a second programming voltage on the voltage data line to program a pixel in the second row by storing the programming voltage in a second storage device; and while programming the first row and the second row of pixels, applying a bias current to a reference current line connected to a first pixel drive circuit in the first row and to a second pixel drive circuit in the second row.

EMBODIMENT 20A. The method of EMBODIMENT 19A, further comprising, during the programming cycle, decreasing the supply voltage to a potential sufficient to cause a first light emitting device in the pixel of the first row and a second light emitting device in the pixel of the second row to remain in a non-luminescent state during the programming cycle.

EMBODIMENT 21A. The method of EMBODIMENT 20A, further comprising, responsive to the completion of the programming cycle, deactivating the group select line to allow the first storage device to discharge through a first drive transistor of the pixel of the first row and the second storage device to discharge through a second drive transistor of the pixel of the second row.

EMBODIMENT 22A. The method of EMBODIMENT 20A, further comprising restoring the supply voltage to cause the first light emitting device and the second emitting device to emit light a luminance indicative of the first and second programming voltages, respectively.

EMBODIMENT 23A. The method of EMBODIMENT 19A, further comprising, during the programming cycle, deactivating a group emission line to turn off a reference voltage transistor connected to a reference voltage during the programming cycle.

EMBODIMENT 24A. The method of EMBODIMENT 23A, wherein the deactivating the group emission line turns off a first gating transistor in the pixel of the first row and a second gating transistor of the pixel in the second row during the programming cycle, the first gating transistor being connected to a first light emitting device in the pixel of the first row and the second gating transistor being connected to a second light emitting device in the pixel of the second row, and wherein a gate of the first gating transistor and a gate of the second gating transistor are connected to the group emission line.

EMBODIMENT 25A. The method of EMBODIMENT 24A, further comprising, responsive to the completion of the programming cycle, deactivating the group select line to allow the first storage device to discharge through a first drive transistor of the pixel of the first row and the second storage device to discharge through a second drive transistor of the pixel of the second row thereby causing the first light emitting device and the second emitting device to emit light a luminance indicative of the first and second programming voltages, respectively.

EMBODIMENT 1B. A high output impedance current source or sink circuit for a light-emitting display, the circuit comprising: an input that receives a fixed reference current and provides the reference current to a node in the current source or sink circuit during a calibration operation of the current source or sink circuit; a first transistor and a second transistor series-connected to the node such that the reference current adjusts the voltage at the node to allow the reference current to pass through the series-connected transistors during the calibration operation; one or more storage devices connected to the node; and an output transistor connected to the node to source or sink an output current from current stored in the one or more storage devices to drive an active matrix display with a bias current corresponding to the output current.

EMBODIMENT 2B. The circuit of EMBODIMENT 1B, further comprising an output control line connected to a gate of the output transistor for controlling whether the output current is available to drive the active matrix display.

EMBODIMENT 3B. The circuit of EMBODIMENT 1B, wherein the one or more storage devices includes a first storage device connected between the node and the first transistor and a second storage device connected between the node and the second transistor.

EMBODIMENT 4B. The circuit of EMBODIMENT 1B, wherein the one or more storage devices includes a first storage device connected between the node and the first transistor and a second storage device connected between the first transistor and a gate of the second transistor.

EMBODIMENT 5B. The circuit of EMBODIMENT 1B, further comprising: a first voltage switching transistor controlled by a calibration access control line and connected to the first transistor; a second voltage switching transistor controlled by the calibration access control line and connected to the second transistor; and an input transistor controlled by the calibration access control line and connected between the node and the input.

EMBODIMENT 6B. The circuit of EMBODIMENT 5B, wherein the calibration access control line is activated to initiate the calibration operation of the circuit followed by activating an access control line to initiate the programming of a column of pixels of the active matrix display using the bias current.

EMBODIMENT 7B. The circuit of EMBODIMENT 1B, wherein the one or more storage devices includes a first capacitor and a second capacitor, the circuit further comprising: an input transistor connected between the input and the node; a first voltage switching transistor connected to the first transistor, the second transistor, and the second capacitor; a second voltage switching transistor connected to the node, the first transistor, and the first transistor; and a gate control signal line connected to the gates of the input transistor, the first voltage switching transistor, and the second voltage switching transistor.

EMBODIMENT 8B. The circuit of EMBODIMENT 1B, further comprising a reference current source external to the active matrix display and supplying the reference current.

EMBODIMENT 9B. The circuit of EMBODIMENT 1B, further comprising: an input transistor connected between the input and the node; a gate control signal line connected to the gate of the input transistor; and a voltage switching transistor having a gate connected to the gate control signal line and connected to the second transistor and the one or more storage devices.

EMBODIMENT 10B. The circuit of EMBODIMENT 1B, wherein the first transistor, the second transistor, and the output transistor are p-type field effect transistors having respective gates, sources, and drains, wherein the one or more storage devices includes a first capacitor and a second capacitor, wherein the drain of the first transistor is connected to the source of the second transistor, and the gate of the first transistor is connected to the first capacitor, and wherein the drain of the output transistor is connected to the node, and the source of the output transistor sinks the output current.

EMBODIMENT 11B. The circuit of EMBODIMENT 10B, further comprising: a first voltage switching transistor having a gate connected to a calibration control line, a drain connected to a first voltage supply, and a source connected to the first capacitor; a second voltage switching transistor having a gate connected to the calibration control line, a drain connected to a second voltage supply, and a source connected to the second capacitor; and an input transistor having a gate connected to the calibration control line, a drain connected to the node, and a source connected to the input, wherein the gate of the output transistor is connected to an access control line, and the first voltage switching transistor, the second voltage switching transistor, and the input transistor being p-type field effect transistors.

EMBODIMENT 12B. The circuit of EMBODIMENT 11B, wherein the second capacitor is connected between the gate of the second transistor and the node.

EMBODIMENT 13B. The circuit of EMBODIMENT 11B, wherein the second capacitor is connected between the gate of the second transistor and the source of the second transistor.

EMBODIMENT 14B. The circuit of EMBODIMENT 1B, wherein the first transistor, the second transistor, and the output transistor are n-type field effect transistors having respective gates, sources, and drains, wherein the one or more storage devices includes a first capacitor and a second capacitor, wherein the source of the first transistor is connected to the drain of the second transistor, and the gate of the first transistor is connected to the first capacitor, and wherein the source of the output transistor is connected to the node, and the drain of the output transistor sinks the output current.

EMBODIMENT 15B. The circuit of EMBODIMENT 14B, further comprising: a first voltage switching transistor having a gate connected to a gate control signal line, a drain connected to the node, and a source connected to the first capacitor and to the first transistor; a second voltage switching transistor having a gate connected to the gate control signal line, a drain connected to the source of the first transistor, and a source connected to the gate of the second transistor and to the second capacitor; and an input transistor having a gate connected to the gate control signal line, a source connected to the node, and a drain connected to the input, wherein the gate of the output transistor is connected to an access control line, and the first voltage switching transistor, the second voltage switching transistor, and the input transistor are n-type field effect transistors.

EMBODIMENT 16B. The circuit of EMBODIMENT 1B, wherein the first transistor, the second transistor, and the output transistor are p-type field effect transistors having respective gates, sources, and drains, wherein the one or more storage devices includes a first capacitor, wherein the drain of the first transistor is connected to the source of the second transistor, and the gate of the first transistor is connected to the first capacitor, and wherein the drain of the output transistor is connected to the node, and the source of the output transistor sinks the output current.

EMBODIMENT 17B. The circuit of EMBODIMENT 16B, further comprising: an input transistor connected between the node and the input, wherein a drain of the input transistor is connected to a reference current source and a source of the input transistor is connected to the node, a gate of the input transistor being connected to a gate control signal line; a voltage switching transistor having a gate connected to the gate control signal line, a source connected to the gate of the second transistor, and a drain connected to a ground potential; wherein the gate of the output transistor is connected to an access control line, and wherein the first capacitor is connected between the gate of the first transistor and the source of the first transistor.

EMBODIMENT 18B. A method of sourcing or sinking current to provide a bias current for programming pixels of a light-emitting display, comprising: initiating a calibration operation of a current source or sink circuit by activating a calibration control line to cause a reference current to be supplied to the current source or sink circuit; during the calibration operation, storing the current supplied by the reference current in one or more storage devices in the current source or sink circuit; deactivating the calibration control line while activating an access control line to cause sinking or sourcing of an output current corresponding to the current stored in the one or more storage devices; and applying the output current to a column of pixels in an active matrix area of the light-emitting display.

EMBODIMENT 19B. The method of EMBODIMENT 18B, further comprising applying a first bias voltage and a second bias voltage to the current source or sink circuit, the first bias voltage differing from the second bias voltage to allow the reference current to be copied into the one or more storage devices.

EMBODIMENT 20B. A voltage-to-current converter circuit providing a current source or sink for a light-emitting display, the circuit comprising: a current sink or source circuit including a controllable bias voltage transistor having a first terminal connected to a controllable bias voltage and a second terminal connected to a first node in the current sink or source circuit; a gate of the controllable bias voltage transistor connected to a second node; a control transistor connected between the first node, the second node, and a third node; a fixed bias voltage connected through a bias voltage transistor to the second node; and an output transistor connected to the third node and sinking an output current as a bias current to drive a column of pixels of an active matrix area of the light-emitting display.

EMBODIMENT 21B. The voltage-to-current converter circuit of EMBODIMENT 20B, wherein the current sink or source circuit further includes a first transistor series-connected to a second transistor, the first transistor connected to the first node such that current passing through the controllable bias voltage transistor, the first transistor, and the second transistor is adjusted to allow the second node to build up to the fixed bias voltage, and wherein the output current is correlated to the controllable bias voltage and the fixed bias voltage.

EMBODIMENT 22B. The voltage-to-current converter circuit of EMBODIMENT 20B, wherein a source of the controllable bias voltage transistor is connected to the controllable bias voltage, a gate of the controllable bias voltage transistor is connected to the second node, and a drain of the controllable bias voltage transistor is connected to the first node, wherein a source of the control transistor is connected to the second node, a gate of the control transistor is connected to the first node, and a drain of the control transistor is connected to the third node, wherein a source of the bias voltage transistor is connected to the fixed bias voltage, a drain of the supply voltage transistor is connected to the second node, and a gate of the bias voltage transistor is connected to a calibration control line controlled by a controller of the light-emitting display, and wherein a source of the output transistor is connected to a current bias line carrying the bias current, a drain of the output transistor is connected to the third node, and a gate of the output transistor is coupled to the calibration control line such that when the calibration control line is active low, the gate of the output transistor is active high.

EMBODIMENT 23B. A method of calibrating a current source or sink circuit for a light-emitting display using a voltage-to-current converter to calibrate an output current, the method comprising: activating a calibration control line to initiate a calibration operation of the current source or sink circuit; responsive to initiating the calibration operation, adjusting a controllable bias voltage supplied to the current source or sink circuit to a first bias voltage to cause current to flow through the current source or sink circuit to allow a fixed bias voltage to be present at a node in the voltage-to-current converter; deactivating the calibration control line to initiate a programming operation of pixels in an active matrix area of the light-emitting display; and responsive to initiating the programming operation, sourcing or sinking the output current correlated to the controllable bias voltage and the fixed bias voltage to a bias current line that supplies the output current to a column of pixels in the active matrix area.

EMBODIMENT 24B. The method of EMBODIMENT 23B, further comprising during the calibration operation, storing the current flowing through the current source or sink circuit as determined by the fixed bias voltage in one or more capacitors of the current source or sink circuit until the calibration control line is deactivated.

EMBODIMENT 25B. The method of EMBODIMENT 23B, further comprising, responsive to deactivating the calibration control line, lowering the controllable bias voltage to a second bias voltage that is lower than the first bias voltage.

EMBODIMENT 26B. A method of calibrating current source or sink circuits that supply a bias current to columns of pixels in an active matrix area of a light-emitting display, the method comprising: during a calibration operation of the current source or sink circuits in the light-emitting display, activating a first gate control signal line to a first current source or sink circuit for a first column of pixels in the active matrix area to calibrate the first current source or sink circuit with a bias current that is stored in one or more storage devices of the first current source or sink circuit during the calibration operation; responsive to calibrating the first current source or sink circuit, deactivating the first gate control signal line; during the calibration operation, activating a second gate control signal line to a second current source or sink circuit for a second column of pixels in the active matrix area to calibrate the second current source or sink circuit with a bias current that is stored in one or more storage devices of the second current source or sink circuit during the calibration operation; responsive to calibrating the second current source or sink circuit, deactivating the second gate control signal line; and responsive to all of the current source or sink circuits being calibrated during the calibration operation, initiating a programming operation of the pixels of the active matrix area and activating an access control line to cause the bias current stored in the corresponding one or more storage devices in each of the current source or sink circuits to be applied to each of the columns of pixels in the active matrix area.

EMBODIMENT 27B. The method of EMBODIMENT 26B, wherein the current source or sink circuits include p-type transistors and the gate control signal lines and the access control line are active low or wherein the current source or sink circuits include n-type transistors and the gate control signal lines and the access control line are active high.

EMBODIMENT 28B. A direct current (DC) voltage-programmed current sink circuit, comprising: a bias voltage input receiving a bias voltage; an input transistor connected to the bias voltage input; a first current mirror, a second current mirror, and a third current minor each including a corresponding pair of gate-connected transistors, the current minors being arranged such that an initial current created by a gate-source bias of the input transistor and copied by the first current minor is reflected in the second current mirror, current copied by the second current minor is reflected in the third current minor, and current copied by the third current minor is applied to the first current minor to create a static current flow in the current sink circuit; and an output transistor connected to a node between the first current mirror and the second current minor and biased by the static current flow to provide an output current on an output line.

EMBODIMENT 29B. The circuit of EMBODIMENT 28B, wherein the gate-source bias of the input transistor is created by the bias voltage input and a ground potential.

EMBODIMENT 30B. The circuit of EMBODIMENT 28B, wherein the first current mirror and the third current mirror are connected to a supply voltage.

EMBODIMENT 31B. The circuit of EMBODIMENT 28B, further comprising a feedback transistor connected to the third current minor.

EMBODIMENT 32B. The circuit of EMBODIMENT 31B, wherein a gate of the feedback transistor is connected to a terminal of the input transistor.

EMBODIMENT 33B. The circuit of EMBODIMENT 31B, wherein a gate of the feedback transistor is connected to the bias voltage input.

EMBODIMENT 34B. The circuit of EMBODIMENT 31B, wherein the feedback transistor is n-type.

EMBODIMENT 35B. The circuit of EMBODIMENT 28B, wherein the first current mirror includes a pair of p-type transistors, the second mirror includes a pair of n-type transistors, and the third mirror includes a pair of p-type transistors, and wherein the input transistor and the output transistor are n-type.

EMBODIMENT 36B. The circuit of EMBODIMENT 35B, further comprising an n-type feedback transistor connected between the third current mirror and the first current mirror, and wherein: a first p-type transistor of the first current minor is gate-connected to a fourth p-type transistor of the first current minor; a third n-type transistor of the second current mirror is gate-connected to a fourth n-type transistor of the second current minor; a second p-type transistor of the third current mirror is gate-connected to a third p-type transistor of the third current minor; respective sources of the first, second, third, and fourth p-type transistors are connected to a supply voltage and respective sources of the first, second, third, and fourth n-type transistors and the output transistor are connected to a ground potential; the fourth p-type transistor is drain-connected to the fourth n-type transistor; the third p-type transistor is drain-connected to the third n-type transistor; the second p-type transistor is drain-connected to the second n-type transistor; the first p-type transistor is drain-connected to the first n-type transistor; the drain of the third n-type transistor is connected between the gates of the second and third p-type transistors; the drain of the fourth n-type transistor is connected between the gates of the third and fourth n-type transistors and to the node; and a gate of the output transistor is connected to the node.

EMBODIMENT 37B. The circuit of EMBODIMENT 36B, wherein the gate of the second n-type transistor is connected to the gate of the first p-type transistor.

EMBODIMENT 38B. The circuit of EMBODIMENT 36B, wherein the gate of the second n-type transistor is connected to the bias voltage input.

EMBODIMENT 39B. The circuit of EMBODIMENT 28B, wherein the circuit lacks any external clocking or current reference signals.

EMBODIMENT 40B. The circuit of EMBODIMENT 28B, wherein the only voltage sources are provided by the bias voltage input, a supply voltage, and a ground potential and no external control lines are connected to the circuit.

EMBODIMENT 41B. The circuit of EMBODIMENT 28B, wherein the circuit lacks a capacitor.

EMBODIMENT 42B. The circuit of EMBODIMENT 28B, wherein the number of transistors in the circuit is exactly nine.

EMBODIMENT 43B. An alternating current (AC) voltage-programmed current sink circuit, comprising: four switching transistors each receiving a clocking signal that is activated in an ordered sequence, one after the other; a first capacitor charged during a calibration operation by the activation of the first clocked signal and discharged by the activation of the second clocked signal following the activation and deactivation of the first clocked signal, the first capacitor being connected to the first and second switching transistors; a second capacitor charged during the calibration operation by the activation of the third clocked signal and discharged by the activation of the fourth clocked signal following the activation and deactivation of the third clocked signal, the second capacitor being connected to the third and fourth switching transistors; and an output transistor connected to the fourth switching transistor to sink, during a programming operation subsequent to the calibration operation, an output current derived from current stored in the first capacitor during the calibration operation.

EMBODIMENT 44B. The circuit of EMBODIMENT 43B, wherein the four switching transistors are n-type.

EMBODIMENT 45B. The circuit of EMBODIMENT 43B, further comprising: a first conducting transistor connected to the second switching transistor to provide a conduction path for the first capacitor to discharge through the second switching transistor, wherein a voltage across the first capacitor following the charging of the first capacitor is a function of a threshold voltage and mobility of the first conducting transistor; and a second conducting transistor connected to the fourth switching transistor to provide a conduction path for the second capacitor to discharge through the fourth switching transistor.

EMBODIMENT 46B. The circuit of EMBODIMENT 45B, wherein the four switching transistors, the output transistor, the first conducting transistor, and the second conducting transistor are n-type; a gate of the first switching transistor receives the first clocked signal, a drain of the first switching transistor is connected to a first bias voltage; a source of the first switching transistor is connected to a gate of the first conducting transistor, to the first capacitor, and to a source of the second switching transistor; a gate of the second switching transistor receives the second clocked signal, a drain of the second switching transistor is connected to a source of the second conducting transistor and a drain of the first conducting transistor; a gate of the second conducting transistor is connected to the first capacitor; a gate of the second conducting transistor is connected to drain of the third switching transistor, the second capacitor, and a source of the fourth switching transistor; a gate of the third switching transistor receives the third clocked signal, a source of the third switching transistor is connected to a second bias voltage; a gate of the fourth switching transistor receives the fourth clocked signal, a drain of the fourth switching transistor is connected to a source of the output transistor; a gate of the output transistor is connected to an access control line to initiate a programming cycle of the light-emitting display; a drain of the output transistor sinks the output current to a column of pixels of an active matrix area of the light-emitting display; and the first capacitor, a source of the first conducting transistor, and the second capacitor is connected to a ground potential.

EMBODIMENT 47B. The circuit of EMBODIMENT 43B, wherein the number of transistors in the circuit is exactly seven.

EMBODIMENT 48B. The circuit of EMBODIMENT 43B, wherein the number of capacitors in the circuit is exactly two.

EMBODIMENT 49B. A method of programming a current sink with an alternating current (AC) voltage, the method comprising: initiating a calibration operation by activating a first clocked signal to cause a first capacitor to charge; deactivating the first clocked signal and activating a second clocked signal to cause the first capacitor to start discharging; deactivating the second clocked signal and activating a third clocked signal to cause a second capacitor to charge; deactivating the third clocked signal and activating a fourth clocked signal to cause the second capacitor to start discharging; and deactivating the fourth clocked signal to terminate the calibration operation and activating an access control line in a programming operation to cause a bias current derived from current stored in the first capacitor to be applied to a column of pixels in an active matrix area of a light-emitting display during the programming operation.

EMBODIMENT 1C. A calibration circuit for a display panel having an active area having a plurality of light emitting devices arranged on a substrate, and a peripheral area of the display panel separate from the active area, the calibration circuit comprising: a first row of calibration current source or sink circuits; a second row of calibration current source or sink circuits; a first calibration control line configured to cause the first row of calibration current source or sink circuits to calibrate the display panel with a bias current while the second row of calibration current source or sink circuits is being calibrated by a reference current; and a second calibration control line configured to cause the second row of calibration current source or sink circuits to calibrate the display panel with the bias current while the first row of calibration current source or sink circuits is being calibrated by the reference current.

EMBODIMENT 2C. The calibration circuit of EMBODIMENT 1C, wherein the first row and second row of calibration current source or sink circuits are located in the peripheral area of the display panel.

EMBODIMENT 3C. The calibration circuit of EMBODIMENT 1C, further comprising: a first reference current switch connected between the reference current source and the first row of calibration current source or sink circuits, a gate of the first reference current switch being coupled to the first calibration control line; a second reference current switch connected between the reference current source and the second row of calibration current source or sink circuits, a gate of the second reference current switch being coupled to the second calibration control line; and a first bias current switch connected to the first calibration control line and a second bias current switch connected to the second calibration control line.

EMBODIMENT 4C. The calibration circuit of EMBODIMENT 1C, wherein the first row of calibration current source or sink circuits includes a plurality of current source or sink circuits, one for each column of pixels in the active area, each of the current source or sink circuits configured to supply a bias current to a bias current line for the corresponding column of pixels, and wherein the second row of calibration current source or sink circuits includes a plurality of current source or sink circuits, one for each column of pixels in the active area, each of the current source or sink circuits configured to supply a bias current to a bias current line for the corresponding column of pixels.

EMBODIMENT 5C. The calibration current of EMBODIMENT 4C, wherein each of the current source or sink circuits of the first and second rows of calibration current source or sink circuits is configured to supply the same bias current to each of the columns of the pixels in the active area of the display panel.

EMBODIMENT 6C. The calibration circuit of EMBODIMENT 1C, wherein the first calibration control line is configured to cause the first row of calibration current source or sink circuits to calibrate the display panel with the bias current during a first frame, and wherein the second calibration control line is configured to cause the second row of calibration current source or sink circuits to calibrate the display panel with the bias current during a second frame that follows the first frame.

EMBODIMENT 7C. The calibration circuit of EMBODIMENT 1C, wherein the reference current is fixed and is supplied to the display panel from a current source external to the display panel.

EMBODIMENT 8C. The calibration circuit of EMBODIMENT 1C, wherein the first calibration control line is active during a first frame while the second calibration control line is inactive during the first frame, and wherein the first calibration control line is inactive during a second frame that follows the first frame while the second calibration control line is active during the second frame.

EMBODIMENT 9C. The calibration circuit of EMBODIMENT 1C, wherein the calibration current source or sink circuits each calibrate corresponding current-biased, voltage-programmed circuits that are used to program pixels in the active area of the display panel.

EMBODIMENT 10C. A method of calibrating a current-biased, voltage-programmed circuit for a light-emitting display panel having an active area, the method comprising: activating a first calibration control line to cause a first row of calibration current source or sink circuits to calibrate the display panel with a bias current provided by the calibration current source or sink circuits of the first row while calibrating a second row of calibration current source or sink circuits by a reference current; and activating a second calibration control line to cause the second row to calibrate the display panel with the bias current provided by the calibration current or sink circuits of the second row while calibrating the first row by the reference current.

EMBODIMENT 11C. The method of EMBODIMENT 10C, wherein the first calibration control line is activated during a first frame to be displayed on the display panel and the second calibration control line is activated during a second frame to be displayed on the display panel, the second frame following the first frame, the method further comprising: responsive to activating the first calibration control line, deactivating the first calibration control line prior to activating the second calibration control line; responsive to calibrating the display panel with the bias current provided by the circuits of the second row, deactivating the second calibration control line to complete the calibration cycle for a second frame.

EMBODIMENT 12C. The method of EMBODIMENT 10C, further comprising controlling the timing of the activation and deactivation of the first calibration control line and the second calibration control line by a controller of the display panel, the controller being disposed on a peripheral area of the display panel proximate the active area on which a plurality of pixels of the light-emitting display panel are disposed.

EMBODIMENT 13C. The method of EMBODIMENT 12C, wherein the controller is a current source or sink control circuit.

EMBODIMENT 14C. The method of EMBODIMENT 1C, wherein the light-emitting display panel has a resolution of 1920×1080 pixels or less.

EMBODIMENT 15C. The method of EMBODIMENT 1C, wherein the light-emitting display has a refresh rate of no greater than 120 Hz.

The foregoing and additional aspects and embodiments of the present disclosure will be apparent to those of ordinary skill in the art in view of the detailed description of various embodiments and/or aspects, which is made with reference to the drawings, a brief description of which is provided next.

BRIEF DESCRIPTION OF THE DRAWINGS

The foregoing and other advantages of the present disclosure will become apparent upon reading the following detailed description and upon reference to the drawings.

FIG. 5*b*-1 illustrates a circuit schematic of a current sink circuit using only p-type TFTs;

FIG. 5*b*-2 is a timing diagram for the current sink circuit shown in FIG. 5*b*-1;

Figure 1:
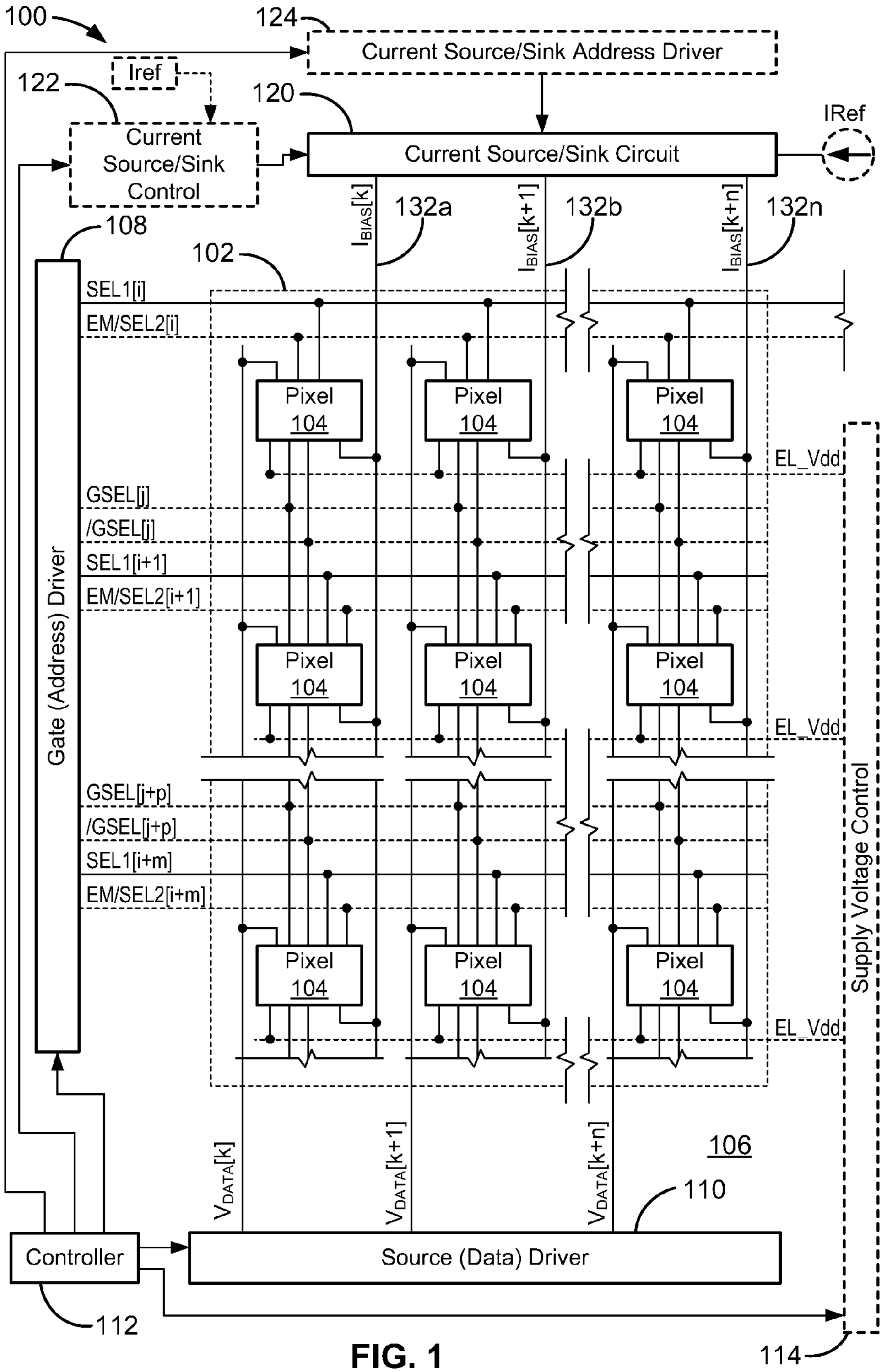
FIG. 1 illustrates an electronic display system or panel having an active matrix area or pixel array in which an array of pixels are arranged in a row and column configuration.

While the present disclosure is susceptible to various modifications and alternative forms, specific embodiments and implementations have been shown by way of example in the drawings and will be described in detail herein. It should be understood, however, that the present disclosure is not intended to be limited to the particular forms disclosed. Rather, the present disclosure is to cover all modifications, equivalents, and alternatives falling within the spirit and scope of the inventions as defined by the appended claims.

DETAILED DESCRIPTION

FIG. 1 is an electronic display system or panel 100 having an active matrix area or pixel array 102 in which an array of pixels 104 are arranged in a row and column configuration. For ease of illustration, only two rows and columns are shown. External to the active matrix area 102 is a peripheral area 106 where peripheral circuitry for driving and controlling the pixel area 102 are disposed. The peripheral circuitry includes a gate or address driver circuit 108, a source or data driver circuit 110, a controller 112, and an optional supply voltage (e.g., Vdd) control driver or circuit 114. The controller 112 controls the gate, source, and supply voltage drivers 108, 110, 114. The gate driver 108, under control of the controller 112, operates on address or select lines SEL[i], SEL[i+1], and so forth, one for each row of pixels 104 in the pixel array 102. In pixel sharing configurations described below, the gate or address driver circuit 108 can also optionally operate on global select lines GSEL[j] and optionally /GSEL[j], which operate on multiple rows of pixels 104 in the pixel array 102, such as every two rows of pixels 104. The source driver circuit 110, under control of the controller 112, operates on voltage data lines Vdata[k], Vdata[k+1], and so forth, one for each column of pixels 104 in the pixel array 102. The voltage data lines carry voltage programming information to each pixel 104 indicative of a luminance (or brightness as subjectively perceived by an observer) of each light emitting device in the pixel 104. A storage element, such as a capacitor, in each pixel 104 stores the voltage programming information until an emission or driving cycle turns on the light emitting device, such as an organic light emitting device (OLED). The optional supply voltage control circuit 114, under control of the controller 112, controls a supply voltage (EL_Vdd) line, one for each row of pixels 104 in the pixel array 102, and optionally any of the controllable bias voltages disclosed herein, although the controllable bias voltages can alternately be controlled by the controller 112. During the driving cycle, the stored voltage programming information is used to illuminate each light emitting device at the programmed luminance.

The display system or panel 100 further includes a current source (or sink) circuit 120 (for convenience referred to as a current "source" circuit hereafter, but any current source circuit disclosed herein can be alternately a current sink circuit or vice versa), which supplies a fixed bias current (called Ibias herein) on current bias lines 132*a*, 132*b* (Ibias[k], Ibias[k+1]), and so forth, one for each column of pixels 104 in the pixel array 102. In an example configuration, the fixed bias current is stable over prolonged usage and can be spatially non-varying. Alternately, the bias current can be pulsed and used only when needed during programming operations. In some configurations, a reference current Iref, from which the fixed bias current (Ibias) is derived, can be supplied to the current source or sink circuit 120. In such configurations, a current source control 122 controls the timing of the application of a bias current on the current bias lines Ibias. In configurations in which the reference current Iref is not supplied to the current source or sink circuit 120 (e.g., FIGS. 9*a*, 12, 13*a*), a current source address driver 124 controls the timing of the application of a bias current on the current bias lines Ibias. The current bias lines can also be referred to herein as reference current lines.

As is known, each pixel 104 in the display system 100 needs to be programmed with information indicating the luminance of the light emitting device in the pixel 104. This information can be supplied to each light emitting device in the form of a stored voltage or a current. A frame defines the time period that includes a programming cycle or phase during which each and every pixel in the display system 100 is programmed with a programming voltage indicative of a luminance and a driving or emission cycle or phase during which each light emitting device in each pixel is turned on to emit light at a luminance commensurate with or indicative of the programming voltage stored in a storage element or a programming current. A frame is thus one of many still images that compose a complete moving picture displayed on the display system 100. There are at least schemes for programming and driving the pixels: row-by-row, or frame-by-frame. In row-by-row programming, a row of pixels is programmed and then driven before the next row of pixels is programmed and driven. In frame-by-frame programming, all rows of pixels in the display system 100 are programmed first, and all of the pixels are driven row-by-row. Either scheme can employ a brief vertical blanking time at the beginning or end of each frame during which the pixels are neither programmed nor driven.

The components located outside of the pixel array 102 can be disposed in a peripheral area 130 around the pixel array 102 on the same physical substrate on which the pixel array 102 is disposed. These components include the gate driver 108, the source driver 110, the optional supply voltage control circuit 114, current source control 122, and current source address driver 124, the current source or sink circuit 120, and the reference current source, Iref. Alternately, some of the components in the peripheral area can be disposed on the same substrate as the pixel array 102 while other components are disposed on a different substrate, or all of the components in the peripheral are can be disposed on a substrate different from the substrate on which the pixel array 102 is disposed. Together, the gate driver 108, the source driver 110, and optionally the supply voltage control circuit 114 make up a display driver circuit. The display driver circuit in some configurations can include the gate driver 108 and the source driver 110 but not the supply voltage control circuit 114. In other configurations, the display driver circuit can include the supply voltage control circuit 114 as well.

A programming and driving technique for programming and driving the pixels, including a current-biased, voltage-programmed (CBVP) driving scheme is disclosed herein. The CBVP driving scheme uses a programming voltage to program different gray or color scales to each pixel (voltage programming) and uses a bias current to accelerate the programming and to compensate for time-dependent parameters of a pixel, such as a shift in the threshold voltage of the driving transistor and a shift in the voltage of the light emitting device, such as an organic light emitting device or OLED.

A particular type of CBVP scheme is disclosed in which a switch transistor is shared between multiple pixels in the display, resulting in improved manufacturing yield by minimizing the number of transistors used in the pixel array 102. This shared switch scheme also allows a conventional sequential scan driving to be used, in which pixels are programmed and then driven row by row within each frame. An advantage of the shared-transistor configurations disclosed herein is that the total transistor count for each pixel can be reduced. Reducing the transistor count can also improve each pixel's aperture ratio, which is the ratio between the transparent (emissive) area, excluding the pixel's wiring and transistors, and the whole pixel area including the pixel's wiring and transistors.

Sharing Switch TFTs in Pixel Circuits

Figure 2A:
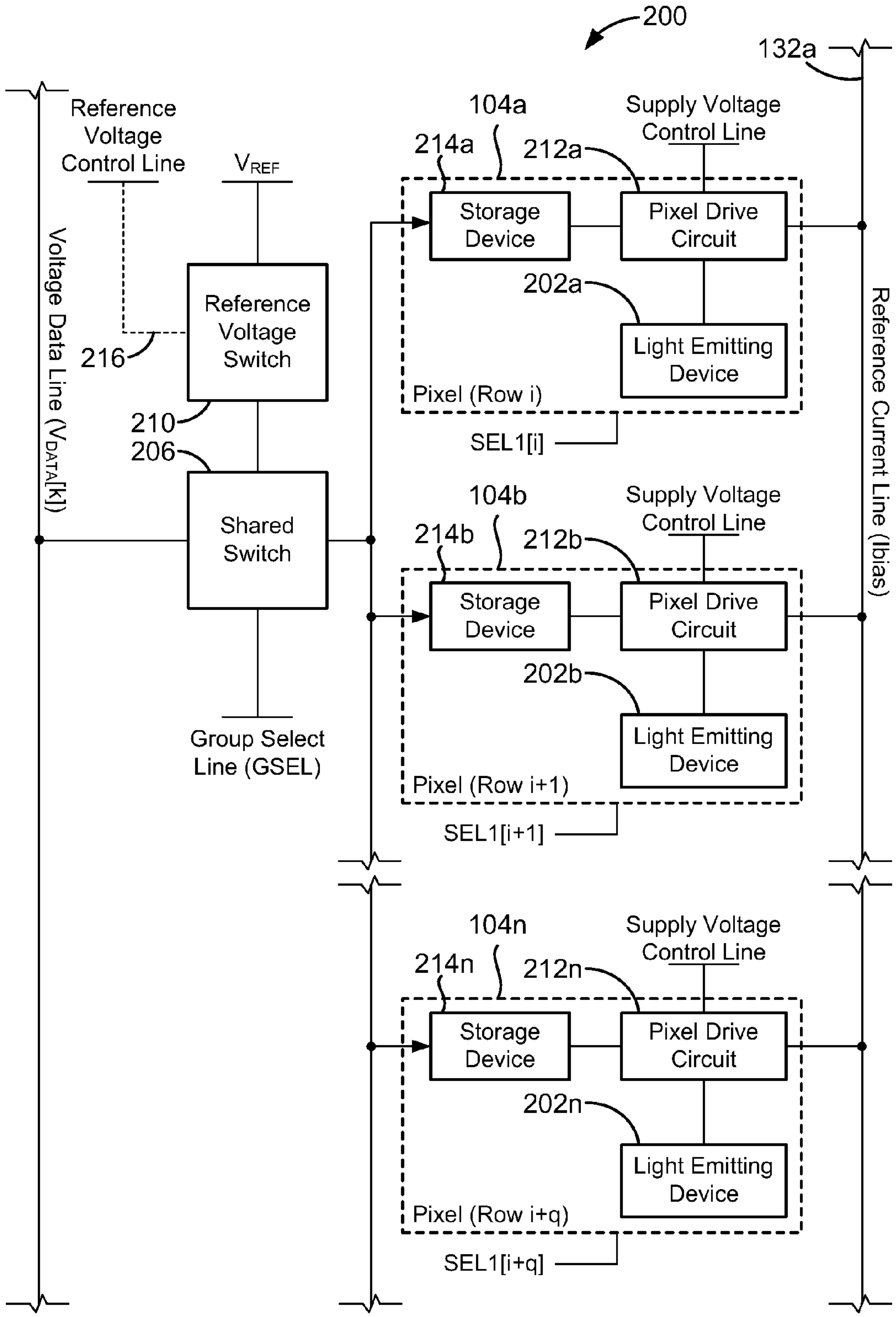
FIG. 2*a* illustrates a functional block diagram of a current-biased, voltage-programmed circuit for the display panel shown in FIG. 1.

FIG. 2*a* illustrates a functional block diagram of a CBVP circuit 200 for the display panel 100 shown in FIG. 1. The CBVP circuit 200 includes the active area 102 shown in FIG. 1 and a peripheral area separate from the active area 102, and the active area 102 includes pixels 104, and each pixel includes a light emitting device 202*a* arranged on a substrate 204. In FIG. 2*a*, only two pixels 104*a,b* are shown for ease of illustration, and a first pixel 104*a* is in a first row i, and a second pixel 104*b* is in a second row i+1, adjacent to the first row. The CBVP circuit 200 includes a shared switch transistor 206 connected between a voltage data line Vdata and a shared line 208 that is connected to a reference voltage Vref through a reference voltage transistor 210. The reference voltage can be a direct current (DC) voltage, or a pulsed signal. The first pixel 104*a* includes a first light emitting device 202*a* configured to be current-driven by a first drive circuit 212*a* connected to the shared line 208 through a first storage device 214*a*, and the second pixel 104*b* includes a second light emitting device 202*b* configured to be current-driven by a second drive circuit 212*b* connected to the shared line 208 through a second storage device 214*b*.

The CBVP circuit 200 includes a reference current line 132*a* configured to apply a bias current Ibias to the first and second drive circuits 212*a,b*. The state (e.g., on or off, conducting or non-conducting in the case of a transistor) of the shared switch transistor 206 can be controlled by a group select line GSEL[j]. The state of the reference voltage switch 210 can be controlled by a reference voltage control line, such as \GSEL[j]. The reference voltage control line 216 can be derived from the group select line GSEL, or it can be its own independent line from the gate driver 108. In configurations where the reference voltage control line 216 is derived from the group select line GSEL, the reference voltage control line 216 can be the inverse of the group select line GSEL such that when the group select line GSEL is low, the reference voltage control line 216 is high and vice versa. Alternately, the reference voltage control line 216 can be an independently controllable line by the gate driver 108. In a specific configuration, the state of the group select line GSEL is opposite to the state of the reference voltage control line 216.

Each of the pixels 104*a,b* is controlled by respective first and second select lines SEL1[*i*] and SEL1[*i*+1], which are connected to and controlled by the gate driver 108. The gate driver 108 is also connected to the shared switch via the group select line GSEL and to the reference voltage transistor via the reference voltage control line 216. The source driver 110 is connected to the shared switch 206 via the voltage data line Vdata, which supplies the programming voltage for each pixel 104 in the display system 100. The gate driver 108 is configured to switch the reference voltage transistor 210 from a first state to a second state (e.g., from on to off) such that the reference voltage transistor 210 is disconnected from the reference voltage Vref during the programming cycle. The gate driver 108 is also configured to switch the shared switch transistor 206 from the second state to the first state (e.g., from off to on) via the group select line GSEL during a programming cycle of a frame to allow voltage programming (via the voltage data line Vdata) of the first and second pixels 104*a,b*. The reference current line 132*k* is also configured to apply the bias current Ibias during the programming cycle.

In the example shown, there are a number, i+q, rows of pixels that share the same shared switch 206. Any two or more pixels can share the same shared switch 206, so the number, i+q, can be 2, 3, 4, etc. It is important to emphasize that each of the pixels in the rows i through i+q share the same shared switch 206.

Although, a CBVP technique is used as an example to illustrate the switch sharing technique, it can be applied to different other types of pixel circuits, such as current-programmed pixel circuits or purely voltage-programmed pixel circuits or pixel circuits lacking a current bias to compensate for shifts in threshold voltage and mobility of the LED drive transistors.

The gate driver 108 is also configured to toggle the first select line SEL1[*i*] (e.g., from a logic low state to a logic high state or vice versa) during the programming cycle to program the first pixel 104*a* with a first programming voltage specified by the voltage data line Vdata and stored in the first storage device 214*a* during the programming cycle. Likewise, the gate driver 108 is configured to toggle the second select line SEL1[*i*+1] during the programming cycle to program the second pixel 104*b* with a second programming voltage (which may differ from the first programming voltage) specified by the voltage data line Vdata and stored in the second storage device 214*b* during the programming cycle.

The gate driver 108 can be configured to, following the programming cycle, such as during an emission cycle, switch the reference voltage transistor 210 via the reference voltage control line 216 from the second state to the first state (e.g., from off to on) and to switch the shared switch transistor 206 via the group select line GSEL from the first state to the second state (e.g., from on to off). The optional supply voltage control circuit 114 shown in FIG. 1 can be configured to adjust a supply voltage, EL_Vdd, coupled to the first and second light emitting devices 202*a,b* to turn on the first and second light emitting devices 202*a,b* during the driving or emission cycle that follows the programming cycle of the frame. In addition, the optional supply voltage control circuit 114 can be further configured to adjust the supply voltage, EL_Vdd, to a second supply voltage, e.g., Vdd2, to a level that ensures that the first and second light emitting devices 202*a,b* remain in a non-emitting state (e.g., off) during the programming cycle.

Figure 2B:
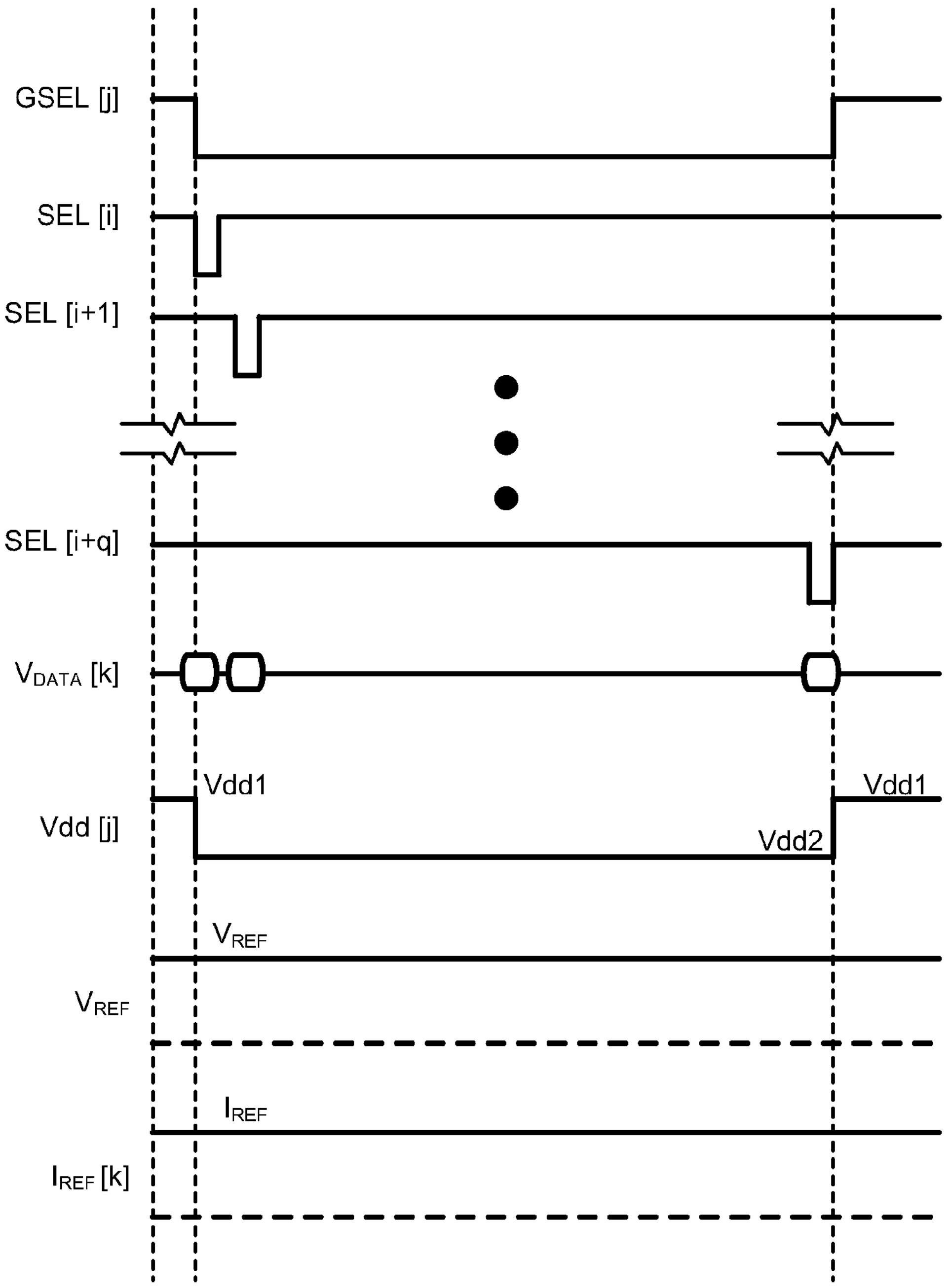
FIG. 2*b* is a timing diagram for the CBVP circuit shown in FIG. 2*a;*

FIG. 2*b* is an example timing diagram of the signals used by the CBVP circuit 200 of FIG. 2*a* or any other shared-transistor circuit disclosed herein during a programming cycle. Starting from the top of the timing diagram, the gate driver 108 toggles the group select line GSEL from a second state to a first state, e.g., from high to low, and holds that line in the first state until all of the pixels in the group of rows shared by the common shared switch 206 are programmed. In this example, there are a number, i+q, rows of pixels that share the same shared switch, where i+q can be 2, 3, 4, etc. The gate driver 108 activates the select line SEL[i] for the ith row in the group to be programmed in the shared pixel circuit, such as the CBVP circuit 200. The pixel in the ith row [i] is programmed by the corresponding programming voltage in Vdata while the SEL[i] line is activated for that ith row [i].

The gate driver 108 activates the selection line SEL [i+1] for the i+$1^{st}$ row in the group to be programmed in the shared pixel circuit, and the pixel in the i+$1^{st}$ row [i+1] is programmed by the corresponding programming voltage in Vdata while the SEL[i+1] line is activated for the i+$1^{st}$ row [i+1]. This process is carried out for at least two rows and is repeated for every other row in the group of pixels that share the shared switch 206. For example, if there are three rows in the group of pixels, then the gate driver 108 activates the selection line SEL [i+q] for the i+qth row (where q=2) in the group to be programmed in the shared circuit, and the pixel in the i+qth row [i+q] is programmed by the corresponding programming voltage in Vdata while the SEL[i+q] line is activated for the i+qth row [i+q].

While the group select line GSEL is activated, the supply voltage control 114 adjusts the supply voltage, Vdd, to each of the pixels in the group of pixels that share the shared switch 206, from Vdd1 to Vdd2, where Vdd1 is a voltage sufficient to turn on each of the light emitting devices 202*a,b,n* in the group of pixels being programmed, and Vdd2 is a voltage sufficient to turn off each of the light emitting devices 202*a, b,n* in the group of pixels being programmed. Controlling the supply voltage in this manner ensures that the light emitting devices 202*a,b,n* in the group of pixels being programmed cannot be turned on during the programming cycle. Still referring to the timing diagram of FIG. 2*b*, the reference voltage and the reference current maintain a constant voltage, Vref, and current, Iref, respectively.

3Te Pixel Circuit Schematic with Sharing Architecture

Figure 3A:
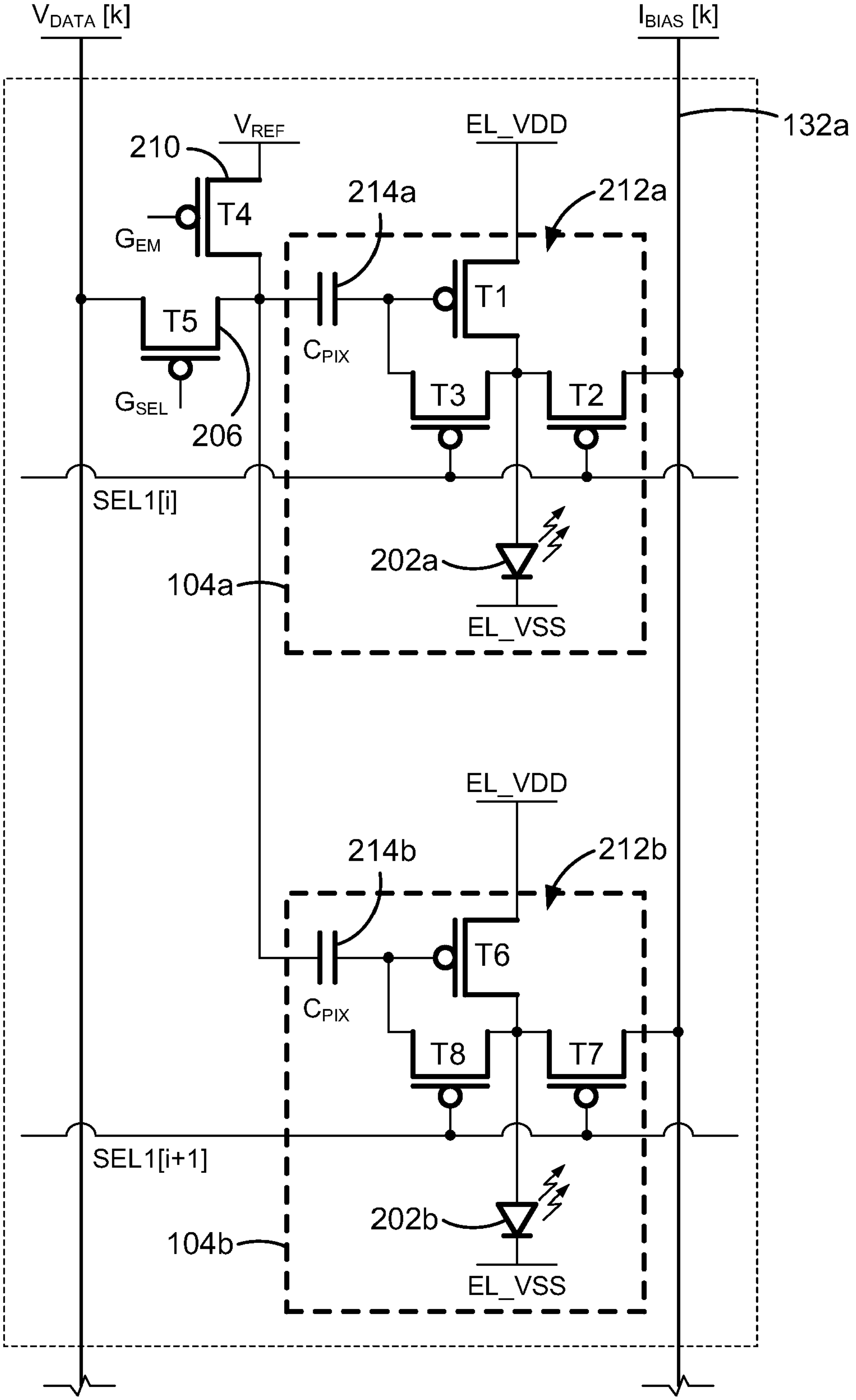
FIG. 3*a* is a circuit schematic of an exemplary CBVP circuit schematic that can be used in connection with the CBVP circuit shown in FIG. 2*a;*

FIG. 3*a* is a circuit schematic of an exemplary CBVP circuit schematic that can be used in connection with the CBVP circuit 200 shown in FIG. 2*a*. This design features eight TFTs in every two row-adjacent pixels (i, i+1) in a column, k, in a pixel-sharing configuration. In this eight-TFT pixel-sharing configuration, there is no gating TFT between the driving TFT (T1 and T7) and the light emitting device 202*a,b* in both sub-pixels 104*a,b*. The driving TFTs T1 and T7 are connected directly to their respectively light emitting devices 202*a,b* at all times. This configuration allows the toggling of the supply voltage, EL_VDD, to the light emitting devices 202*a,b* to avoid excessive and unnecessary current drain when the pixel is not in the emission or driving phase.

In the FIG. 3*a* circuit schematic example, the first and second storage devices 214*a,b* are storage capacitors Cpix, both having a terminal connected to the shared line 208. Again, only two pixels 104*a,b* in two rows i and i+1 are shown for ease of illustration. The shared switch 206 (a transistor labeled T5) can be shared among two or more adjacent rows of pixels 104. The transistors shown in this circuit are p-type thin-film transistors (TFTs), but those of ordinary skill in the art will appreciate that the circuit can be converted to an n-type TFT or a combination of n- and p-type TFTs or other types of transistors, including metal-oxide-semiconductor (MOS) transistors. The present disclosure is not limited to any particular type of transistor, fabrication technique, or complementary architecture. The circuit schematics disclosed herein are exemplary.

The first drive circuit 212*a* of the first pixel 104*a* includes a first drive transistor, labeled T1, connected to a supply voltage EL_Vdd and to the first light emitting device 202*a*. The first drive circuit 212*a* further includes a pair of switch transistors, labeled T2 and T3, each coupled to the first select line SEL1[*i*] for transferring the bias current from the reference current line 132*a* to the first storage device, identified as a capacitor, Cpix, during a programming cycle. The gate of T1 is connected to the capacitor Cpix 214*a*. T2 is connected between the reference current line 132*a* and the first light emitting device 202*a*. T3 is connected between the first light emitting device 202*a* and the capacitor Cpix 214*a*.

The second drive circuit 212*b* of the second pixel 104*b* includes a second drive transistor, labeled T6, connected to the supply voltage, EL_VDD, and to the second light emitting device 202*b*. The gate of T6 is connected to a second storage device 214*b*, identified as a capacitor, Cpix, and a pair of switch transistors, labeled T7 and T8, each coupled to the second select line, SEL1[*i*+1] for transferring the bias current, Ibias, from the reference current line 132*a* to the capacitor 214*b* during a programming cycle. T7 is connected between the reference current line 132*a* and the second light emitting device 202*b* and T8 is connected between the second light emitting device 202*b* and the capacitor 214*b*.

The details of FIG. 3*a* will now be described. It should be noted that every transistor described herein includes a gate terminal, a first terminal (which can be a source or a drain in the case of a field-effect transistor), and a second terminal (which can be a drain or a source). Those skilled in the art will appreciate that, depending on the type of the FET (e.g., a n-type or a p-type), the drain and source terminals will be reversed. The specific schematics described herein are not intended to reflect the sole configuration for implementing aspects of the present disclosure. For example, in FIG. 3*a*, although a p-type CBVP circuit is shown, it can readily be converted to an n-type CBVP circuit.

The gate of T1 is connected to one plate of the capacitor Cpix 214*a*. The other plate of the capacitor Cpix 214*a* is connected to the source of T5. The source of T1 is connected to a supply voltage, EL_VDD, which in this example is controllable by the supply voltage control 114. The drain of T1 is connected between the drain of T3 and the source of T2. The drain of T2 is connected to the bias current line 132*a*. The gates of T2 and T3 are connected to the first select line SEL1[*i*]. The source of T3 is connected to the gate of T1. The gate of T4 receives a group emission line, $G_{EM}$. The source of T4 is connected to the reference voltage Vref. The drain of T4 is connected between the source of T5 and the other plate of the first capacitor 214*a*. The gate of T5 receives the group select line $G_{SEL}$, and the drain of T5 is connected to the Vdata line. The light emitting device 202*a* is connected to the drain of T1.

Turning now to the next sub-pixel in the CBVP circuit of FIG. 3*a*, the gate of T6 is connected to one plate of the second capacitor 214*b* and to the drain of T8. The other plate of the second capacitor 214*b* is connected to the source of T5, the drain of T4, and the other plate of the first capacitor 214*a*. The source of T6 is connected to the supply voltage EL_VDD. The drain of T6 is connected to the drain of T8, which is connected to the source of T7. The drain of T7 is connected to the bias current line Ibias 132*a*. The gates of T7 and T8 are connected to the second select line SEL1[*i*+1]. The second light emitting device 202*b* is connected between a ground potential EL_VSS and the drain of T6.

Figure 3B:
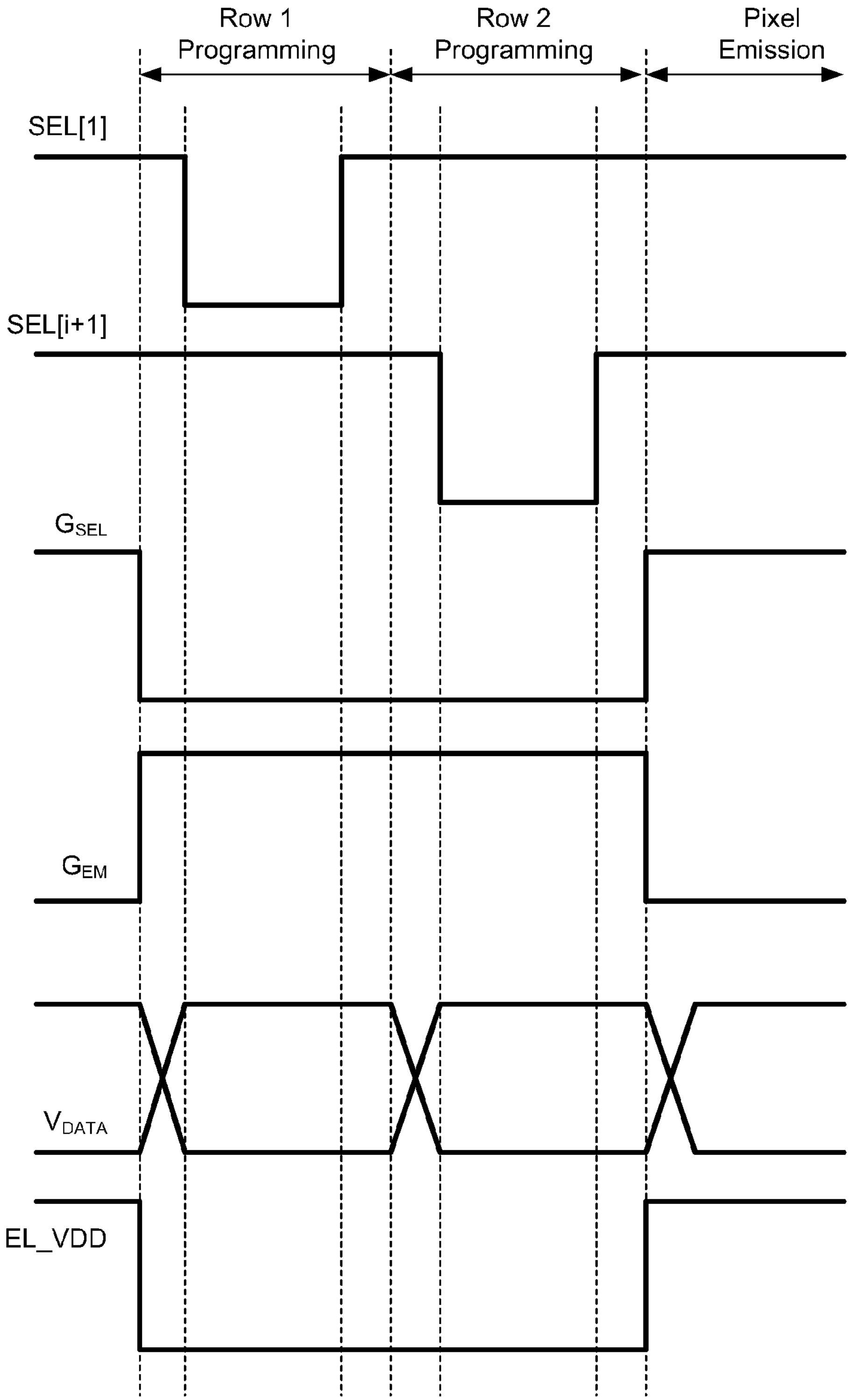
FIG. 3*b* illustrates an example timing diagram for the CBVP circuit shown in FIG. 3*a;*
Figure 4A:
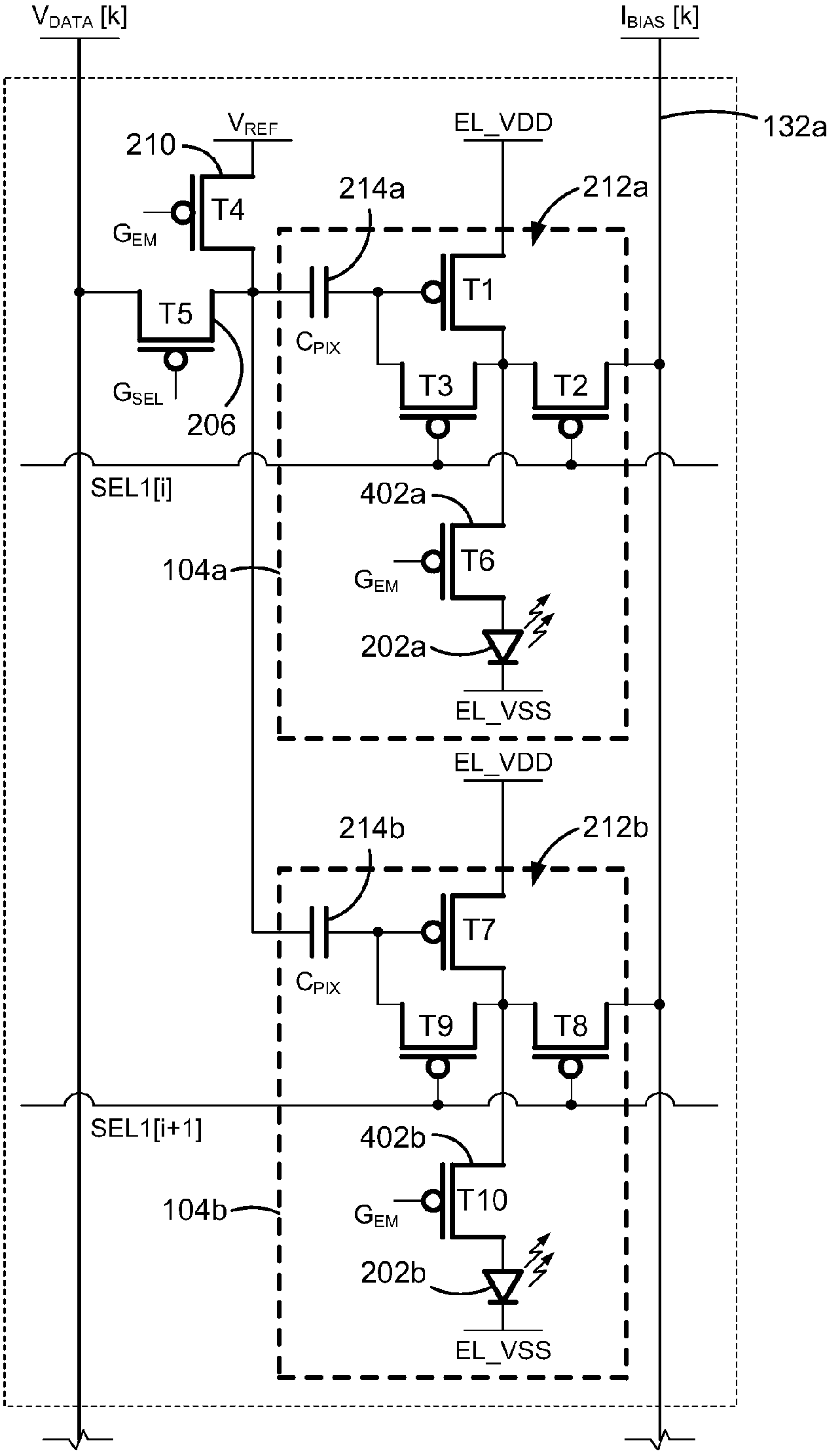
FIG. 4*a* illustrates a variation of the CBVP circuit shown in FIG. 3*a*, except that a gating transistor (T6 and T10) is added between the light emitting device and the drive transistor (T1 and T7)

FIG. 3*b* illustrates an example timing diagram for the CBVP circuit shown in FIG. 3*a*. As mentioned above, this shared-pixel configuration toggles the supply voltage, EL_VDD, to avoid drawing excess current when the pixel is not in a driving or emission cycle. In general, the supply voltage control 114 lowers the potential of the EL_VDD line during pixel programming, in order to limit the potential across the light emitting device 202*a,b* to reduce current consumption and hence brightness during pixel programming. The toggling of the supply voltage, EL_VDD, by the supply voltage control 114, combined with the sequential programming operation (in which a group of pixels are programmed and then immediately driven, one group of pixels at a time), implies that the EL_VDD line 132*a* is not shared globally among all pixels. The voltage supply line 132*a* is shared only by the pixels in a common row, and such power distribution is carried out by integrated electronics at the peripheral area 106 of the pixel array 102. The omission of one TFT at the unit pixel level reduces the real-estate consumption of said pixel design, achieving higher pixel resolution than higher-transistor shared-pixel configurations, such as shown in FIG. 4*a*, at the expense of periphery integrated electronics.

The sequential programming operation programs a first group of pixels that share a common shared switch 206 (in this case, two pixels in a column at a time), drives those pixels, and then programs the next group of pixels, drives them, and so forth, until all of the rows in the pixel array 102 have been programmed and driven. To initiate shared-pixel programming, the gate driver 108 toggles the group select line, GSEL, low, which turns on the shared switch 206 (T5). Simultaneously, the gate driver 108 toggles a group emission line, $G_{EM}$, high, which turns off T4. In this example, the group emission line $G_{EM}$ and the group select line $G_{SEL}$ are active low signals because T4 is and T5 are p-type transistors. The supply voltage control 114 lowers the supply voltage EL_VDD to a voltage sufficient to keep the light emitting devices 202*a,b* from drawing excess current during the programming operation. This ensures that the light emitting devices 202*a,b* draw little or no current during programming, preferably remaining off or in a non-emitting or near non-emitting state. In this example, there are two shared pixels per switch transistor 206, so the pixel in the first row, i, is programmed followed by the pixel in the second row, i+1. In this example, the gate driver 108 toggles the select line for the ith row (SEL[i]) from high to low, which turns on T2 and T3, allowing the current Ibias on the reference current line 132*a* to flow through the driving transistor T1 in a diode-connected fashion, causing the voltage at the gate of T1 to become $V_B$, a bias voltage. Note the time gap between the active edge of SEL[i] and GSEL ensures proper signal settling of the Vdata line. The source driver 110 applies the programming voltage ($V_P$) on Vdata for the first pixel 104*a*, causing the capacitor 214*a* to be biased at the programming voltage $V_P$ specified for that pixel 104*a*, and stores this programming voltage for the first pixel 104*a* to be used during the driving cycle. The voltage stored in the capacitor 214*a* is $V_B-V_P$.

Next, the gate driver 108 toggles the select line for the $i+1^{st}$ row (SEL[i+1]) from high to low, which turns on T7 and T8 in the second pixel 104*b*, allowing all of the current Ibias on the reference current line 132*a* to flow through the drive transistor T6 in a diode-connected fashion, causing the voltage at the gate of T6 to become $V_B$, a bias voltage. The source driver 110 applies the programming voltage $V_P$ on the Vdata line for the second pixel 104*b*, causing the capacitor 214*b* to be biased at the programming voltage $V_P$ specified in Vdata for the second pixel 104*b*, and stores this programming voltage $V_P$ for the second pixel 104 to be used during the driving cycle. The voltage stored in the capacitor 214*b* is $V_B-V_P$. Note that the Vdata line is shared and connected to one plate of both capacitors 214*a,b*. The changing of the Vdata programming voltages will affect both plates of the capacitors 214*a,b* in the group, but only the gate of the drive transistor (either T1 or T6) that is addressed by the gate driver 108 will be allowed to change. Hence, different charges can be stored in the capacitors 214*a,b* and preserved there after programming the group of pixels 104*a,b*.

After both pixels 104*a,b* have been programmed and the corresponding programming voltage Vdata has been stored in each of the capacitors 214*a,b*, the light emitting devices 202*a,b* are switched to an emissive state. The select lines SEL[i], SEL[i+1] are clocked non-active, turning T2, T3, T7, and T8 off, stopping the flow of the reference current Ibias to the pixels 104*a,b*. The group emission line $G_{EM}$ is clocked active (in this example, clocked from low to high), turning T4 on. One plate of the capacitors 214*a,b* start to rise to Vref, leading the gates of T1 and T6 to rise according to the stored potential across each of the respective capacitors 214*a,b* during the programming operation. The rise of the gate of T1 and T6 establishes a gate-source voltage across T1 and T6, respectively, and the voltage swing at the gate of T1 and T6 from the programming operation corresponds to the difference between Vref and the programmed Vdata value. For example, if Vref is Vdd1, the gate-source voltage of T1 goes to $V_B-V_P$, and the supply voltage EL_VDD goes to Vdd1. Current flows from the supply voltage through the drive switches T1 and T6, resulting in light emission by the light emitting devices 202*a,b*.

The duty cycle can be adjusted by changing the timing of the Vdd1 signals (for example, for a duty cycle of 50%, the Vdd line stays at Vdd1 for 50% of the frame, and thus the pixels 104*a,b* are on for only 50% of the frame). The maximum duty cycle can be close to 100% because only the pixels 104*a,b* in each group can be off for a short period of time.

5T Pixel with Sharing Configuration

Figure 4B:
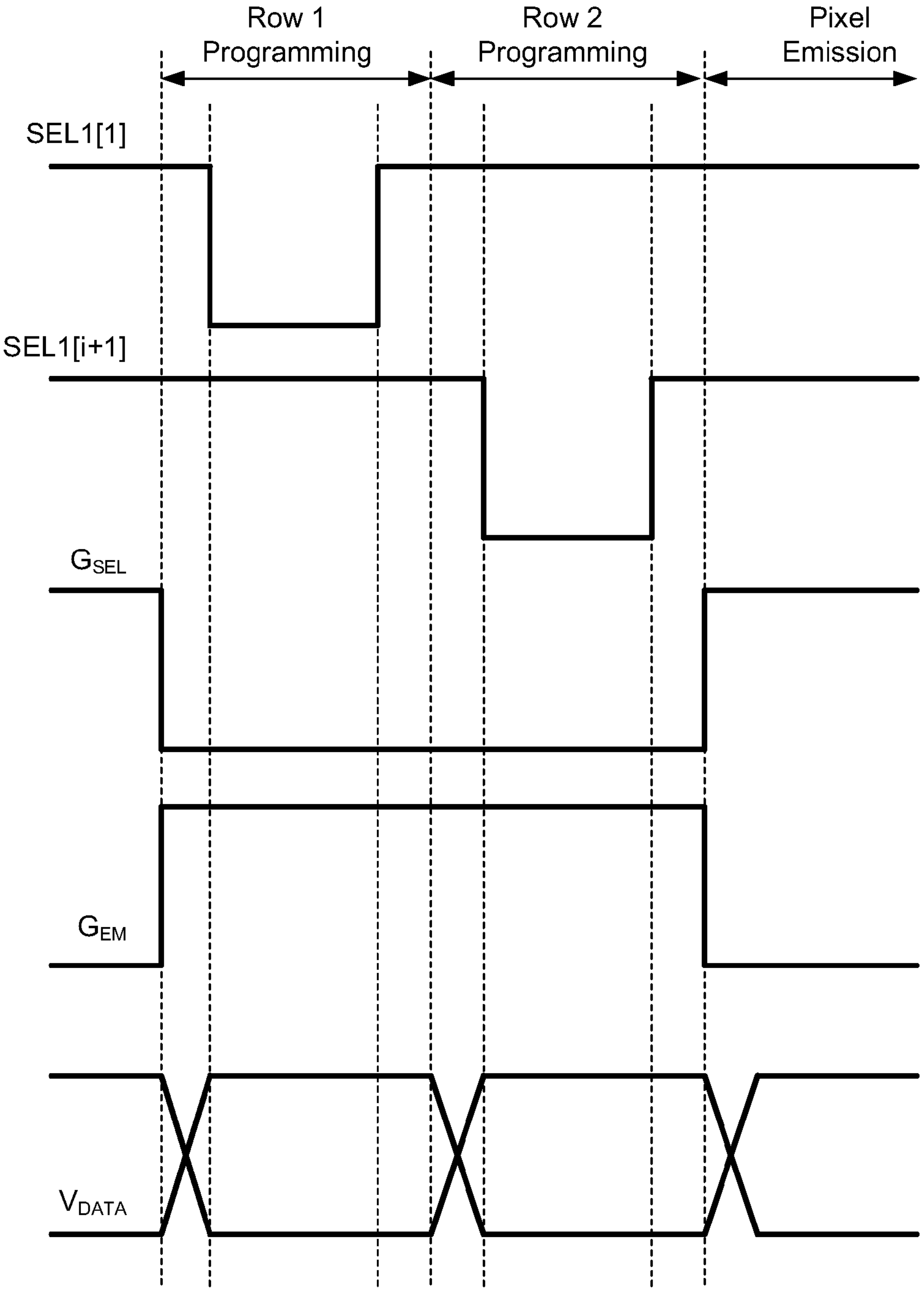
FIG. 4*b* is a timing diagram for the CBVP circuit shown in FIG. 4*a;*

FIGS. 4*a* and 4*b* illustrate an example circuit schematic and timing diagram of another pixel-sharing configuration, featuring ten TFTs in every two adjacent pixels. The reference voltage switch (T4) and the shared switch transistor (T5) are shared between two adjacent pixels (in rows i, i+1) in a column, k. Each sub-pixel 104*a,b* in the group sharing the two aforementioned TFTs have their respective four TFTs serving as the driving mechanism for the light emitting devices 202*a, b*, namely T1, T2, T3, and T6 for the top sub-pixel 104*a*; and T7, T8, T9, and T10 for the bottom sub-pixel 202*b*. The collective two-pixel configuration is referred to as a group.

The first drive circuit 212*a* includes a first drive transistor T1 connected to a supply voltage EL_VDD and a gating transistor 402*a* (T6) connected to the first light emitting device 202*a*. A gate of the first drive transistor T6 is connected to a first storage device 214*a* and to a pair of switch transistors T2 and T3, each coupled to the select line SEL1[*i*] for transferring the bias current Ibias from the reference current line 132*a* to the first storage device 214*a* during a programming cycle. The gating transistor 402*a* (T6) is connected to a reference voltage control line, $G_{EM}$, that is also connected to the reference voltage transistor 210 (T4).

The reference voltage control line $G_{EM}$ switches both the reference voltage transistor 210 and the gating transistor 402*a* between a first state to a second state simultaneously (e.g., on to off, or off to on). The reference voltage control line $G_{EM}$ is configured by the gate driver 108 to disconnect the reference voltage transistor 210 from the reference voltage Vref and the first light emitting device 202*a* from the first drive transistor T1 during the programming cycle.

Likewise, for the sub-pixel in the group (pixel 104*b*), the second drive circuit 212*b* includes a second drive transistor T7 connected to the supply voltage EL_VDD and a gating transistor 402*b* (T10) connected to the second light emitting device 202*b*. A gate of the second drive transistor T7 is connected to a second storage device 214*b* and to a pair of switch transistors T8 and T9, each coupled to the select line SEL1 [*i*+1] for transferring the bias current Ibias from the reference current line 132*a* to the second storage device 214*b* during a programming cycle. The gating transistor 402*b* (T10) is connected to a reference voltage control line, $G_{EM}$, that is also connected to the reference voltage transistor 210 (T4).

The reference voltage control line $G_{EM}$ switches both the reference voltage transistor 210 and the gating transistor 402*a* between a first state to a second state simultaneously (e.g., on to off, or off to on). The reference voltage control line $G_{EM}$ is configured by the gate driver 108 to disconnect the reference voltage transistor 210 from the reference voltage Vref and the second light emitting device 202*b* from the second drive transistor T7 during the programming cycle.

The timing diagram shown in FIG. 4*b* is a sequential programming scheme, similar to that shown in FIG. 3*b*, except that there is no separate control of the supply voltage EL_VDD. The reference voltage control line $G_{EM}$ connects or disconnects the light emitting devices 202*a,b* from the supply voltage. The $G_{EM}$ line can be connected to the $G_{SEL}$ line through a logic inverter such that when the $G_{EM}$ line is active, the $G_{SEL}$ line is inactive, and vice versa.

During a pixel programming operation, the gate driver 108 addresses the GSEL line corresponding to the group active (in this example using p-type TFTs, from high to low). The shared switch transistor 206 (T5) is turned on, allowing one side of the capacitors 214*a,b* for each sub-pixel 104*a,b* to be biased at the respective programming voltages carried by Vdata during the programming cycle for each row.

The gate driver 108 addresses the SEL1[*i*] line corresponding to the top sub-pixel 104*a* active (in this example, from high to low). Transistors T2 and T3 are turned on, allowing the current Ibias to flow through the drive TFT T1 in a diode-connected fashion. This allows the gate potential of T1 to be charged according to Ibias, and the threshold voltage of T1 and the mobility of T1. The time gap between the active edge of SEL1[*i*] and GSEL is to ensure proper signal settling of Vdata line.

The source driver 114 toggles the Vdata line to a data value (corresponding to a programming voltage) for the bottom sub-pixel 104*b* during the time gap for the time between SEL1[*i*] turns non-active and before SEL1[*i*+1] turns active. Then, SEL1[*i*+1] is addressed, turning T8 and T9 on. T7 and its corresponding gate potential will be charged similarly as T1 in the top sub-pixel 104*a*.

Note that the Vdata line is shared and is connected to one plate of both capacitors 214*a,b*. The changing of the Vdata value will affect simultaneously both plates of the capacitors 214*a,b* in the group 104*a,b*. However, only the gate of the driving TFT (either T1 or T7) that is addressed will be allowed to change in this configuration. Hence, the charge stored in each capacitor Cpix 214*a,b* is preserved after pixel programming.

Following programming of the pixels 104*a,b*, a pixel emission operation is carried out by clocking SEL1[*i*] and SEL1[*i*+1] non-active (switching from low to high), turning T2, T3, T8 and T9 off, which stops the current flow of Ibias to the pixel group 104*a,b*.

$G_{EM}$ is clocked active (in this example, from low to high), turning T4, T6 and T10 on, causing one plate of the capacitors 214*a,b* to rise to VREF, consequently leading to the gate of T1 and T7 to rise according to the potential across each capacitor 214*a,b* during the programming operation. This procedure establishes a gate-source voltage across T1, and the voltage swing at the gate of T1 and T7 from the programming phase corresponds to the difference between VREF and programmed VDATA value.

The current through T1 and T7 passes through T6 and T10 respectively, and drives the light emitting devices 202*a,b*, resulting in light emission. This five-transistors-per-pixel design in a pixel-sharing configuration reduces the total transistor count for every two adjacent pixels. Compared to a six-transistors-per-pixel configuration, this pixel configuration requires smaller real estate and achieves a smaller pixel size and higher resolution. In comparison to configuration shown in FIG. 3*a*, the pixel-sharing configuration of FIG. 4*a* eliminates the need to toggle EL_VDD (and thus the need for a supply voltage control 114). The generation of GSEL and GESM signals can be done at the peripheral area 106 by integrated signal logic.

The schematic details of the CBVP circuit example shown in FIG. 4*a* will now be described. The gate of the drive transistor T1 is connected to one plate of the first capacitor 214*a* and to the source of one of the switch transistors, T3. The source of T1 is connected to the supply voltage EL_VDD, which in this example is fixed. The drain of T1 is connected to the drain of T3, which is connected to the source of another switch transistor T2. The drain of T2 is connected to the current bias line 132*a*, which carries a bias current Ibias. The gates of T2 and T3 are connected to the first select line SEL1[*i*]. The other plate of the first capacitor 214*a* is connected to the drain of T4 and to the drain of T5. The source of T4 is connected to a reference voltage, Vref. The gate of T4 receives a group emission line G. The gate of T5 receives a group selection line, $G_{SEL}$. The source of T5 is connected to the Vdata line. The gate of the first gating transistor T6 is also connected to the group emission line $G_{EM}$. The first light emitting device 202*a* is connected between the drain of T6 and a ground potential EL_VSS. The source of T6 is connected to the drain of T1.

Referring to the second sub-pixel that includes the second light emitting device 202*b*, the gate of the second drive transistor T7 is connected to the source of T9 and to one plate of the second capacitor 214*b*. The other plate of the second capacitor 214*b* is connected to the drain of T5, the drain of T4, and the other plate of the first capacitor 214*a*. The source of T7 is connected to the supply voltage EL_VDD. The drain of T7 is connected to the drain of T9, which is connected to the source of T8. The drain of T8 is connected to the bias current line 132*a*. The gates of T8 and T9 are connected to the second select line SEL1[*i*+1]. The gate of the second gating transistor T10 is connected to the group emission line $G_{EM}$. The source of T10 is connected to the drain of the second drive transistor T7. The second light emitting device 202*b* is connected between the drain of T10 and the ground potential EL_VSS.

Stable Current Source for System Integration to Display Substrate

To supply a stable bias current for the CBVP circuits disclosed herein, the present disclosure uses stable current sink or source circuits with a simple construction for compensating for variations in in-situ transistor threshold voltage and charge carrier mobility. The circuits generally include multiple transistors and capacitors to provide a current driving or sinking medium for other interconnecting circuits, and the conjunctive operation of these transistors and capacitors enable the bias current to be insensitive to the variation of individual devices. An exemplary application of the current sink or source circuits disclosed herein is in active matrix organic light emitting diode (AMOLED) display. In an such example, these current sink or source circuits are used in a column-to-column basis as part of the pixel data programming operation to supply a stable bias current, Ibias, during the current-bias, voltage programming of the pixels.

The current sink or source circuits can be realized with deposited large-area electronics technology such as, but not limited to, amorphous silicon, nano/micro-crystalline, polysilicon, and metal oxide semiconductor, etc. Transistors fabricated using any of the above listed technologies are customarily referred to thin-film-transistors (TFTs). The aforementioned variability in transistor performances such as TFT threshold voltage and mobility change can originate from different sources such as device aging, hysteresis, spatial non-uniformity. These current sink or source circuits focus on the compensation of such variation, and make no distinction between the various or combination of said origins. In other words, the current sink or source circuits are generally totally insensitive to and independent from any variations in the threshold voltage or mobility of the charge carriers in the TFT devices. This allows for a very stable Ibias current to be supplied over the lifetime of the display panel, which bias current is insensitive to the aforementioned transistor variations.

Figure 5A:
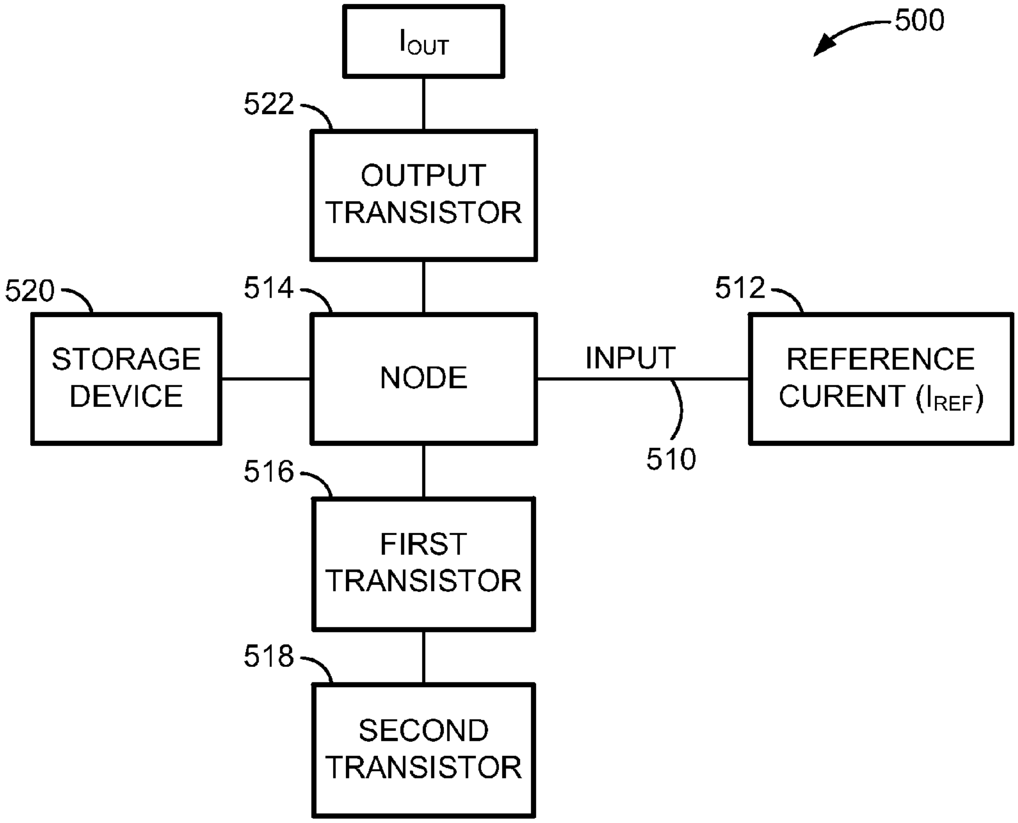
FIG. 5*a* illustrates a functional block diagram of a current sink or source circuit according to an aspect of the present disclosure.

FIG. 5*a* illustrates a functional block diagram of a high-impedance current sink or source circuit 500 for a light-emitting display 100 according to an aspect of the present disclosure. The circuit 500 includes an input 510 that receives a fixed reference current 512 and provides the reference current 512 to a node 514 in the current source or sink circuit 500 during a calibration operation of the current source or sink circuit 500. The circuit 500 includes a first transistor 516 and a second transistor 518 series-connected to the node 514 such that the reference current 512 adjusts the voltage at the node 514 to allow the reference current 512 to pass through the series-connected transistors 516, 518 during the calibration operation. The circuit 500 includes one or more storage devices 520 connected to the node 514. The circuit 500 includes an output transistor 522 connected to the node 514 to source or sink an output current (Iout) from current stored in the one or more storage devices 520 to a drive an active matrix display 102 with a bias current Ibias corresponding to the output current Iout. Various control lines controlled by the current source/sink control 122 and/or the controller 112 can be provided to control the timing and the sequence of the devices shown in FIG. 5*a*.

Figures 1, 5B:
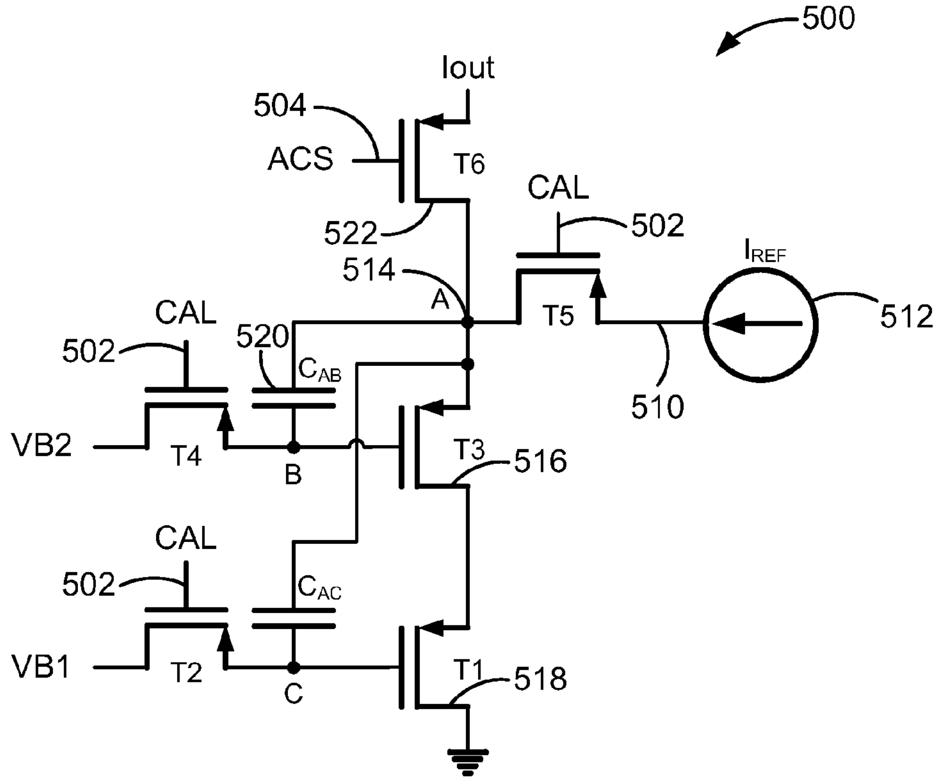

FIG. 5*b*-1 illustrates a circuit schematic of a current sink circuit 500' using only p-type TFTs. During the calibration cycle, the calibration control line CAL 502 is low and so the transistors T2, T4, and T5 are ON while the output transistor T6 522 is OFF. As a result, the current adjusts the voltage at node A (514) to allow all the current to pass through the first transistor T1 (516) and the second transistor T3 (518). After calibration, the calibration control line CAL 502 is high and the access control line ACS 504 is low (see the timing diagram of FIG. 5*b*-2). The output transistor T6 (522) turns ON and a negative polarity current is applied through the output transistor T6. The storage capacitor 520 (and the second capacitor $C_{AC}$) along with the source degenerate effect (between T1 and T3) preserves the copied current, providing very high output impedance. The access control line ACS 504 and the calibration control line CAL 502 can be controlled by the current source/sink control 122. The timing and duration of each of these control lines is clocked and whether the control line is active high or active low depends on whether the current sink/source circuit is p-type or n-type as is well understood by those of ordinary skill in the semiconductor field.

Figures 2, 5B:
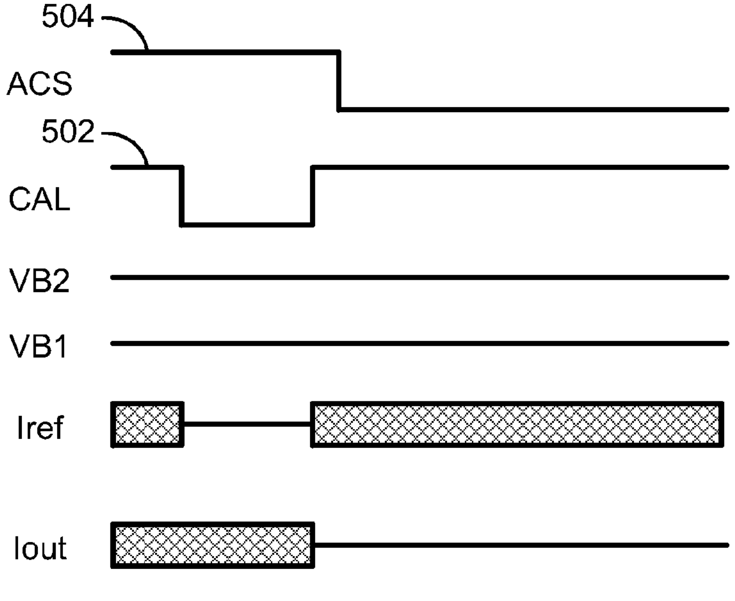

The timing diagram of FIG. 5*b*-2 illustrates a method of sourcing or sinking current to provide a bias current Ibias for programming pixels 104 of the light-emitting display 100 according to an aspect of the present disclosure. A calibration operation of the current source or sink circuit 500 is initiated by activating a calibration control line CAL to cause a reference current Iref to be supplied to the current source or sink circuit 500. In this example, CAL is active low because the transistors T2, T4, and T5 in the current sink circuit 500 are p-type. During the calibration operation, the current supplied by the reference current Iref is stored in one or more storage devices ($C_{AB}$ and $C_{AC}$) in the current source or sink circuit 500. The calibration control line CAL is deactivated while an access control line ACS is activated (active low because T6 in the circuit 500 is p-type) to cause sinking or sourcing of an output current Iout corresponding to the current stored in the capacitors $C_{AB}$ and $C_{AC}$. The output current is applied to a bias current line 132*a,b,n* for a column of pixels 104 in the active matrix area 102 of the light-emitting display 100. A first controllable bias voltage $V_{B1}$ and a second controllable bias voltage $V_{B2}$ are applied to the current source or sink circuit 500. The first bias voltage $V_{B1}$ differs from the second bias voltage $V_{B2}$ to allow the reference current Iref passing through T1 and T3 to be copied into the capacitors $C_{AB}$ and $C_{AC}$.

The current sink circuit 500' can be incorporated into the current source or sink circuit 120 shown in FIG. 1. The control lines ACS and CAL 502, 504 can be supplied by the current source control 122 or directly from the controller 112. Iout can correspond to the Ibias current supplied to one of the columns (k . . . n) shown in FIG. 1. It should be understood that the current sink circuit 500' would be reproduced n number of times for each column in the pixel array 102, so that if there are n columns of pixels, then there would be n number of current sink circuits 500', each sinking an Ibias current (via its Iout line) to the entire column of pixels.

The ACS control line 504 is connected to the gate of the output transistor T6. The source of T6 provides the bias current, labeled Iout in FIG. 5*b*-1. The drain of the output transistor T6 (522) is connected to the node A, which is also connected to the drain of T5. A reference current, Iref, is supplied to the source of T5.

The calibration control line CAL 502 is connected to the gates of T2, T4, and T5, to switch these TFTs ON or OFF simultaneously. The source of T4 is connected to the node B, which is also connected to the gate of T3. The source of T3 is connected to node A and to the drain of T5. A capacitor, $C_{AB}$, is connected across the nodes A and B, between the source of T4 and the drain of T5. The drain of T4 is connected to a second supply voltage, labeled VB2. The source of T2 is connected to a node C, which is also connected to the gate of T1. A capacitor, $C_{AC}$, is connected across the nodes A and C, between the source of T2 and the source of T3. The drain of T1 is connected to ground. The source of T1 is connected to the drain of T3. A first supply voltage, labeled VB1, is connected to the drain of T2.

The calibration of the current sink circuit 500 can occur during any phase except the programming phase. For example, while the pixels are in the emission cycle or phase, the current sink circuit 500 can be calibrated. The timing diagram of FIG. 5*b* is an example of how the current sink circuit 500 can be calibrated. As stated above, the ACS control line 504 is high when the calibration control line CAL 502 is activated to a low state, which turns the transistors T2, T4, and T5 ON. The current from Iref is stored in the storage capacitors, $C_{AB}$ and $C_{AC}$. The calibration control line CAL 502 is deactivated (transitions from low to high), and the ACS control line 504 is activated (high to low), allowing the copied current in the storage capacitors to apply a negative polarity current, Iout, through T6.

Figure 5C:
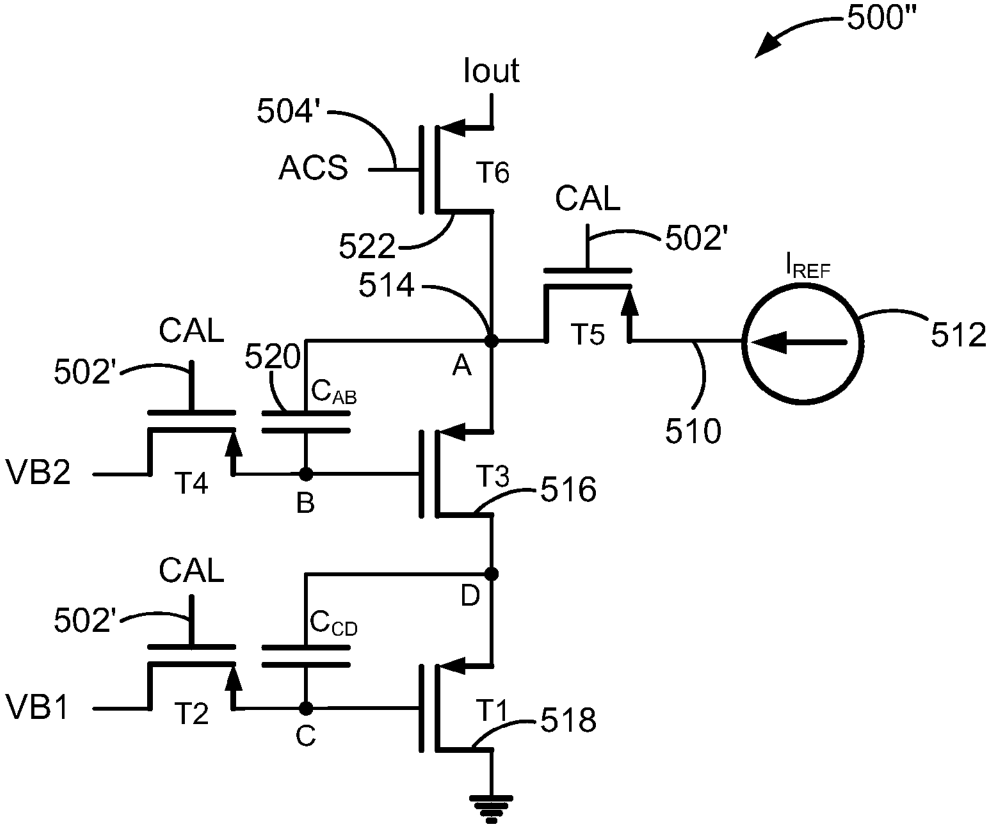
FIG. 5*c* is a variation of FIG. 5*b*-1 having a different capacitor configuration.

FIG. 5*c* is a variation of FIG. 5*b*-1 having a second capacitor connected across the second transistor T1 (518). In general, in FIG. 5*c*, the second capacitor labeled $C_{CD}$ is connected between nodes C and D instead of between nodes C and A as shown in FIG. 5*b*-1. The current sink circuit 500" shown in FIG. 5*c* features six p-type transistors, a calibration control line CAL 502' (active high), and an access control line ACS 504' (active high). The calibration control line 502' is connected to the gates of first and second voltage switching transistors T2 and T4 and the gate of an input transistor T5, and the access control line ACS 504' is connected to the gate of the output transistor T6 (522). In FIG. 5*c*, the gate of the second transistor T1 (518) is connected to the drain of the switching transistor T2, which is also connected to one plate of a first capacitor $C_{AB}$ (520). The other plate of the first capacitor C is connected to node A, which is connected to the drain of the input transistor T5, the drain of the output transistor T6, and the source of the first transistor T3 (516). The drain of the first transistor T3 (516) is connected to one plate of a second capacitor $C_{CD}$ at node D. The other plate of the second capacitor is connected to the gate of the second transistor T1 (518) and to the source of a second voltage switching transistor T2. The source of T1 is connected to the drain of T3, and the drain of T1 is connected to a ground potential VSS. The drain of a first voltage switching transistor T4 receives a first voltage VB1, and the drain of the second voltage switching transistor T2 receives a second voltage VB2. The source of T5 receives a reference current, Iref. The source of T6 supplies the output current in the form of a bias current, Ibias, to the column of pixels to which the circuit 800' is connected.

Figure 6:
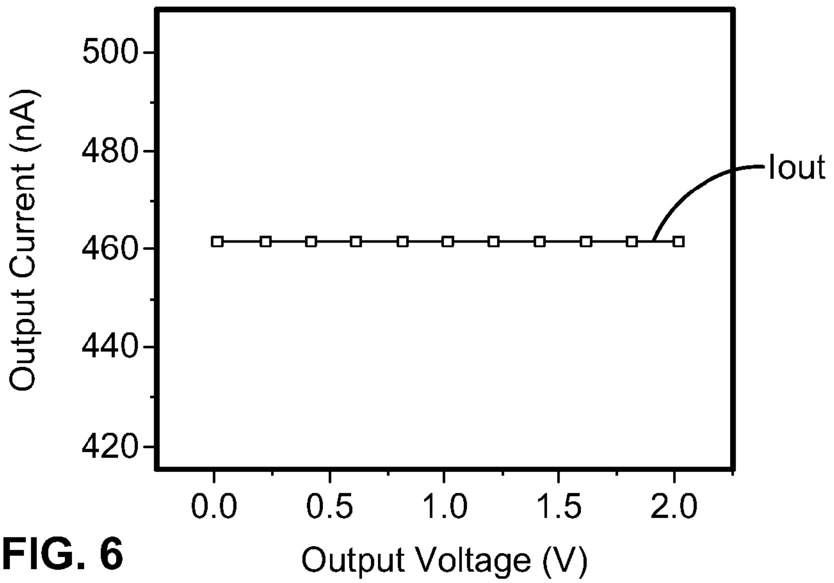
FIG. 6 illustrates a simulation result for the output current, Iout, of the current sink circuit shown in FIG. 5*b*-1 or 5*c* as a function of output voltage.

FIG. 6 illustrates a simulation result for the output current, Iout, of the current sink circuit 500 shown in FIG. 5*a* or 5*c* as a function of output voltage. Despite using p-type TFTs, the output current, Iout, is significantly stable despite changes in the output voltage.

Figure 7A:
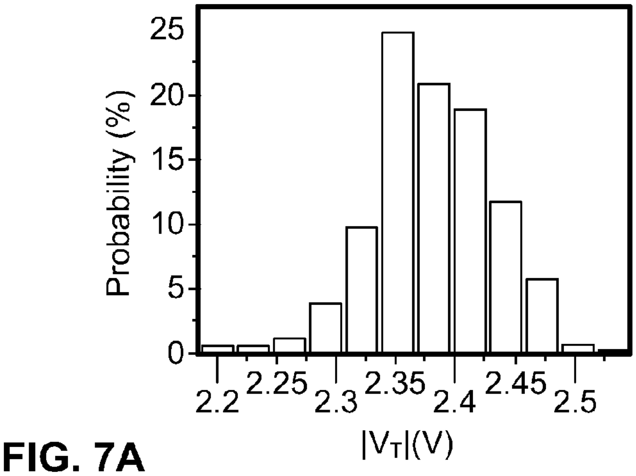
FIGS. 7*a* and 7*b* illustrate a parameter (threshold voltage, $V_T$, and mobility, respectively) variation in a typical poly-Si process.
Figure 7B:
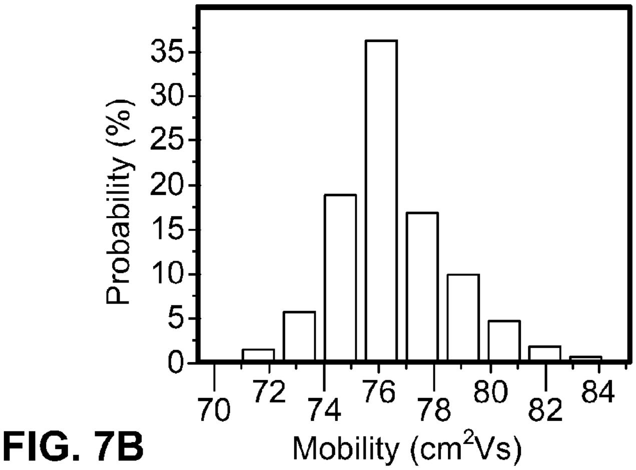
Figure 8:
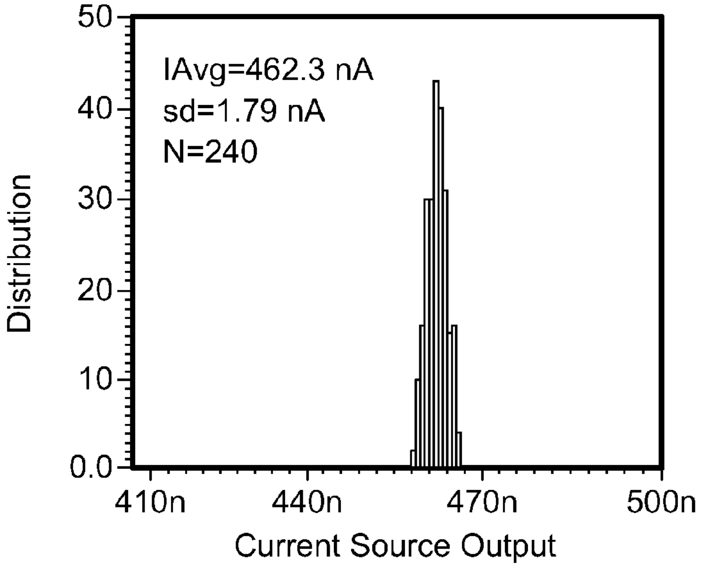
FIG. 8 highlights Monte Carlo simulation results for the current source output (Ibias)

In addition, the output current, Iout, is highly uniform despite the high level of non-uniformity in the backplanes (normally caused by process-induced effects). FIGS. 7*a* and 7*b* illustrate a parameter variation in a typical poly-Si process, which is used for the simulation and analysis results shown in FIG. 7*a*. FIG. 8 highlights the Monte Carlo simulation results for the output current Iout (corresponding to Ibias). In this simulation, over 12% variation in mobility and 30% variation in the threshold voltage ($V_T$) is considered; however, the variation in the output current Iout of the current sink circuit 500 is less than 1%.

Figure 9A:
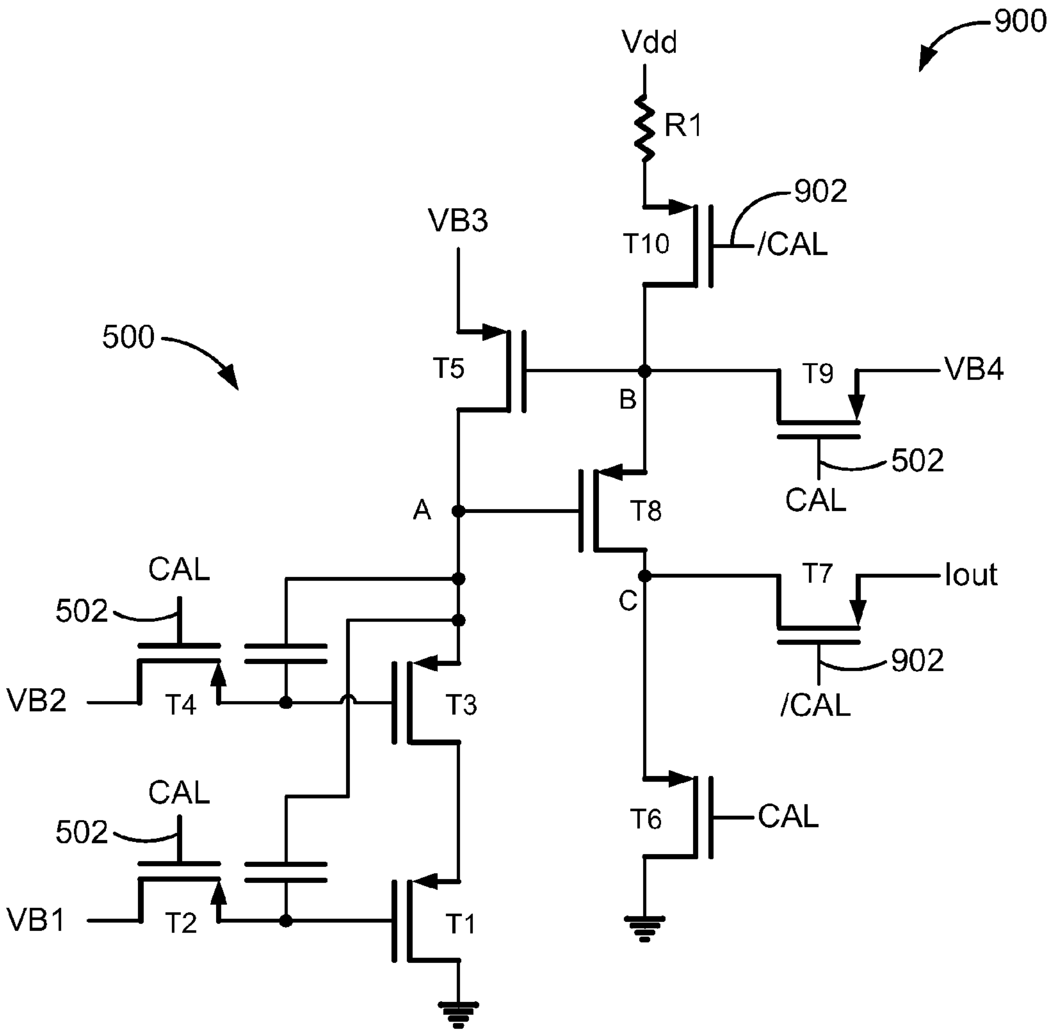
FIG. 9*a* illustrates the use of the current sink circuit (such as shown in FIG. 5*b*-1 or 5*c*) in a voltage-to-current converter circuit.
Figure 9B:
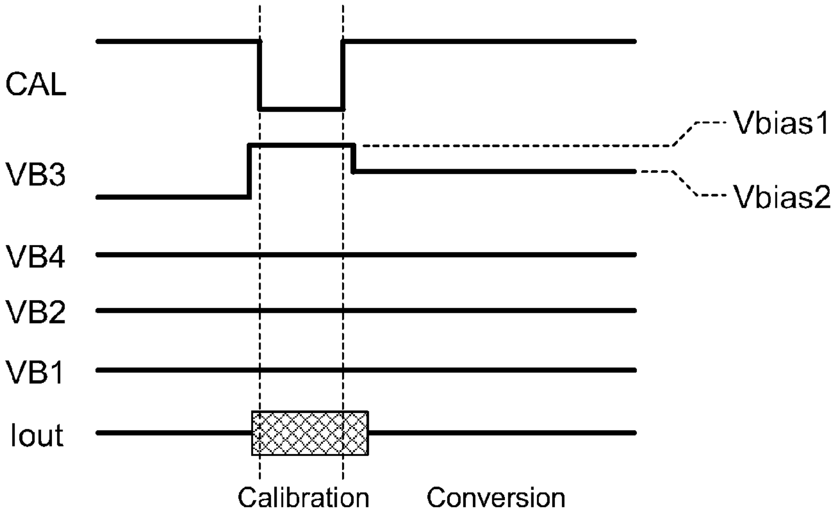
FIG. 9*b* illustrates a timing diagram for the voltage-to-current converter circuit shown in FIG. 9*a;*

The current source/sink circuits shown in FIGS. 5*a* and 5*c* can be used to develop more complex circuit and system blocks. FIG. 9*a* illustrates the use of the current sink circuit 500 in a voltage-to-current converter circuit 900 and a corresponding exemplary timing diagram is illustrated in FIG. 9*b*. Although the current sink circuit 500 is shown in the voltage-to-current converter circuit 900 in FIG. 9*a*, the current sink circuit 800 can be used in an alternate configuration. The voltage-to-current converter circuit 900 provides a current source or sink for a light-emitting display 100. The circuit 900 includes a current sink or source circuit 500, which includes a controllable bias voltage transistor T5 having a first terminal (source) connected to a controllable bias voltage $V_{B3}$ and a second terminal connected (drain) to a first node A in the current sink or source circuit 500. The gate of the controllable bias voltage transistor T5 is connected to a second node B. A control transistor T8 is connected between the first node A, the second node B, and a third node C. A fixed bias voltage $V_{B4}$ is connected through a bias voltage transistor T9 to the second node B. An output transistor T7 is connected to the third node C and sinks an output current Tout as a bias current Ibias to drive a column of pixels 104 of an active matrix area 102 of the light-emitting display 100.

The current sink or source circuit 500 includes a first transistor T3 series-connected to a second transistor T2. The first transistor T3 is connected to the first node A such that current passing through the controllable bias voltage transistor T5, the first transistor T3, and the second transistor T1 is adjusted to allow the second node B to build up to the fixed bias voltage $V_{B4}$. The output current Tout is correlated to the controllable bias voltage $V_{B3}$ and the fixed bias voltage $V_{B4}$.

A source of the controllable bias voltage transistor T5 is connected to the controllable bias voltage $V_{B3}$. A gate of the controllable bias voltage transistor T5 is connected to the second node B. A drain of the controllable bias voltage transistor T5 is connected to the first node A. A source of the control transistor T8 is connected to the second node B. A gate of the control transistor T8 is connected to the first node A. A drain of the control transistor T8 is connected to the third node C. A source of the bias voltage transistor T9 is connected to the fixed bias voltage $V_{B4}$. A drain of the supply voltage transistor T10 is connected to the second node B. A gate of the bias voltage transistor T9 is connected to a calibration control line CAL, which is controlled by a controller 122, 112, 114 of the light-emitting display 100. A source of the output transistor T7 is connected to a current bias line 132*a,b,n* carrying the bias current Ibias. A drain of the output transistor T7 is connected to the third node C. A gate of the output transistor T7 is coupled to the calibration control line CAL such that when the calibration control line CAL is active low, the gate of the output transistor is active high (/CAL).

During the calibration operation, the calibration control line CAL 502 is low (see FIG. 9*b*), and a fixed bias voltage, labeled $V_{B4}$, is applied to node B. Here, the current of the T1-T3-T5 branch is adjusted to allow $V_{B4}$ at node B (see FIG. 9*b*). As a result, a current correlated to the controllable bias voltage $V_{B3}$ and to the fixed bias voltage $V_{B4}$ will pass through Tout.

A /CAL control line 902 is also shown, which is the inverse of the CAL control line 502 and may be tied to the same line through an inverter (i.e., when CAL is active low, /CAL is active high). The calibration control line CAL 502 is connected to the gates of calibration control transistors T2, T4, and T6. The /CAL control line 902 is connected to the gates of an output transistor T7 and a supply voltage transistor T10. The fixed bias voltage $V_{B4}$ is applied to the source of a bias voltage transistor T9, whose drain is connected to node B, which is also connected to the gate of a controllable bias voltage transistor T5. A controllable bias voltage $V_{B3}$ is applied to the source of the controllable bias voltage transistor T5, and the drain of the controllable bias voltage transistor T5 is connected to node A, which is also connected to the gate of a control transistor T8 and the source of the first transistor T3 of the current sink circuit 500. The source of the supply voltage transistor T10 is connected through a resistor R1 to a supply voltage, Vdd. The drain of the supply voltage T10 is connected to node B, which is also connected to the source of the control transistor T8. The drain of the control transistor T8 is connected to node C, which is also connected to the drain of the output transistor T7. The source of the output transistor T7 produces the output current, Tout. The source of the calibration control transistor T6 is connected to node C and the drain of the calibration control transistor T6 is connected to ground. A first capacitor is connected between the source of T4 and the source of T3 of the current sink circuit 500. The source of T4 is connected to the gate of T3 of the current sink circuit 500. A second capacitor is connected between the gate of T1 and the source of T3 of the current sink circuit 500. The gate of T1 is also connected to the source of T2 of the current sink circuit 500. The drain of T2 is connected to a first controllable bias voltage, $V_{B1}$, and the drain of T4 is connected to a second controllable bias voltage, $V_{B2}$, of the current sink circuit 500.

FIG. 9*b* illustrates a timing diagram of a method of calibrating a current source or sink circuit 500 for a light-emitting display 100 using a voltage-to-current converter 900 to calibrate an output current, Iout. The timing diagram of 9*b* shows that the calibration cycle, which can be carried out following a programming cycle, for example during an emission cycle or operation, starts when the calibration control line CAL 502 is asserted low (active low). The controllable bias voltage VB3 is adjusted, such as by the current source/sink control circuit 122, the controller 112, or the supply voltage control 114 (see FIG. 1), to a first bias voltage level (Vbias 1) during the calibration cycle. The Tref current is copied and stored into the storage capacitors, such that when the calibration control line CAL 502 is de-asserted (low to high), the Tout current is stable across a range of output voltages. Following the calibration cycle during the conversion cycle, the controllable bias voltage $V_{B3}$ is lowered to a second bias voltage level, Vbias2. A method for carrying out the timing operation for calibrating the current source or sink circuit 500 of the voltage-to-current converter includes activating a calibration control line CAL to initiate a calibration operation of the current source or sink circuit 500. Then, the method includes adjusting a controllable bias voltage $V_{B3}$ supplied to the current source or sink circuit 500 to a first bias voltage Vbias1 to cause current to flow through the current source or sink circuit 500 to allow a fixed bias voltage $V_{B4}$ to be present at a node B in the voltage-to-current converter 900. The method includes deactivating the calibration control line CAL to initiate a programming operation of pixels in an active matrix area 102 of the light-emitting display 100. After initiating the programming operation, the output current correlated to the controllable bias voltage and the fixed bias voltage is sourced or sunk to a bias current line 132 that supplies the output current Tout (Ibias) to a column of pixels 104 in the active matrix area 102.

During the calibration operation, the current flowing through the current source or sink circuit as determined by the fixed bias voltage is stored in one or more capacitors 520 of the current source or sink circuit 500 until the calibration control line CAL is deactivated. After deactivating the calibration control line CAL, the controllable bias voltage $V_{B3}$ is lowered from the first bias voltage Vbias 1 to a second bias voltage Vbias2 that is lower than the first bias voltage Vbias 1.

Figure 10A:
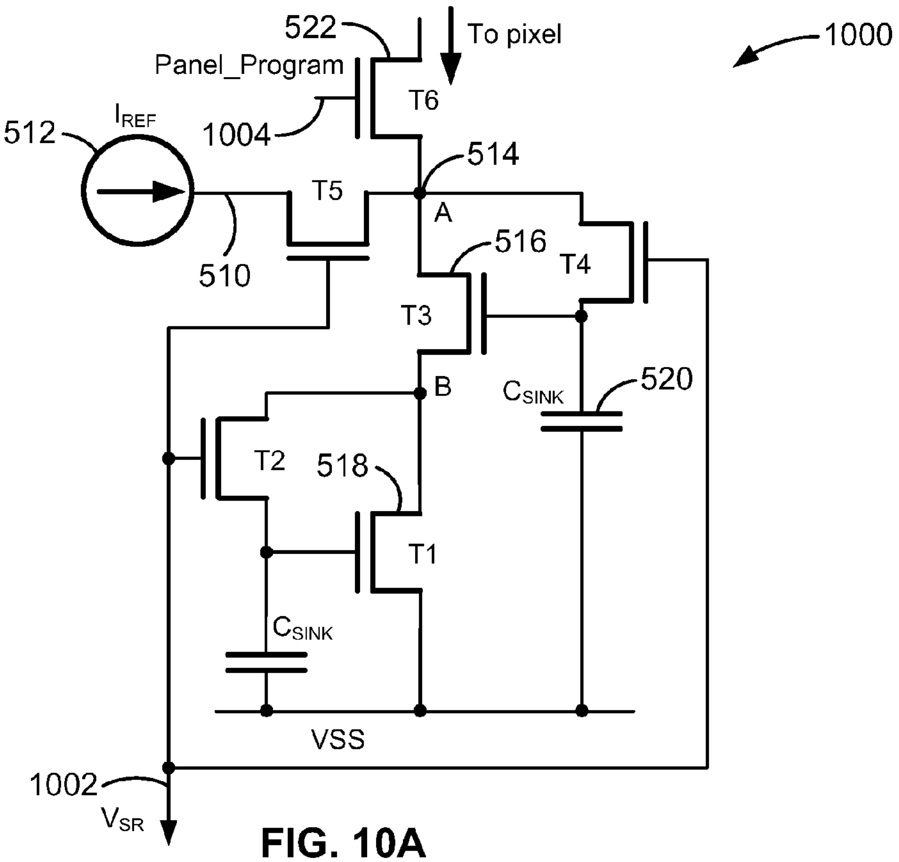
FIG. 10*a* illustrates illustrate an N-FET based cascade current sink circuit that is a variation of the current sink circuit shown in FIG. 5*b*-1.
Figure 10B:
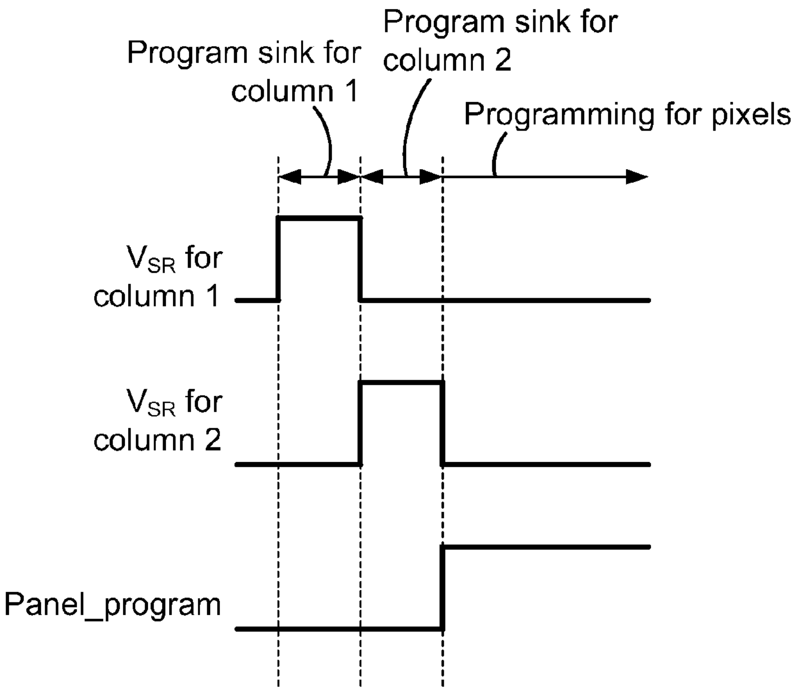
FIG. 10*b* is a timing diagram for two calibration cycles of the circuit shown in FIG. 10*a;*

FIGS. 10*a* and 10*b* illustrate an N-FET based current sink circuit that is a variation of the current sink circuit 500 shown in FIG. 5*b*-1 (which uses p-type TFTs) and a corresponding operation timing diagram. The current sink circuit 1000 features five TFTs (labeled T1 through T5) and two capacitors $C_{SINK}$ and is activated by a gate control signal line ($V_{SR}$) 1002, which can also be called a calibration control line (like CAL in FIG. 5*b*-1). Both the gate control signal line ($V_{SR}$) 1002 and the reference current Iref can be generated by circuitry external to the current sink circuit 1000 or integrated with the current sink circuitry 1000, while the path labeled "To pixel" connects to the column (k . . . n) of pixels to be programmed.

During a calibration operation in which the current sink circuit 1000 is calibrated, $V_{SR}$ is clocked active. The transistors T2 and T4 are turned ON, allowing Iref to flow through T1 and T3 in diode-connected fashion. Both capacitors $C_{SINK}$ are charged to their respective potential at the gate of T1 and T3 in order to sustain the current flow of Iref.

The diode-connected configuration of both the T1 and T3 TFTs during the calibration phase allows the gate potential to follow their respective device threshold voltage and mobility. These device parameters are in effect programmed into the $C_{SINK}$, allowing the circuit to self-adjust to any variation in the aforementioned device parameters (threshold voltage $V_T$ or mobility). This forms the basis of an in-situ compensation scheme.

The reference current Iref can be shared by all the current source/sink instances (note that there will be one current source or sink for each column of the pixel array 102) provided that only one such circuit is turned ON at any moment in time. FIG. 10*b* illustrates an exemplary operation of two such instances of the current sink circuit 1000. Adjacent $V_{SR}$ pulses for adjacent columns are coincidental, and Iref is channeled from one current source/sink block in one column to the next current source/sink block in the next column.

Activation occurs by clocking $V_{SR}$ non-active, turning T2 and T4 OFF. The potential at $C_{SINK}$ drives T1 and T3 to supply the output current to the pixels in the column when T5 is turned ON through the panel_program control line 1004 (also referred to as an access control line), which can be supplied by the current source/sink control 122 or by the controller 112. The circuit 1000 shown in FIG. 10*a* is of a cascade current source/sink configuration. This configuration is employed to facilitate a higher output impedance as seen from T5, thus enabling a better immunity to voltage fluctuations.

The $V_{SR}$ control line 1002 is connected to the gates of T2, T4, and T5. The reference current Iref is received by the drain of T5. The panel_program control line 1004 is connected to the gate of T6. The source of T1 is connected to a ground potential VSS. The gate of T1 is connected to one plate of a capacitor $C_{SINK}$, the other plate being connected to VSS. The drain of T1 is connected to the source of T3, which is also connected to the drain of T2. The source of T2 is connected to the gate of T1 and to the plate of the capacitor $C_{SINK}$. The gate of T3 is connected to the source of T4 and to one plate of the second capacitor $C_{SINK}$, the other plate being connected to VSS. The drain of T3 is connected to the sources of T5 and T6. The drain of T4 is connected to the sources of T5 and T6, which are connected together at node A. The drain of T6 is connected to one of the current bias lines 132 to supply the bias current Ibias to one of the columns of pixels.

The timing diagram in FIG. 10*b* illustrates a method of calibrating current source or sink circuits (e.g., like the circuit 500, 500', 500", 900, 1000, 1100, 1200, 1300) that supply a bias current Ibias on bias current lines 132*a,b,n* to columns of pixels 104 in an active matrix area 102 of a light-emitting display 100. During a calibration operation of the current source or sink circuits in the light-emitting display 100, a first gate control signal line (CAL or $V_{SR}$) to a first current source or sink circuit (e.g., 500, 500', 500", 900, 1000, 1100, 1200, 1300) for a first column of pixels (132*a*) in the active matrix area 102 is activated (e.g., active low for p-type switches as in FIG. 11*b* and active high for n-type as in FIG. 10*b* or 13*b*) to calibrate the first current source or sink circuit with a bias current Ibias that is stored in one or more storage devices 520 (e.g., $C_{SINK}$) of the first current source or sink circuit during the calibration operation. Responsive to calibrating the first current source or sink circuit, the first gate control signal line for the first column 132*a* is deactivated. During the calibration operation, a second gate control signal line (e.g., $V_{SR}$ or CAL for column 2 132*b*) to a second current source or sink circuit (e.g., 500, 500', 500", 900, 1000, 1100, 1200, 1300) for a second column of pixels 132*b* in the active matrix area 102 is activated to calibrate the second current source or sink circuit with a bias current Ibias that is stored in one or more storage devices 520 of the second current source or sink circuit during the calibration operation. Responsive to calibrating the second current source or sink circuit, the second gate control signal line is deactivated. Responsive to all of the current source or sink circuits for every column being calibrated during the calibration operation, a programming operation of the pixels 104 of the active matrix area 102 is initiated and an access control line (ACS or panel_program) is activated to cause the bias current stored in the corresponding one or more storage devices 502 in each of the current source or sink circuits to be applied to each of the columns of pixels 132*a,b,n* in the active matrix area 102.

Figure 11A:
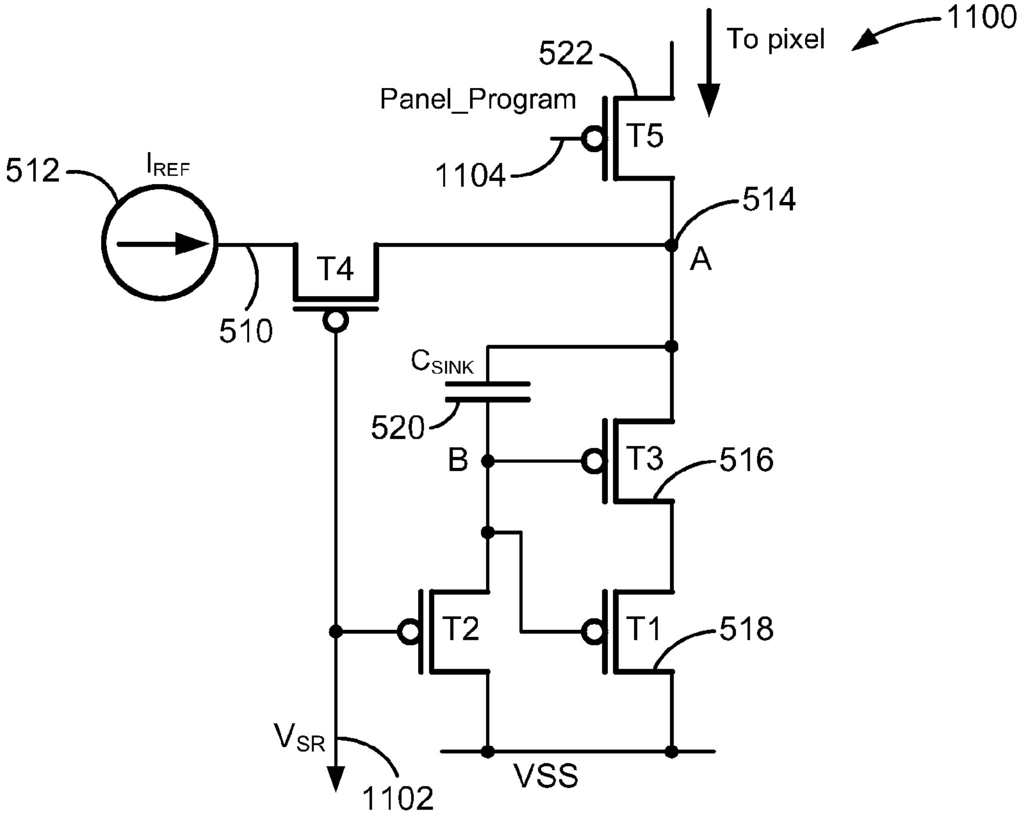
FIG. 11*a* illustrates a cascade current source/sink circuit during activation of the calibration operation.
Figure 11B:
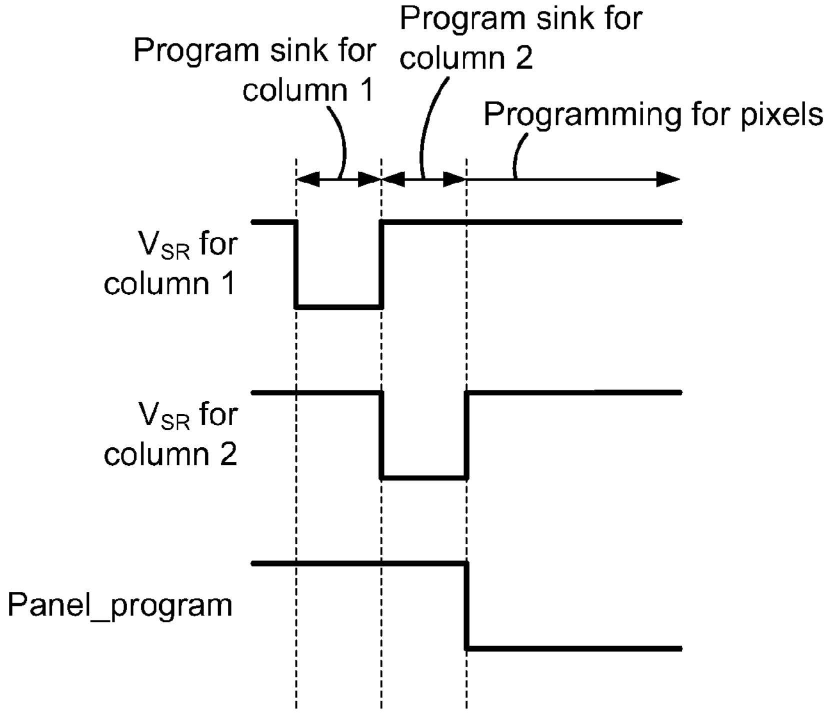
FIG. 11*b* illustrates the operation of calibration of two instances (i.e., for two columns of pixels) of the circuit shown in FIG. 11*a;*

FIGS. 11*a* and 11*b* illustrate a P-FET based current sink circuit 1100 and a corresponding timing diagram for an example calibration operation. This circuit 1100 is an extension to the N-FET based current sink/source 1000 shown in FIG. 10*a* but is implemented in P-FETs instead of N-FETs. The operation is outlined as follows. To program or calibrate the circuit 1100, a $V_{SR}$ control line 1102 is clocked active. The transistors T2 and T4 are turned ON, allowing Iref to flow through T1 and T3 in diode-connected fashion. T2's conduction path pulls the gate potential of T1 and T3 near VSS, while allowing the capacitor $C_{SINK}$ to charge. As a result, the common source/drain node between T3 and T4 is raised to a potential such that the current flow of Iref is sustained.

The $V_{SR}$ control line 1102 is connected to the gates of T2 and T4. The drains of T1 and T2 are connected to a ground potential VSS. The panel_program control line 1104 is connected to the gate of T5. The source of T5 provides the output current, which is applied to the column of pixels as a bias current, Ibias. The gate of T1 is connected to node B, which is also connected to the source of T2, the gate of T3, and one plate of the capacitor $C_{SINK}$. The other plate of the capacitor is connected to node A, which is connected to the source of T3, the drain of T4, and the drain of T5. A reference current Iref is applied to the source of T4.

This operating method during the calibration phase or operation allows the gate-source potential of T3 to be programmed as a function of its respective device threshold voltage and mobility. These device parameters are in effect programmed into the $C_{SINK}$, allowing the circuit 1100 to self-adjust to any variation in these parameters.

The reference current Iref can be shared by all the current source/sink instances (one for each column in the pixel array 102) provided only one such circuit is turned ON at any moment in time. FIG. 11*b* illustrates the operation of two such instances (i.e., for two columns of pixels) of the circuit 1100. Adjacent $V_{SR}$ pulses are coincidental, and Iref is channeled from one current source/sink block (for one column) to another block (for an adjacent column).

Activation of a pixel programming operation following calibration proceeds as follows. The $V_{SR}$ control line 1102 is clocked non-active; T2 and T4 are hence turned OFF. The panel_program control line 1104 is clocked active to allow T5 to be turned ON. The charge stored inside $C_{SINK}$ from the calibration operation is retained because T2 is OFF, allowing the gate-source voltage of both T1 and T3 to adjust and sustain the programmed current Iref to flow through T5.

The circuit 1100 shown in FIG. 11*a* is of a cascade current source/sink configuration during activation of the calibration operation. The potential across $C_{SINK}$ imposes a gate-source potential across T3, meanwhile applying the gate potential to T2. The common drain/source node of T1 and T3 will adjust to provide the current flow entailed by T3. This technique is employed to facilitate a higher output impedance as seen from T5, thus enabling a better immunity to voltage fluctuations.

CMOS Current Sink with DC Voltage Programming

Figure 12:
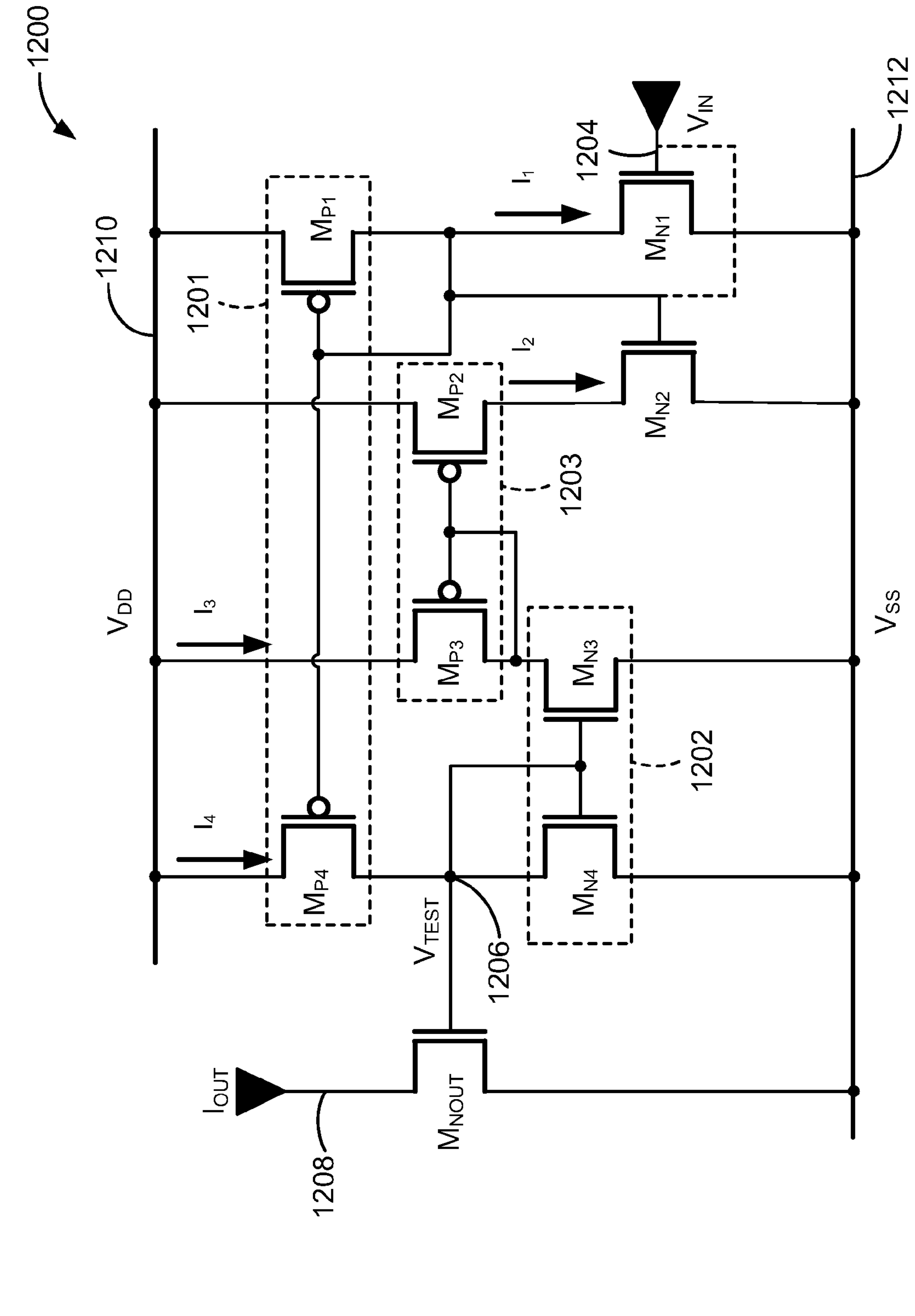
FIG. 12 illustrates a CMOS current sink/source circuit 1200 that utilizes DC voltage programming.

FIG. 12 illustrates a CMOS current sink/source circuit 1200 that utilizes DC voltage programming. Contrary to the current sink/source circuits disclosed above, this circuit 1200 does not require any external clocking or current reference signals. Only a voltage bias $V_{IN}$ and supply voltages (VDD and VSS) are required. This circuit 1200 eliminates the need for any clocks and associated periphery circuitry, allowing it to be compatible with a wider range of on-panel integration configuration.

The circuit 1200 relies on an elegant current-mirroring technique to suppress the influence of device parameter variation (e.g., variations in TFT voltage threshold $V_T$ and mobility). The circuit 1200 generally features eight TFTs (labeled M with a subscript N to indicate n-type and a subscript P to indicate p-type), which form a current mirror 1204 to generate a stable potential at node $V_{TEST}$ and this node is subsequently used to drive an output TFT $M_{NOUT}$ to supply the current $I_{OUT}$, corresponding to a bias current Ibias supplied to one of the columns of pixels in the pixel array 102. It is noted that multiple output TFTs can be incorporated that shares $V_{TEST}$ as the gate potential. The size or aspect ratio of such output TFTs can be varied to supply a different $I_{OUT}$ magnitude. In applications such as AMOLED displays where a column typically includes three or more sub-pixels (red, green, and blue), only one instance of this design needs to be present to driver three or more output TFTs.

The DC voltage-programmed current sink circuit 1200 includes a bias voltage input 1204 receiving a controllable bias voltage $V_{IN}$. The circuit 1200 includes an input transistor $M_{N1}$ connected to the controllable bias voltage input 1204 $V_{IN}$. The circuit 1200 includes a first current mirror 1201, a second current minor 1202, and a third current mirror 1203. The first current mirror 1201 includes a pair of gate-connected p-type transistors (i.e., their gates are connected together) $M_{P1}$, $M_{P4}$. The second current mirror 1202 includes a pair of gate-connected n-type transistors $M_{N3}$, $M_{N4}$. The third current minor 1203 includes a pair of gate-connected p-type transistors $M_{P2}$, $M_{P3}$. The current mirrors 1201, 1202, 1203 are arranged such that an initial current $I_1$ created by a gate-source bias of the input transistor $M_{N1}$ and copied by the first current minor 1201 is reflected in the second current mirror 1202, current copied by the second current minor 1202 is reflected in the third current mirror 1203, and current copied by the third current minor 1203 is applied to the first current minor 1201 to create a static current flow in the current sink circuit 1200.

The circuit 1200 includes an output transistor $M_{NOUT}$ connected to a node 1206 ($V_{TEST}$) between the first current mirror 1201 and the second current minor 1202 and biased by the static current flow to provide an output current $I_{OUT}$ on an output line 1208. The gate-source bias (i.e., the bias across the gate and source terminals) of the input transistor $M_{N1}$ is created by the controllable bias voltage input $V_{IN}$ and a ground potential $V_{SS}$. The first current mirror and the third current minor are connected to a supply voltage $V_{DD}$.

The circuit includes an n-type feedback transistor $M_{N2}$ connected to the third current minor 1203. A gate of the feedback transistor $M_{N2}$ is connected to a terminal (e.g., a drain) of the input transistor $M_{N1}$. Alternately, a gate of the feedback transistor is connected to the controllable bias voltage input 1204. The circuit 1200 preferably lacks any external clocking or current reference signals. Preferably, the only voltage sources are provided by the controllable bias voltage input $V_{IN}$, a supply voltage $V_{DD}$, and a ground potential $V_{SS}$ and no external control lines are connected to the circuit 1200.

The operation of this circuit 1200 is described as follows. The applied voltage bias $V_{IN}$ to a voltage bias input 1202 and $V_{SS}$ sets up the gate-source bias for $M_{N1}$ leading to a current $I_1$ to be established. The composite current minor setup by $M_{P1}$ and $M_{P4}$ reflects the currents $I_1$ to $I_4$. Likewise, the composite current minor setup by $M_{N4}$ and $M_{N3}$ reflects the currents $I_1$ to $I_3$. The composite current mirror setup by $M_{P3}$ and $M_{P2}$ reflects the currents $I_3$ to $I_2$. The gate of $M_{N2}$ is connected to the gate of $M_{P1}$.

The entire current-mirroring configuration forms a feedback loop that translates the currents $I_1$ to $I_1$, $I_1$ to $I_3$, $I_3$ to $I_2$, and $I_2$ closes the feedback loop back to $I_1$. As an intuitive extension of the aforementioned configuration, the gate of $M_{N2}$ can also be connected to $V_{IN}$, and the same feedback loop method of compensating for threshold voltage and mobility is in effect.

All TFTs are designed to work in the saturation region, and $M_{N4}$ is made larger than the rest of the TFTs to minimize the influence of its variations in threshold voltage and mobility on the output current $I_{OUT}$.

This configuration requires static current flow ($I_1$ to $I_4$) to bias the output TFT $M_{NOUT}$. It is thus advisable to power down the supply voltage $V_{DD}$ when $I_{OUT}$ is not required for power consumption control.

The circuit 1200 is configured as follows. As mentioned above, the subscript N indicates that the transistor is n-type, and the subscript P indicates that the transistor is p-type for this CMOS circuit. The sources of $M_{NOUT}$, $M_{N4}$, $M_{N3}$, $M_{N2}$, and $M_{N1}$ are connected to a ground potential $V_{SS}$. The drain of $M_{NOUT}$ produces the output current $I_{OUT}$ in the form of a bias current Ibias that is supplied to one of the n columns of pixels in the pixel array 102 during pixel programming. The gate of $M_{N1}$ receives a controllable bias voltage $V_{IN}$. The sources of $M_{IN}$, $M_{P2}$, $M_{P3}$, and $M_{P4}$ are connected to a supply voltage $V_{DD}$. The gate of $M_{NOUT}$ is connected to the $V_{TEST}$ node, which is also connected to the drain of $M_{P4}$, the gate of $M_{N3}$, and the drain of $M_{N4}$. The gate of $M_{N4}$ is connected to the gate of $M_{N3}$. The drain of $M_{N3}$ is connected to the drain of $M_{P3}$ and to the gate of $M_{P3}$, which is also connected to the gate of $M_{P2}$. The drain of $M_{P2}$ is connected to the drain of $M_{N2}$, and the gate of $M_{N2}$ is connected to the gate of $M_{P1}$ and to the drain of $M_{P1}$, which is also connected to the drain of $M_{N1}$. The gate and drain of $M_{P3}$ are tied together, as are the gate and drain of $M_{P1}$.

CMOS Current Sink with AC Voltage Programming

Figure 13A:
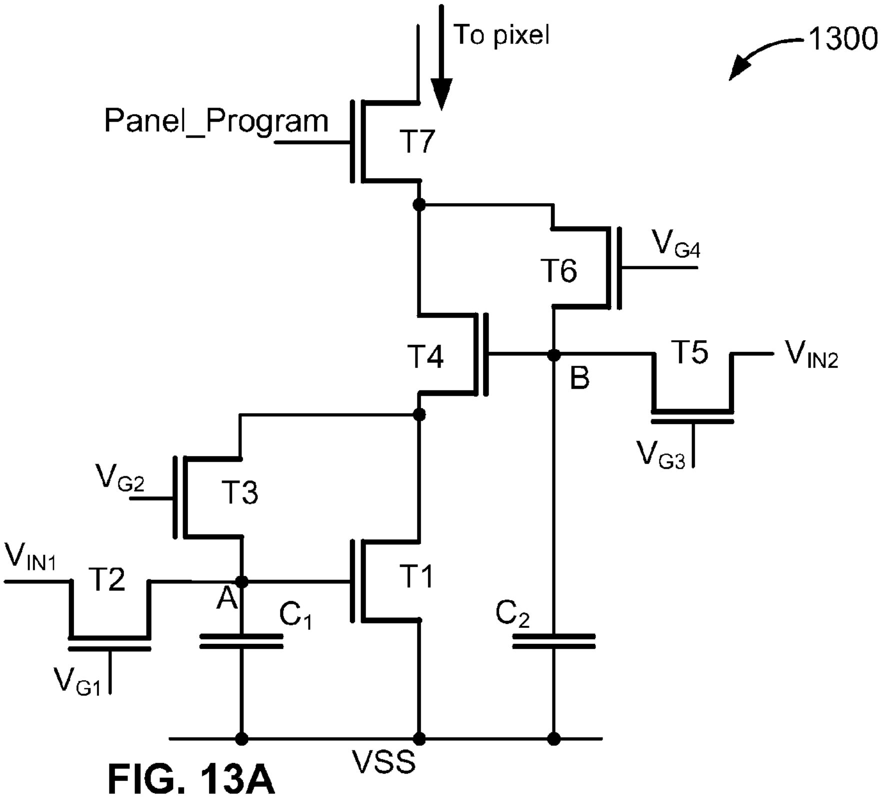
FIG. 13*a* illustrates a CMOS current sink circuit with AC voltage programming.
Figure 13B:
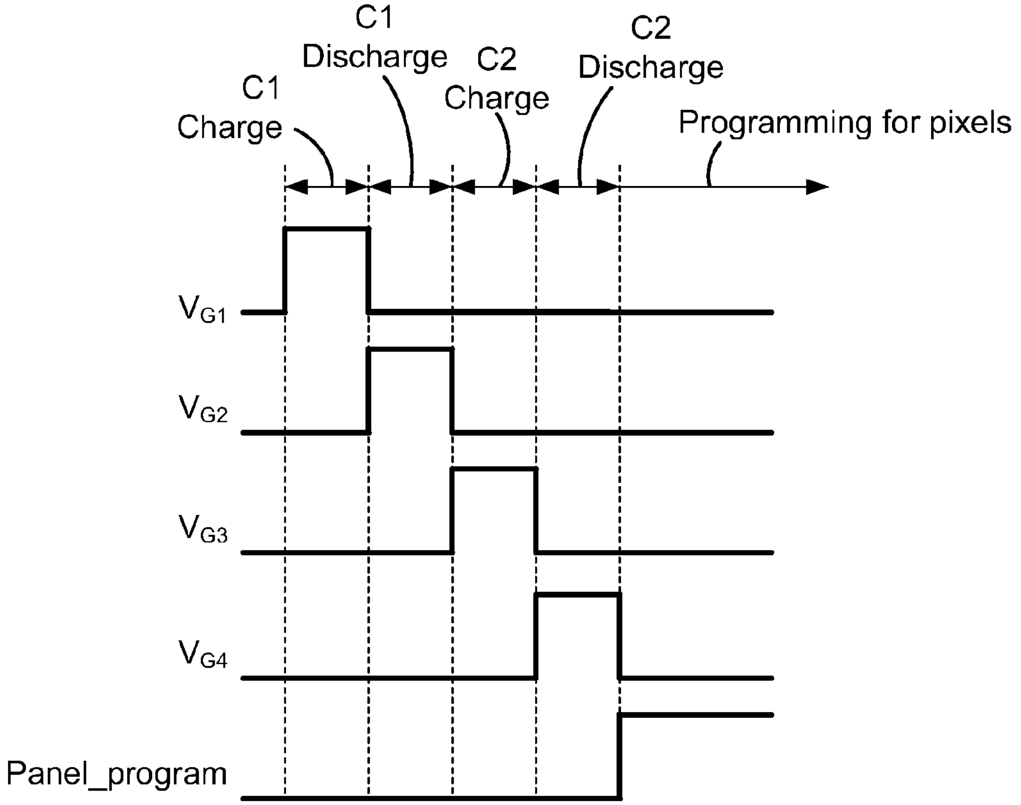
FIG. 13*b* is an operation timing diagram for calibrating the circuit shown in FIG. 13*a;*

FIGS. 13*a* and 13*b* illustrate a CMOS current sink circuit 1300 with alternating current (AC) voltage programming and a corresponding operation timing diagram for calibrating the circuit 1300. Central to this design is the charging and discharging of the two capacitors, C1 and C2. The interconnecting TFTs require four clocking signals, namely $V_{G1}$, $V_{G2}$, $V_{G3}$ and $V_{G4}$, to program the two capacitors. These clocking signals can be supplied by the current source/sink circuit 122 or by the controller 112.

The clocking signals $V_{G1}$, $V_{G2}$, $V_{G3}$, $V_{G4}$ are applied to the gates of T2, T3, T5, and T6, respectively. T2, T3, T5, and T6 can be n-type or p-type TFTs, and the clocking activation scheme (high to low or low to high) is modified accordingly. To make the discussion generic to both n- and p-type TFTs, each transistor will be described as having a gate, a first terminal, and a second terminal, where, depending on the type, the first terminal can be the source or drain and the second terminal can be the drain or source. A first controllable bias voltage $V_{IN1}$ is applied to the first terminal of T2. The second terminal of T2 is connected to a node A, which is also connected to a gate of T1, a second terminal of T3, and one plate of a first capacitor C1. The other plate of the first capacitor C1 is connected to a ground potential $V_{SS}$. The second terminal of T1 is also connected to $V_{SS}$. The first terminal of T1 is connected to a first terminal of T3, which is also connected to a second terminal of T4. The gate of T4 is connected to a second node B, which is also connected to a second terminal of T6, a first terminal of T5, and to one plate of a second capacitor C2. The other plate of the second capacitor is connected to $V_{SS}$. A second controllable bias voltage $V_{IN2}$ is applied to the second terminal T5. The first terminal of T6 is connected to the first terminal of T4, which is also connected to the second terminal of T7. A panel_program control line is connected to the gate of T7, and the first terminal of T7 applies an output current in the form of Ibias to one of the columns of pixels in the pixel array 102. The second plate of C1 and C2 respectively can be connected to a controllable bias voltage (e.g., controlled by the supply voltage control circuit 114 and/or the controller 112) instead of to a reference potential.

An exemplary operation of the circuit 1300 is described next. The clocking signals $V_{G1}$, $V_{G2}$, $V_{G3}$ and $V_{G4}$ are four sequential coincidental clocks that turn active one after the other (see FIG. 13*b*). First, $V_{G1}$ is active, allowing T2 to turn ON. The capacitor C1 is charged nominally to $V_{IN1}$ via T2. The next clock signal $V_{G2}$ becomes active afterwards, and T3 is turned ON. T1 is then in a diode-connected configuration with a conduction path for C1 to discharge through T3. The duration of such discharge period is kept short; hence the final voltage across C1 is determined by the device threshold voltage and mobility of T1. In other words, the discharge process associates the programmed potential across C1 with the device parameters, achieving the compensation. Subsequently, the other capacitor C2 is charged and discharged similarly by the clocked activation of $V_{G3}$ and $V_{G4}$, respectively.

The two-capacitor configuration shown in the circuit 1300 is used to increase the output impedance of such design to allow higher immunity to output voltage fluctuations. In addition to the insensitivity to device parameters, this circuit 1300 consumes very low power due to the AC driving nature. There is no static current draw which aids in the adoption of this circuit 1300 for ultra low-power devices, such as mobile electronics.

The AC voltage-programmed current sink circuit 1300 includes four switching transistors T2, T3, T5, and T6 that each receiving a clocking signal ($V_{G1}$, $V_{G2}$, $V_{G3}$, $V_{G4}$) that is activated in an ordered sequence, one after the other (see FIG. 13*b*). The first capacitor $C_1$ is charged during a calibration operation by the activation of the first clocked signal $V_{G1}$ and discharged by the activation of the second clocked signal $V_{G2}$ following the activation and deactivation of the first clocked signal $V_{G1}$. The first capacitor $C_1$ is connected to the first T2 and second switching transistors T3. A second capacitor C2 is charged during the calibration operation by the activation of the third clocked signal $V_{G3}$ and discharged by the activation of the fourth clocked signal $V_{G4}$ following the activation and deactivation of the third clocked signal $V_{G3}$ (see FIG. 13*b*). The second capacitor C2 is connected to the third and fourth switching transistors T5 and T6. An output transistor T7 is connected to the fourth switching transistor T6 to sink, during a programming operation subsequent to the calibration operation, an output current Iout derived from current stored in the first capacitor $C_1$ during the calibration operation. As shown in the example of FIG. 13*a*, the four switching transistors T2, T3, T5, T6 are n-type. The circuit 1300 includes a first conducting transistor T1 connected to the second switching transistor T3 to provide a conduction path for the first capacitor C1 to discharge through the second switching transistor T3. A voltage across the first capacitor C1 following the charging of the first capacitor C1 is a function of a threshold voltage and mobility of the first conducting transistor T3. The circuit 1300 includes a second conducting transistor T4 connected to the fourth switching transistor T6 to provide a conduction path for the second capacitor C2 to discharge through the fourth switching transistor T6. In the FIG. 13*a* example, the number of transistors is exactly seven and the number of capacitors is exactly two.

An exemplary timing diagram of programming a current sink with an alternating current (AC) voltage is shown in FIG. 13*b*. The timing includes initiating a calibration operation by activating (active high for n-type circuits, active low for p-type circuits) a first clocked signal $V_{G1}$ to cause a first capacitor $C_1$ to charge. Next, the first clocked signal is deactivated and a second clocked signal $V_{G2}$ is activated to cause the first capacitor $C_1$ to start discharging. Next, the second clocked signal $V_{G2}$ is deactivated and a third clocked signal $V_{G3}$ is activated to cause a second capacitor $C_2$ to charge. Next, the third clocked signal $V_{G3}$ is deactivated and a fourth clocked signal $V_{G4}$ is activated to cause the second capacitor $C_2$ to start discharging. The fourth clocked signal $V_{G4}$ is deactivated to terminate the calibration operation and an access control line (panel_program) is activated in a programming operation to cause a bias current Ibias derived from current stored in the first capacitor $C_2$ to be applied to a column of pixels in an active matrix area 102 of a light-emitting display 100 during the programming operation. In the case of using a controllable bias voltage for the second plate of C1 and C2 ($V_{IN1}$ and $V_{IN2}$, respectively), each capacitor will have the same voltage level during the first four operating cycles and then change to a different level during the pixel programming level. This enables more effective control of the current levels produce by the current source/sink circuit 1300.

Interchangeability of NFET and PFET-Based Circuits

This section outlines differences between a PFET-based and NFET-based pixel circuit design and how to convert an n-type circuit to a p-type and vice versa. Because the polarity of the current to the light emitting diode in each pixel has to be the same for both NFET and PFET-type circuits, the current through the light emitting diode flows from a supply voltage, e.g., EL_VDD, to a ground potential, e.g., EL_VSS, in both cases during pixel emission.

Figure 14A:
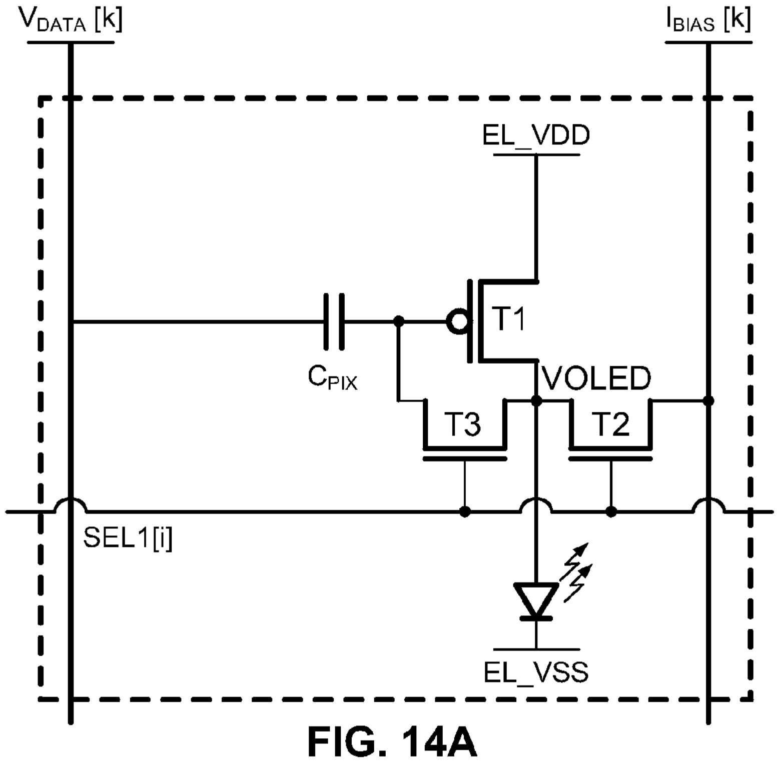
FIG. 14*a* illustrates a schematic diagram of a pixel circuit using a p-type drive transistor and n-type switch transistors.
Figure 14B:
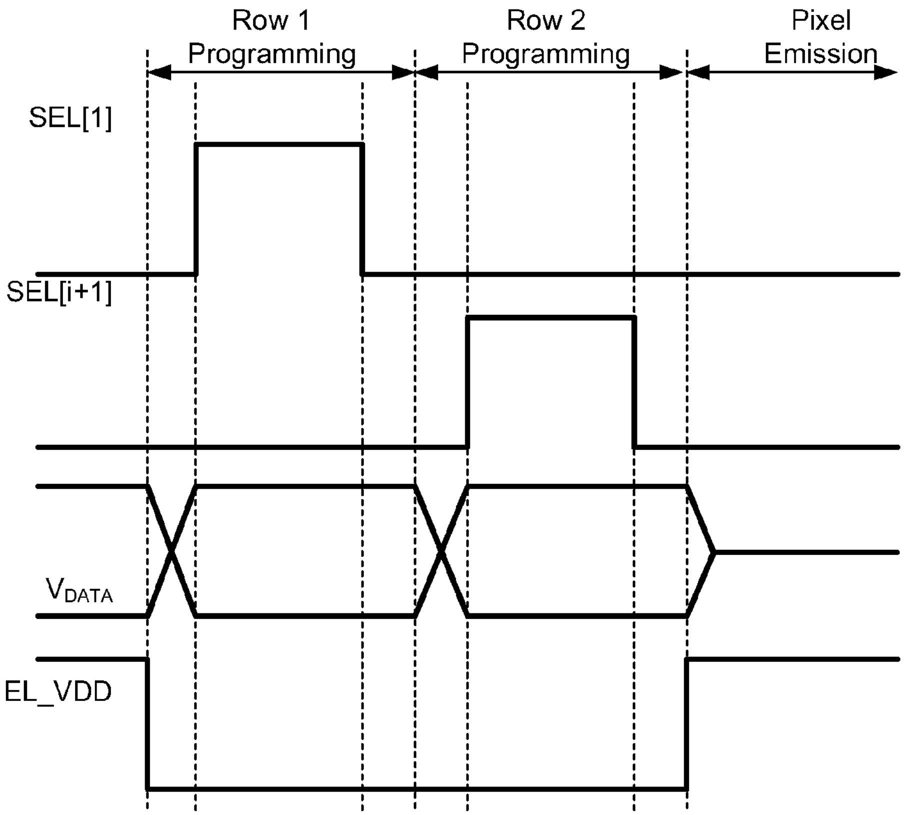
FIG. 14*b* is a timing diagram for the pixel circuit shown in FIG. 14*a;*

Take the pixel circuit 1400 in FIG. 14*a* as an example of how to convert between n-type and p-type TFTs. Here the drive transistor T1 is p-type, and the switch transistors T2 and T3 are n-type. The clock signals for each pixel 104, namely SEL_1 (for row 1) and SEL_2 (for row 2), and so forth, are inverted as shown in the timing diagram in FIG. 14*b*. In a PFET-based pixel circuit, the SEL_x signals are active low because P-type devices are used. Here in the circuit 1400, the SEL signals are active high because N-type devices are used. The timing of the other signals and their relative time-spacing are identical between the two versions. It is, however, worthy of noting that the drive transistor T1 in the p-type configuration has its gate-source voltage between the gate of T1 and EL_VDD. Thus, in the p-type configuration, the voltage across the OLED plays minimal effect on the current through T1 as long as the TFT T1 is operating in its saturation region. In the n-type counterpart, however, the gate-source voltage is between the gate of T1 and the $V_{OLED}$ node (corresponding to the common source/drain node between T2 and T3). The OLED current during emission phase will affect the stability of the pixel 104 performance. This can be alleviated by TFT sizing and appropriately biasing the pixel circuit 104 to maintain a good OLED current immunity over device (T1) variation. Nevertheless, this contributes one of the major design and operating differences between the N- and P-type configurations of the same pixel design.

Figure 15A:
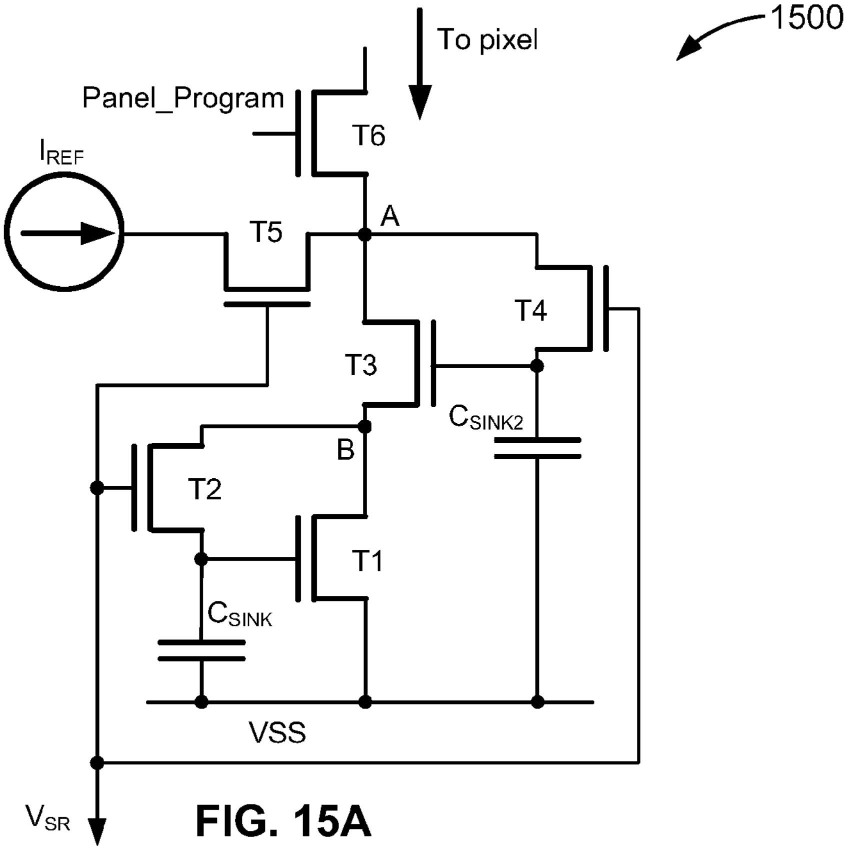
FIG. 15*a* illustrates a schematic diagram of a current sink circuit implemented using n-type FETs.
Figure 16A:
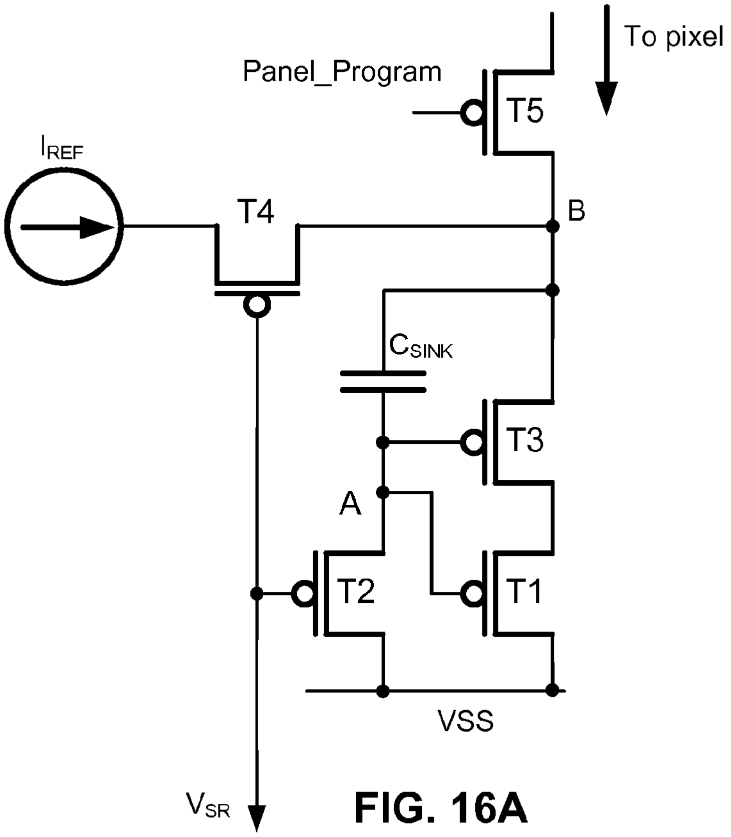
FIG. 16*a* illustrates a schematic diagram of a current sink implemented using p-type EFTs.

The same pointers apply to the current sink/source circuits disclosed herein. This section outlines two current sink designs described above and describes the importance of the polarity of the transistor (N- or PFET). The schematic diagrams shown in FIGS. 15*a* and 16*a* illustrate a current sink/source circuit 1500, 1600 implemented using n-type and p-type FETs, respectively. A key requirement for a current sink is to supply a constant current sinking path from the output terminal. Due to the subtle differences between NFETs and PFETs, P-type TFTs are inherently more difficult for implementing a current sink. In the N-type circuit 1500 (FIG. 15*a*), the current level passing through T1 is largely determined by the gate-source voltage in the saturation region, which is set by VSS and the voltage across the capacitor $C_{SINK}$. The capacitor is then easily programmed by external means. Here, the source is always the lower potential node of the TFT current path. On the contrary, PFET's source node (see FIG. 16*a*) is the higher potential node of the TFT current path. Hence, VSS is not the source node for T1 if it was a PFET. As a result, the same circuit for NFET cannot be reused without modification for the PFET counterpart. Therefore, a different circuit has to be implemented as shown in FIG. 16*a*. The PFET implementation has the capacitor, $C_{SINK}$, connected between the gate and source of the PFET T3. The actual operation of the current sink is described earlier and shall not be repeated here.

The circuit 1500 is configured as follows. A reference current Iref is applied to the drain of T5. A panel_program control line is connected to the gate of T6. A $V_{SR}$ control line is connected to the gate of T5 and to the gate of T4. The gate of T1 is connected to the source of T2 and to one plate of a first capacitor $C_{SINK1}$. The other plate of the first capacitor is connected to a ground potential VSS, which is also connected to the source of T1. The drain of T2 is connected to the source of T3 and to the drain of T1 at node B. The drain of T3 is connected to node A, which is also connected to the source of T5, the source of T6, and the drain of T4. The source of T4 is connected to the gate of T3 and to one plate of a second capacitor $C_{SINK2}$, the other plate being connected to VSS. The drain of T5 applies an output current in the form of Ibias, which is supplied to one of the column of pixels in the pixel array 102. The activation and deactivation of the panel_program and $V_{SR}$ control lines can be controlled by the current source control 122 or the controller 112.

The circuit 1600 shows five P-type TFTs for providing a bias current Ibias to each column of pixels. A reference current Iref is applied to a source of T4. A panel_program control line is applied to the gate of T5 to turn it ON or OFF during calibration of the circuit 1600. A $V_{SR}$ control line is connected to the gate of T4 and to the gate of T2. The source of T2 is connected at node A to the gate of T1, the gate of T3, and to one plate of a capacitor $C_{SINK}$. The other plate of the capacitor is connected to node B, which is connected to the source of T3, the drain of T4, and the drain of T5. The drain of T3 is connected to the source of T1. The source of T5 provides an output current in the form of a bias current Ibias to one of the columns of pixels in the pixel array 102.

Figure 15B:
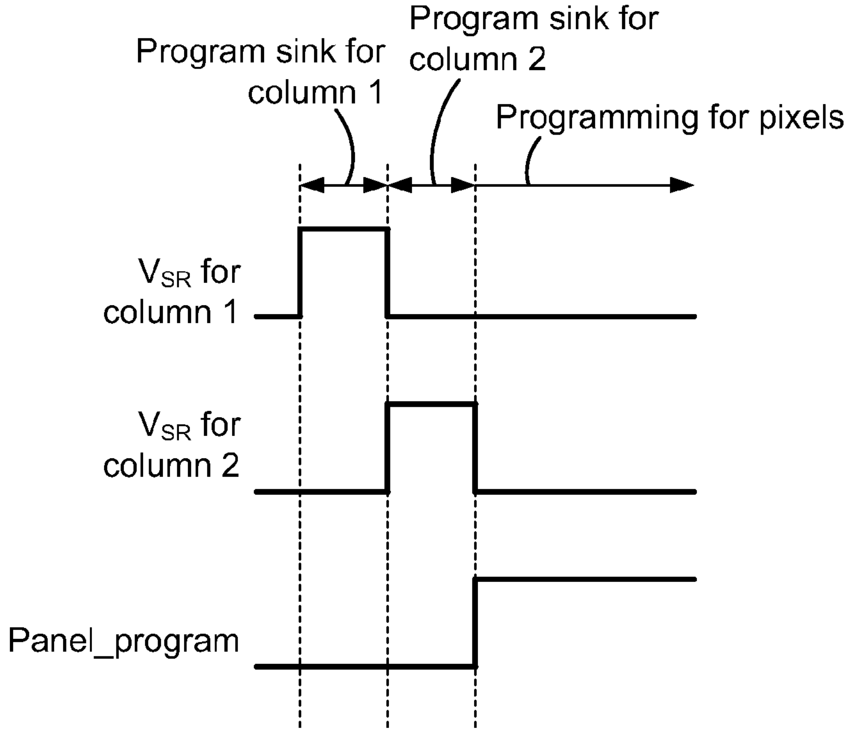
FIG. 15*b* illustrates a timing diagram for the circuit shown in FIG. 15*a;*
Figure 16B:
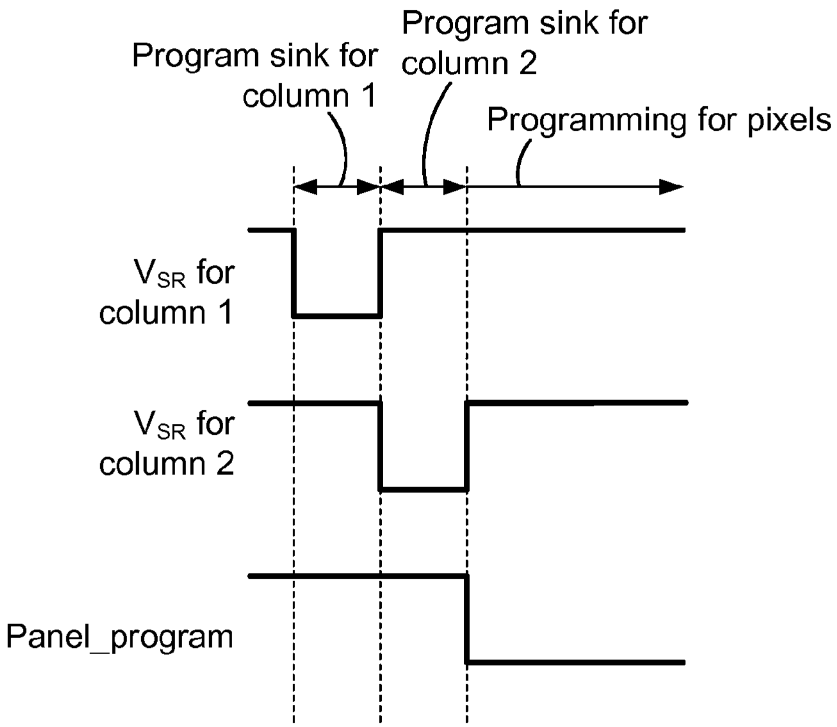
FIG. 16*b* illustrates a timing diagram of the circuit shown in FIG. 16*a;*

The timing diagrams of FIGS. 15*b* and 16*b* illustrate how the activation of the clocked control lines are inverted depending on whether the current source/sink circuit is n-type or p-type. The two current sink configurations accommodated the transistor polarity differences, and in addition, the clock signals have to be inverted between the two configurations. The gate signals share the same timing sequence, but inverted. All voltage and current bias are unchanged. In the case of n-type, the $V_{SR}$ and panel_program control lines are active high, whereas in the case of p-type, the $V_{SR}$ and panel_program control lines are active low. Although only two columns are shown for ease of illustration in the timing diagrams for the current source/sink circuits disclosed herein, it should be understood that the $V_{SR}$ control line for every column in the pixel array 104 would be activated sequentially before the panel_program control line is activated.

Improved Display Uniformity

According to another aspect of the present disclosure, techniques for improving the spatial and/or temporal uniformity of a display, such as the display 100 shown in FIG. 1, are disclosed. These techniques provide a faster calibration of reference current sources Iref, from the bias current Ibias to each of the columns of the pixel array 102 is derived, and reduce the noise effect by improving the dynamic range. They can also improve the display uniformity and lifetime despite the instability and non-uniformity of individual TFTs in each of the pixels 104.

Two levels of calibration occur as frames are displayed on the pixel array 102. The first level is the calibration of the current sources with a reference current Iref. The second level is the calibration of the display 100 with the current sources. The term "calibration" in this context is different from programming in that calibration refers to calibrating or programming the current sources or the display during emission whereas "programming" in the context of a current-biased, voltage-programmed (CBVP) driving scheme refers to the process of storing a programming voltage $V_P$ that represents the desired luminance for each pixel 104 in the pixel array 102. The calibration of the current sources and the pixel array 102 is typically not carried out during the programming phase of each frame.

Figure 17:
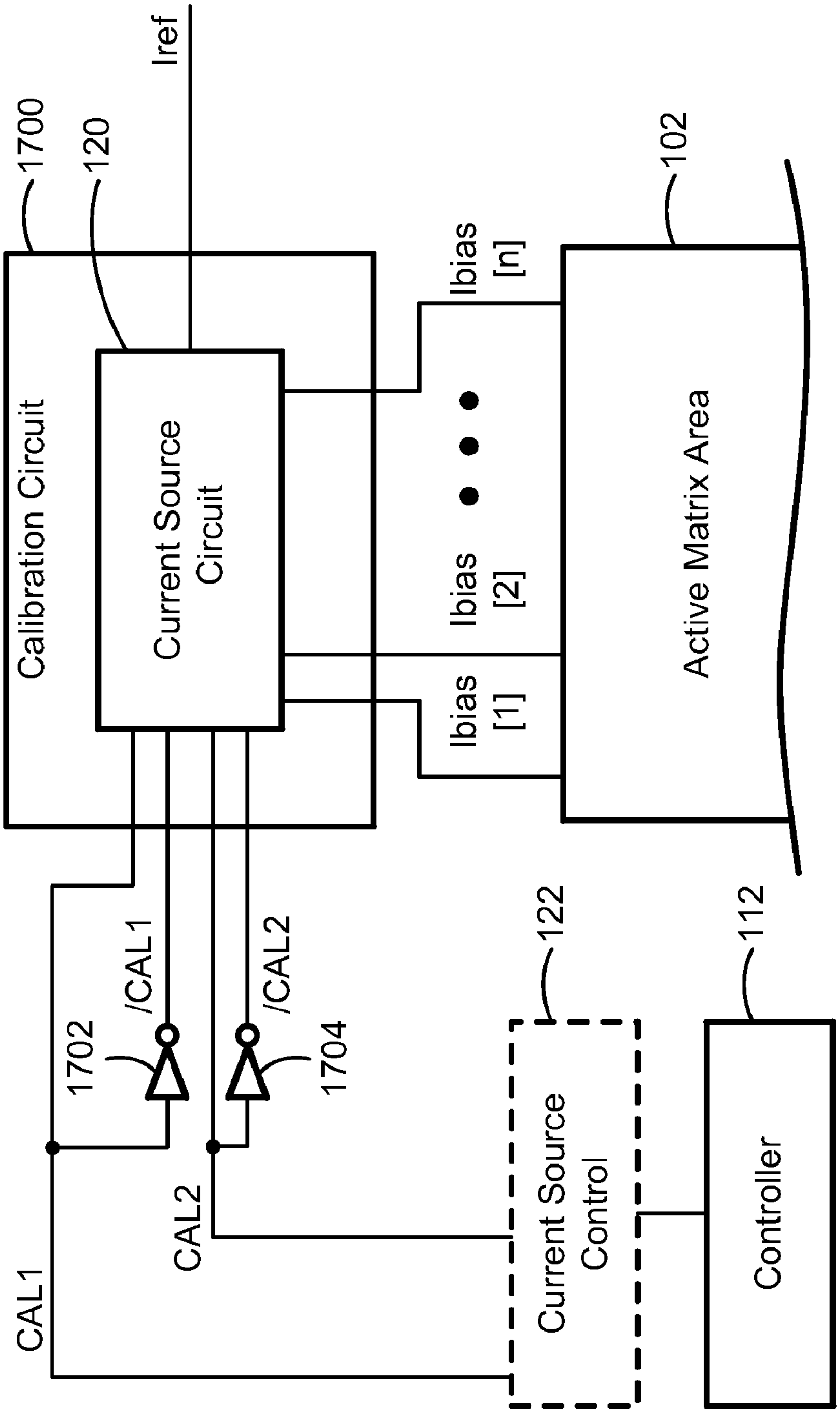
FIG. 17 illustrates an example block diagram of a calibration circuit.

FIG. 17 illustrates an example block diagram of a calibration circuit 1700 that incorporates the current source circuit 120, the optional current source control 122, and the controller 112. The calibration circuit 1700 is used for a current-biased, voltage-programmed circuit for a display panel 100 having an active matrix area 102. The current source circuit 120 receives a reference current, Iref, which can be supplied externally to the display 100 or incorporated into the display 100 in the peripheral area 106 surrounding the active area 102. Calibration control lines, labeled CAL1 and CAL2 in FIG. 17 determine which row of current source circuit is to be calibrated. The current source circuit 120 sinks or sources a bias current Ibias that is applied to each column of pixels in the active matrix area 102.

Figure 18A:
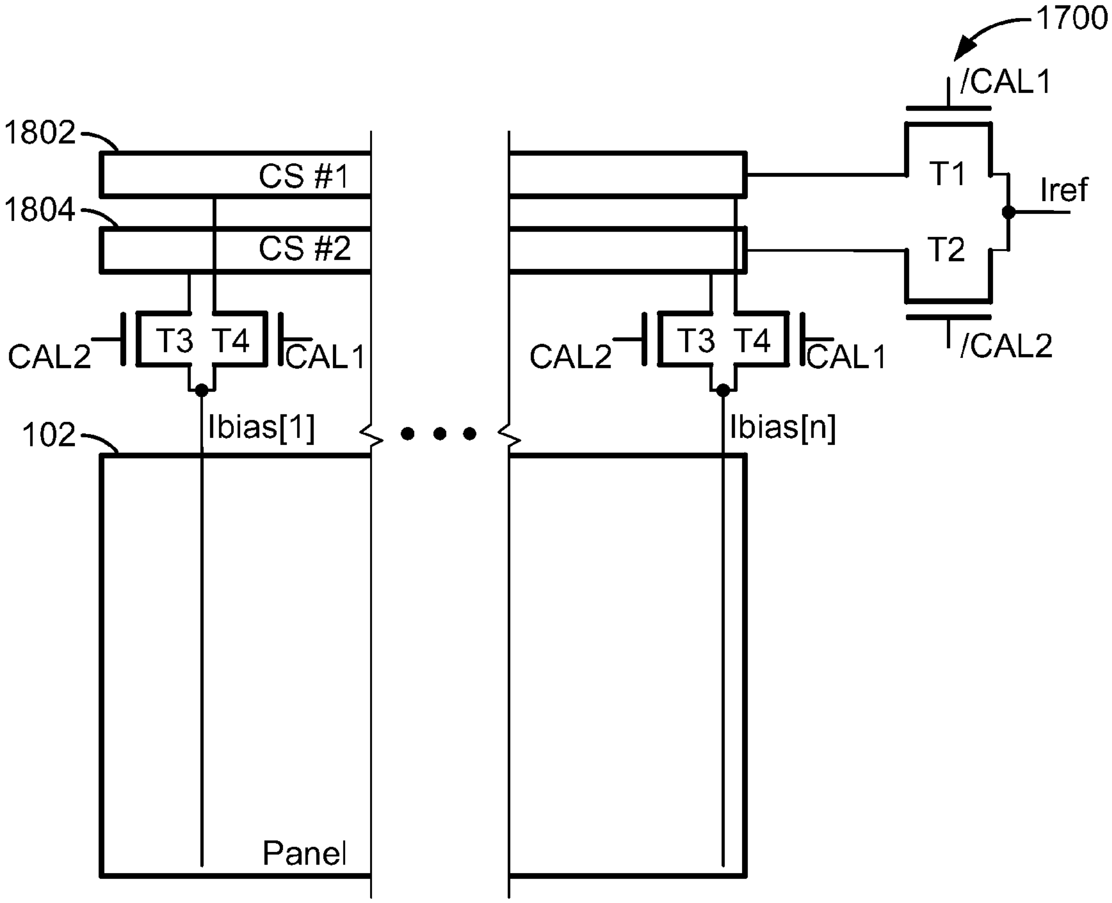
FIG. 18*a* illustrates a schematic diagram example of the calibration circuit shown in FIG. 17.

FIG. 18A illustrates a schematic diagram example of the calibration circuit 1700. The calibration circuit 1700 includes a first row of calibration current sources 1802 (labeled CS #1) and a second row of calibration current sources 1804 (labeled CS #2). The calibration circuit 1700 includes a first calibration control line (labeled CAL1) configured to cause the first row of calibration current sources 1802 (CS #1) to calibrate the display panel 102 with a bias current Ibias while the second row of calibration current sources 1804 is being calibrated by a reference current Iref. The current sources in the first and second rows of calibration current sources 1802, 1804 can include any of the current sink or source circuits disclosed herein. The term "current source" includes a current sink and vice versa and are intended to be used interchangeably herein. The calibration circuit 1700 includes a second calibration control line (labeled CAL2) configured to cause the second row of calibration current sources 1804 (CS #2) to calibrate the display panel 102 with the bias current while the first row of calibration current sources 1802 is being calibrated by the reference current Iref.

The first row and second row of calibration current sources 1802, 1804 are located in the peripheral area 106 of the display panel 100. A first reference current switch (labeled T1) is connected between the reference current source Iref and the first row of calibration current sources 1802. The gate of the first reference current switch T1 is coupled to the first calibration control line CALL Referring to FIG. 17, the first calibration control line CAL1 is also passed through an inverter 1702 and the second calibration control line CAL2 is passed through an inverter 1704 to produce /CAL1 and /CAL2 control lines that are clocked together with the CAL1 and CAL2 control lines except with opposite polarities. Thus, when CAL1 is high, /CAL1 is low, and when CAL2 is low, /CAL2 is high. This allows the current sources to be calibrated while the display panel is being calibrated by the different rows of calibration current sources 1802, 1804. Still referring to FIG. 18A, a second reference current switch T2 is connected between the reference current source Iref and the second row of calibration current sources 1804. The gate of the second reference current switch T2 is coupled to the second calibration control line CAL2. A first bias current switch T4 is connected to the first calibration control line and a second bias current switch T3 is connected to the second calibration control line. The switches T1-T4 can be n- or p-type TFT transistors.

The first row of calibration current sources 1802 includes current sources (such as any of the current sink or source circuits disclosed herein), one for each column of pixels in the active area 102. Each of the current sources (or sinks) is configured to supply a bias current Ibias to a bias current line 132 for the corresponding column of pixels. The second row of calibration current sources 1804 also includes current sources (such as any of the current sink or source circuits disclosed herein), one for each column of pixels in the active area 102. Each of the current sources is configured to supply a bias current Ibias to a bias current line 132 for the corresponding column of pixels. Each of the current sources of the first and second rows of calibration current sources is configured to supply the same bias current to each of the columns 132 of the pixels in the active area of the display panel 100.

The first calibration control line CAL1 is configured to cause the first row of calibration current sources 1802 to calibrate the display panel 100 with the bias current Ibias during a first frame of an image displayed on the display panel. The second calibration control line CAL2 is configured to cause the second row of calibration current sources 1804 to calibrate each column of the display panel 100 with the bias current Ibias during a second frame displayed on the display panel 100, the second frame following the first frame.

The reference current Iref is fixed and in some configurations can be supplied to the display panel 100 from a conventional current source (not shown) external to the display panel 100. Referring to the timing diagram of FIG. 18B, the first calibration control line CAL1 is active (high) during a first frame while the second calibration control line CAL2 is inactive (low) during the first frame. The first calibration control line CAL1 is inactive (low) during a second frame that follows the first frame while the second calibration control line CAL2 is active (high) during the second frame.

Figure 18B:
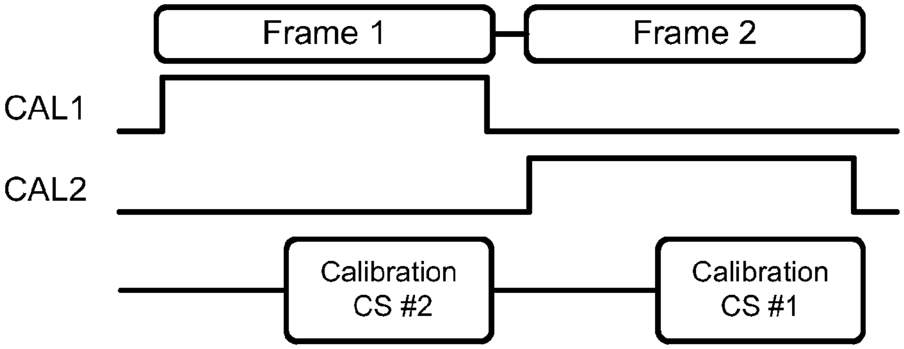
FIG. 18*b* illustrates a timing diagram for the calibration circuit shown in FIG. 18*a*.

The timing diagram of FIG. 18*b* implements a method of calibrating a current-biased, voltage-programmed circuit for a light-emitting display panel 100 having an active area 102. A first calibration control line CAL1 is activated to cause a first row of calibration current source or sink circuits (CS #1) to calibrate the display panel 100 with a bias current Ibias provided by the calibration current source or sink circuits of the first row (CS #1) while calibrating a second row of calibration current source or sink circuits (CS #2) by a reference current Iref. The calibration source or sink circuits can be any such circuits disclosed herein.

A second calibration control line CAL2 is activated to cause the second row (CS #2) to calibrate the display panel 100 with the bias current Ibias provided by the calibration current or sink circuits of the second row (CS #2) while calibrating the first row (CS #1) by the reference current Iref. The first calibration control line CAL1 is activated during a first frame to be displayed on the display panel 100, and the second calibration control line CAL2 is activated during a second frame to be displayed on the display panel 100. The second frame follows the first frame. After activating the first calibration control line CAL1, the first calibration control line CAL1 is deactivated prior to activating the second calibration control line CAL2. After calibrating the display panel 100 with the bias current Ibias provided by the circuits of the second row (CS #2), the second calibration control line CAL2 is deactivated to complete the calibration cycle for a second frame.

The timing of the activation and deactivation of the first calibration control line and the second calibration control line is controlled by a controller 112, 122 of the display panel 100. The controller 112, 122 is disposed on a peripheral area 106 of the display panel 100 proximate the active area 102 on which a plurality of pixels 104 of the light-emitting display panel 100 are disposed. The controller can be a current source or sink control circuit 122. The light-emitting display panel 100 can have a resolution of 1920×1080 pixels or less. The light-emitting display 100 can have a refresh rate of no greater than 120 Hz.

Pixel Circuit with Dampened Input Signal and Low Programming Noise

Figure 19:
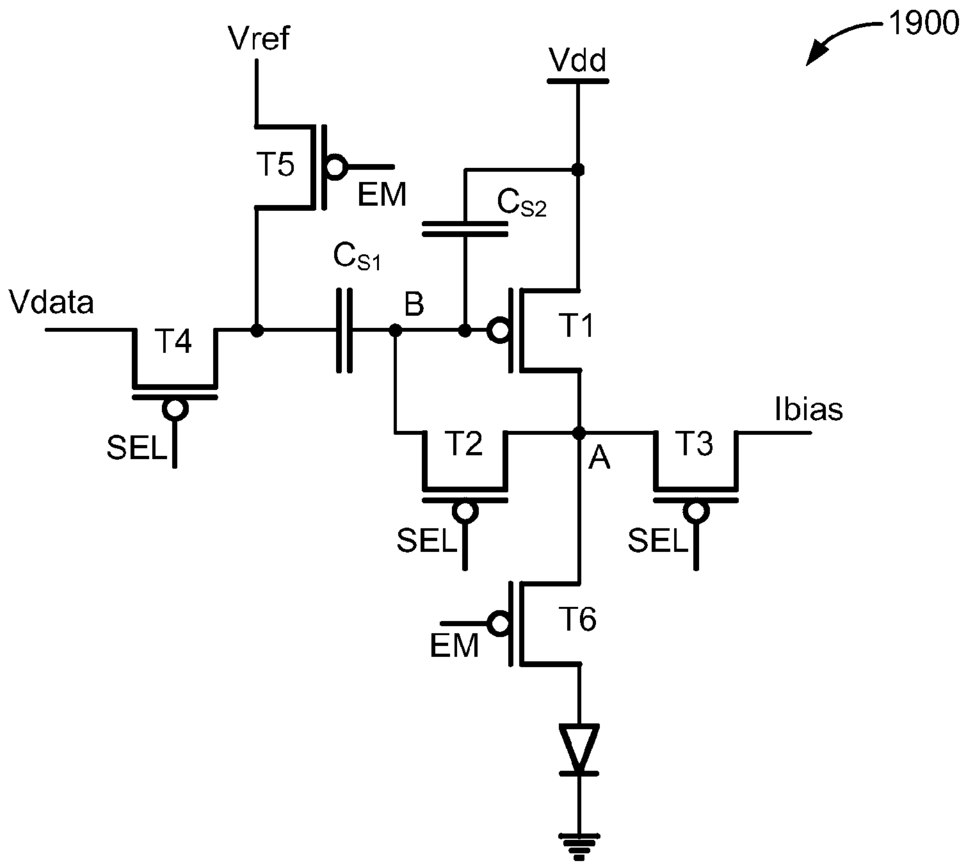
FIG. 19 illustrates a 6-TFT pixel circuit that dampens the input signal and the programming noise with the same rate.

Improving display efficiency involves reducing the current required to drive the current-driven pixels of the display. Backplane technologies with high TFT mobility will have limited input dynamic range. As a result, noise and cross talk will cause significant error in the pixel data. FIG. 19 illustrates a pixel circuit 1900 that dampens the input signal and the programming noise with the same rate. Significantly, the storage capacitor that holds the programming voltage is divided into two smaller capacitors, $C_{S1}$ and $C_{S2}$. Because $C_{S2}$ is below the VDD line, it will help improve the aperture ratio of the pixel 1900. The final voltage at node A, $V_A$, is described by the following equation:

$$V_A = V_B + (V_P - V_{ref} - V_n)\cdot\left(\frac{C_{S1}}{C_{S2}}\right)$$

Where, $V_B$ is the calibration voltage created by the bias current Ibias, $V_P$ is the programming voltage for the pixel, and $V_n$ is the programming noise and cross talk.

The pixel 1900 shown in FIG. 19 includes six p-type TFT transistors, each labeled T1 through T6, which is similar to the pixels 104*a,b* shown in FIG. 4*a*. There are two control lines, labeled SEL and EM. The SEL line is a select line for selecting the row of pixels to be programmed, and the emission control line EM is analogous to the $G_{EM}$ control line shown in FIG. 4*a*, which is used to turn on the TFT T6 to allow the light emitting device 1902*a* to enter a light emission state. The select control line, SEL, for this pixel is connected to the respective base terminals of T2, T3, and T4. These transistors will turn ON when the SEL line is active. An emission control line, EM, is connected to the base of T5 and T6, which when activated turn these transistors ON.

A reference voltage, Vref, is applied to the source of T5. The programming voltage for the pixel 1900 is supplied to the source of T4 via Vdata. The source of T1 is connected to a supply voltage Vdd. A bias current, Ibias, is applied to the drain of T3.

The drain of T1 is connected to node A, which is also connected to the drain of T2 and the source of T3 and the source of T6. The gate of T1 is connected to the first and second capacitors $C_{S1}$ and $C_{S2}$ and to the source of T2. The gates of T2, T3, and T4 are connected to the select line SEL. The source of T4 is connected to the voltage data line Vdata. The drain of T4 is connected to the first storage capacitor and the drain of T5. The source of T5 is connected to the reference voltage Vref. The gates of T6 and T5 are connected to the emission control line EM for controlling when the light emitting device turns on. The drain of T6 is connected to the anode of a light emitting device, whose cathode is connected to a ground potential. The drain of T3 receives a bias current Ibias.

Figure 20:
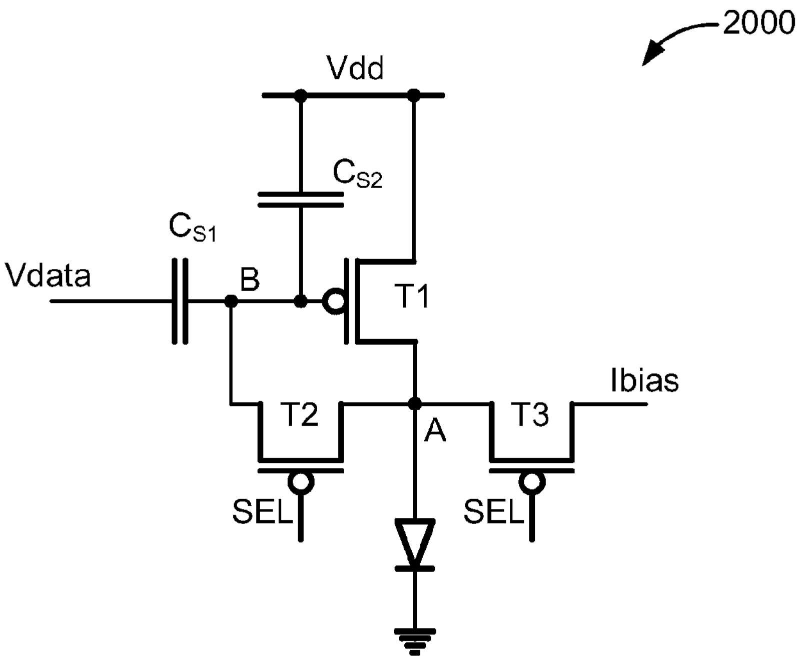
FIG. 20 illustrates a 3-TFT pixel circuit that uses a single select line and no emission control line.

FIG. 20 is another pixel circuit 2000 having three p-type TFT transistors, labeled T1 through T3, and having a single select line SEL but lacking the emission control line EM shown in the pixel circuit 1900 of FIG. 19. The select line SEL is connected to the gates of T2 and T3. The voltage data line carrying the programming voltage for this pixel circuit 2000 is connected directly to one plate of a first storage capacitor $C_{S1}$. The other plate of the first storage capacitor CS1 is connected to node B, which is also connected to the source of T2, the gate of a drive transistor T1 and one plate of a second storage capacitor $C_{S2}$. The other plate of the second storage capacitor is connected to a supply voltage Vdd, which is also connected to the source of T1. The drain of T1 is connected to node A, which is also connected to the drain of T2 and the source of T3 and to the cathode of a light emitting device, such as an OLED. The anode of the LED is connected to a ground potential. The drain of T3 receives a bias current Ibias when T3 is activated.

Any of the circuits disclosed herein can be fabricated according to many different fabrication technologies, including for example, poly-silicon, amorphous silicon, organic semiconductor, metal oxide, and conventional CMOS. Any of the circuits disclosed herein can be modified by their complementary circuit architecture counterpart (e.g., n-type circuits can be converted to p-type circuits and vice versa).

While particular embodiments and applications of the present disclosure have been illustrated and described, it is to be understood that the present disclosure is not limited to the precise construction and compositions disclosed herein and that various modifications, changes, and variations can be apparent from the foregoing descriptions without departing from the scope of the invention as defined in the appended claims.

What is claimed is:

1. A high output impedance current source or sink circuit for a light-emitting display, the circuit comprising:

an input that receives a fixed reference current and provides the reference current to a node in the current source or sink circuit during a calibration operation of the current source or sink circuit;

a first transistor and a second transistor series-connected to the node such that the reference current adjusts the voltage at the node to allow the reference current to pass through the series-connected transistors during the calibration operation;

one or more storage devices connected to the node; and an output transistor connected to the node to source or sink an output current from current stored in the one or more storage devices to drive an active matrix display with a bias current corresponding to the output current.

2. The circuit of claim 1, further comprising an output control line connected to a gate of the output transistor for controlling whether the output current is available to drive the active matrix display.

3. The circuit of claim 1, wherein the one or more storage devices includes a first storage device connected between the node and the first transistor and a second storage device connected between the node and the second transistor.

4. The circuit of claim 1, wherein the one or more storage devices includes a first storage device connected between the node and the first transistor and a second storage device connected between the first transistor and a gate of the second transistor.

5. The circuit of claim 1, further comprising:

a first voltage switching transistor controlled by a calibration access control line and connected to the first transistor;

a second voltage switching transistor controlled by the calibration access control line and connected to the second transistor; and an input transistor controlled by the calibration access control line and connected between the node and the input.

6. The circuit of claim 5, wherein the calibration access control line is activated to initiate the calibration operation of the circuit followed by activating an access control line to initiate the programming of a column of pixels of the active matrix display using the bias current.

7. The circuit of claim 1, wherein the one or more storage devices includes a first capacitor and a second capacitor, the circuit further comprising:

an input transistor connected between the input and the node;

a first voltage switching transistor connected to the first transistor, the second transistor, and the second capacitor;

a second voltage switching transistor connected to the node, the first transistor, and the first transistor; and a gate control signal line connected to the gates of the input transistor, the first voltage switching transistor, and the second voltage switching transistor.

8. The circuit of claim 1, further comprising a reference current source external to the active matrix display and supplying the reference current.

9. The circuit of claim 1, further comprising:

an input transistor connected between the input and the node;

a gate control signal line connected to the gate of the input transistor; and a voltage switching transistor having a gate connected to the gate control signal line and connected to the second transistor and the one or more storage devices.

10. The circuit of claim 1, wherein the first transistor, the second transistor, and the output transistor are p-type field effect transistors having respective gates, sources, and drains, wherein the one or more storage devices includes a first capacitor and a second capacitor, wherein the drain of the first transistor is connected to the source of the second transistor, and the gate of the first transistor is connected to the first capacitor, and wherein the drain of the output transistor is connected to the node, and the source of the output transistor sinks the output current.

11. The circuit of claim 10, further comprising:

a first voltage switching transistor having a gate connected to a calibration control line, a drain connected to a first voltage supply, and a source connected to the first capacitor;

a second voltage switching transistor having a gate connected to the calibration control line, a drain connected to a second voltage supply, and a source connected to the second capacitor; and an input transistor having a gate connected to the calibration control line, a drain connected to the node, and a source connected to the input, wherein the gate of the output transistor is connected to an access control line, and the first voltage switching transistor, the second voltage switching transistor, and the input transistor being p-type field effect transistors.

12. The circuit of claim 11, wherein the second capacitor is connected between the gate of the second transistor and the node.

13. The circuit of claim 1, further comprising a second capacitor connected between the gate of the second transistor and the source of the second transistor.

14. The circuit of claim 1, wherein the first transistor, the second transistor, and the output transistor are n-type field effect transistors having respective gates, sources, and drains, wherein the one or more storage devices includes a first capacitor, wherein the source of the first transistor is connected to the drain of the second transistor, and the gate of the first transistor is connected to the first capacitor, the first capacitor being connected to the node through the first transistor, and wherein the source of the output transistor is connected to the node, and the drain of the output transistor sinks the output current.

15. The circuit of claim 14, further comprising:

a first voltage switching transistor having a gate connected to a gate control signal line, a drain connected to the node, and a source connected to the first capacitor and to the first transistor;

a second voltage switching transistor having a gate connected to the gate control signal line, a drain connected to the source of the first transistor, and a source connected to the gate of the second transistor; and an input transistor having a gate connected to the gate control signal line, a source connected to the node, and a drain connected to the input, wherein the gate of the output transistor is connected to an access control line, and the first voltage switching transistor, the second voltage switching transistor, and the input transistor are n-type field effect transistors.

16. The circuit of claim 1, wherein the first transistor, the second transistor, and the output transistor are p-type field effect transistors having respective gates, sources, and drains, wherein the one or more storage devices includes a first capacitor, wherein the drain of the first transistor is connected to the source of the second transistor, and the gate of the first transistor is connected to the first capacitor, and wherein the drain of the output transistor is connected to the node, and the source of the output transistor sinks the output current.

17. The circuit of claim 16, further comprising:

an input transistor connected between the node and the input, wherein a drain of the input transistor is connected to a reference current source and a source of the input transistor is connected to the node, a gate of the input transistor being connected to a gate control signal line;

a voltage switching transistor having a gate connected to the gate control signal line, a source connected to the gate of the second transistor, and a drain connected to a ground potential;

wherein the gate of the output transistor is connected to an access control line, and wherein the first capacitor is connected between the gate of the first transistor and the source of the first transistor.

18. A method of sourcing or sinking current to provide a bias current for programming pixels of a light-emitting display, comprising:

initiating a calibration operation of a current source or sink circuit by activating a calibration control line to cause a reference current to be supplied to the current source or sink circuit;

during the calibration operation, storing the current supplied by the reference current in one or more storage devices in the current source or sink circuit;

deactivating the calibration control line while activating an access control line to cause sinking or sourcing of an output current corresponding to the current stored in the one or more storage devices; and applying the output current to a column of pixels in an active matrix area of the light-emitting display.

19. The method of claim 18, further comprising applying a first bias voltage and a second bias voltage to the current source or sink circuit, the first bias voltage differing from the second bias voltage to allow the reference current to be copied into the one or more storage devices.

20. A high output impedance current source or sink circuit for a light-emitting display, the circuit comprising:

an input that receives a fixed reference current and provides the reference current to a node in the current source or sink circuit during a calibration operation of the current source or sink circuit;

a first transistor and a second transistor series-connected to the node such that the reference current adjusts the voltage at the node to allow the reference current to pass through the series-connected transistors during the calibration operation;

one or more storage devices connected to a common reference potential and to one or the other or both of the first and the second transistors; and an output transistor connected to the node to source or sink an output current from current stored in the one or more storage devices to drive an active matrix display with a bias current corresponding to the output current.

* * * * *